(12) United States Patent
Hatakeyama et al.

(10) Patent No.: US 10,023,752 B2
(45) Date of Patent: Jul. 17, 2018

(54) CONDUCTIVE MATERIAL AND SUBSTRATE

(71) Applicant: SHIN-ETSU CHEMICAL CO., LTD., Tokyo (JP)

(72) Inventors: Jun Hatakeyama, Jyoetsu (JP); Takayuki Nagasawa, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 44 days.

(21) Appl. No.: 15/332,580

(22) Filed: Oct. 24, 2016

(65) Prior Publication Data
US 2017/0130070 A1 May 11, 2017

(30) Foreign Application Priority Data

Nov. 9, 2015 (JP) .................................. 2015-219879
Sep. 7, 2016 (JP) .................................. 2016-174637

(51) Int. Cl.
| | |
|---|---|
| *H01B 1/12* | (2006.01) |
| *C09D 5/24* | (2006.01) |
| *C09D 133/16* | (2006.01) |
| *C09D 125/14* | (2006.01) |
| *C09D 125/18* | (2006.01) |
| *C08F 12/20* | (2006.01) |
| *C08F 12/22* | (2006.01) |
| *C08F 12/30* | (2006.01) |
| *C08F 212/14* | (2006.01) |
| *C08F 220/24* | (2006.01) |
| *H01L 51/52* | (2006.01) |

(52) U.S. Cl.
CPC ............... *C09D 5/24* (2013.01); *C08F 12/20* (2013.01); *C08F 12/22* (2013.01); *C08F 12/30* (2013.01); *C08F 212/14* (2013.01); *C08F 220/24* (2013.01); *C09D 125/14* (2013.01); *C09D 125/18* (2013.01); *C09D 133/16* (2013.01); *H01B 1/12* (2013.01); *H01L 51/5203* (2013.01)

(58) Field of Classification Search
CPC ........ C08K 5/34; C08K 5/3445; H01B 1/122; H01B 1/127; H01B 1/128; H01B 1/125; H01B 1/12; H01G 11/48; Y02E 60/13; C08L 33/16; C08L 27/12; C08L 41/00; C08L 25/14; C08F 2220/382; C08F 220/24; C08G 2261/1424; C08G 2261/3223; C08G 2261/794; G03F 7/004; G03F 7/0045; G03F 7/0046; G03F 7/038; G03F 7/0382; G03F 7/0388; G03F 7/0397; G03F 7/2041; Y10S 430/114; Y10S 430/115; Y10S 430/143
See application file for complete search history.

(56) References Cited

U.S. PATENT DOCUMENTS

| | | | | |
|---|---|---|---|---|
| 4,488,987 A | * | 12/1984 | Hocker | C08F 8/42 252/519.33 |
| 4,585,695 A | * | 4/1986 | Ogasawara | C08G 61/124 252/500 |
| 9,666,327 B2 | * | 5/2017 | Hatakeyama | H01B 1/128 |
| 2006/0047030 A1 | | 3/2006 | Yoshida et al. | |
| 2008/0206488 A1 | * | 8/2008 | Chung | C09D 5/24 427/596 |
| 2009/0233086 A1 | | 9/2009 | Hirai | |
| 2010/0270517 A1 | * | 10/2010 | Hong | C08J 3/212 252/519.33 |

(Continued)

FOREIGN PATENT DOCUMENTS

| | | |
|---|---|---|
| JP | 2006-096975 A | 4/2006 |
| JP | 2008-146913 A | 6/2008 |

(Continued)

*Primary Examiner* — Mark T Kopec
*Assistant Examiner* — Jaison P Thomas
(74) *Attorney, Agent, or Firm* — Oliff PLC

(57) ABSTRACT

The present invention provides a conductive material including: (A) a π-conjugated polymer, (B) a dopant polymer which contains one or more repeating units selected from "a1" to "a4" respectively shown by the following general formula (1) and has a weight-average molecular weight in the range of 1,000 to 500,000, and (C) one or more salts selected from the group consisting of a monovalent copper salt of carboxylic acid, a monovalent copper salt of β-diketone, and a monovalent copper salt of β-ketoester. There can be provided a conductive material that has excellent film-formability and also can form a conductive film having high transparency and conductivity, superior flexibility and flatness when the film is formed from the material.

20 Claims, No Drawings

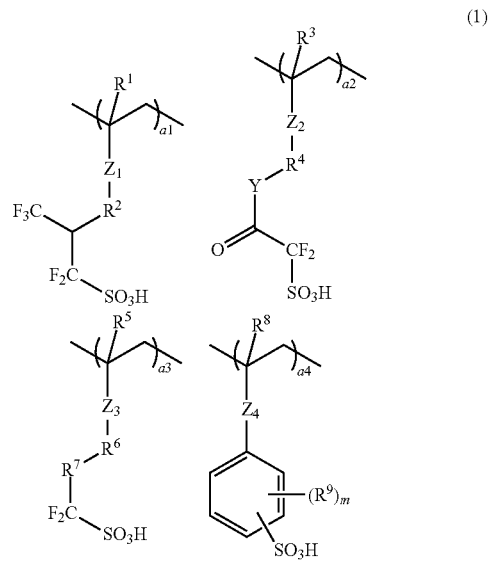

(1)

(56) References Cited

U.S. PATENT DOCUMENTS

2011/0175036 A1* 7/2011 Masahiro .............. C08J 7/047
  252/500
2012/0012795 A1 1/2012 Hsu
2017/0088719 A1* 3/2017 Alsayed .............. C09D 5/24

FOREIGN PATENT DOCUMENTS

| JP | 2009-224183 A | 10/2009 |
| JP | 5264723 B2 | 8/2013 |
| JP | 2013-228447 A | 11/2013 |

* cited by examiner

CONDUCTIVE MATERIAL AND SUBSTRATE

BACKGROUND OF THE INVENTION

Field of the Invention

The present invention relates to a conductive material and a substrate having a conductive film formed thereon from the conductive material.

Description of the Related Art

A polymer having a conjugated double bond (i.e. π-conjugated polymer) does not show a conductivity by itself; however, if an appropriate anionic molecule is doped therein, it can express a conductivity, thereby giving a conductive polymer material (i.e. conductive polymer composition). As to the π-conjugated polymer, polyacetylene, (hetero) aromatic polymers such as polythiophene, polyselenophene, polytellurophene, polypyrrole, and polyaniline; a mixture thereof, etc., are used; and as to the anionic molecule (dopant), an anion of sulfonic acid type is most commonly used. This is because a sulfonic acid, which is a strong acid, can efficiently interact with the aforementioned π-conjugated polymers.

As to the anionic dopant of sulfonic acid type, sulfonic acid polymers such as polyvinyl sulfonic acid and polystyrene sulfonic acid (PSS) are widely used (Patent Document 1). The sulfonic acid polymer includes a vinylperfluoroalkyl ether sulfonic acid typified by Nafion (registered trademark), which is used for a fuel cell.

Polystyrene sulfonic acid (PSS) has a sulfonic acid as a repeated monomer unit in the polymer main chain, so that it has a high doping effect to the π-conjugated polymer, and also can enhance water dispersibility of the π-conjugated polymer after being doped. This is because the hydrophilicity is kept due to the sulfo groups excessively present in PSS, and the dispersibility into water is therefore enhanced dramatically.

Polythiophene having PSS as a dopant exhibits high conductivity and can be handled as an aqueous dispersion, so that it is expected to be used as a coating-type conductive film material in place of ITO (indium-tin oxide). As mentioned above, however, PSS is a water-soluble resin, and is hardly soluble in an organic solvent. Accordingly, the polythiophene having PSS as a dopant has a high hydrophilicity, but a low affinity to an organic solvent and an organic substrate, and thus, it is difficult to disperse it into an organic solvent and to form a film onto an organic substrate.

Besides, when the polythiophene having PSS as a dopant is used in, for example, a conductive film for an organic EL lighting, a large quantity of water tends to remain in the conductive film and the conductive film thus formed tends to absorb moisture from an outside atmosphere since the polythiophene having PSS as a dopant has an extremely high hydrophilicity as mentioned above. As a result, the problems arise that the luminous body of the organic EL chemically changes, thereby the light emitting capability is deteriorated, and that water agglomerates over time and defects are caused, which results in shortening of the lifetime of the whole organic EL device. Furthermore, there arise other problems in the polythiophene having PSS as a dopant that particles in the aqueous dispersion becomes large, the film surface becomes rough after the film formation, and a non-light emitting region, called dark spot, is caused when used for the organic EL lighting.

In addition, since the polythiophene having PSS as a dopant has an absorption at a wavelength of about 500 nm in the blue region, in the case that this material is used as a film coating a transparent substrate such as a transparent electrode, there arises another problem that when the conductivity required for the device to function is made up by the solid concentration or the thickness of the film, transmittance of the film is affected.

Patent Document 2 discloses a conductive polymer composition composed of a conductive polymer which contains a π-conjugated polymer formed of a repeating unit selected from thiophene, selenophene, tellurophene, pyrrole, aniline, and a polycyclic aromatic compound, and a fluorinated acid polymer which can be wetted by an organic solvent and 50% or more of which is neutralized by a cation; and it is shown that an aqueous dispersion of the conductive polymer can be obtained by combining water, a precursor monomer of the π-conjugated polymer, the fluorinated acid polymer, and an oxidant, in any order.

However, in such a conventional conductive polymer, particles are agglomerated in the dispersion immediately after synthesis. Also, if an organic solvent served as a conductive enhancer is added thereto to give a coating material, the agglomeration is further facilitated, so that the filterability thereof is deteriorated. If the coating material is applied by spin coating without filtration, a flat film cannot be obtained due to the effect of the particle agglomeration; and as a result, the problem of coating defect is caused.

Moreover, development has been promoted in a flexible device. As a transparent conductive film for the current hard devices, ITO is widely used. ITO is, however, a crystalline film, and therefore there arises cracks in case of bending. Accordingly, it is a pressing need to develop a flexible transparent conductive film substituting for ITO. Polythiophene having PSS as a dopant forms a flexible film with high transparency, but involves a problem of low conductivity compared to ITO in addition to the aforementioned problem of dark spot.

Patent Document 3 discloses a transparent conductive film using silver nanowires. The transparent conductive film using silver nanowires is one of a candidate for a conductive film for a flexible device, since it has high conductivity and transparency. The film using silver nanowire, however, conducts electricity only through the wire part, and therefore causes a problem that the light emission occurs at the wire parts only, not the whole surface when it is applied to an organic EL lighting.

PRIOR ART DOCUMENTS

Patent Documents

Patent Document 1: Japanese Patent Laid-Open Publication No. 2008-146913
Patent Document 2: Japanese Patent No. 5264723
Patent Document 3: Japanese Patent Laid-Open Publication No. 2009-224183

SUMMARY OF THE INVENTION

As mentioned above, the film using the polythiophene-based conductive polymer having PSS as a dopant, such as widely applicable PEDOT-PSS, has a problem that it has poor conductivity although it has a high transparency comparable to ITO and flexibility superior to ITO. Moreover, there arises a problem of generating a dark spot when the polythiophene-based conductive polymer having PSS as a dopant is applied to an organic El lighting. On the other hand, the transparent conductive film using silver nanowires has a problem that the light emission occurs at the wire parts only, and microscopical uniform light emission does not occur when it is applied to an organic EL lighting, although it has high transparency, high conductivity, and superior flexibility.

The present invention was made in view of the above-mentioned circumstances, and an object thereof is to provide a conductive material which has excellent film-formability, and also can form a conductive film having high transparency, conductivity, and flatness, and having superior flexibility when the film is formed from the material.

To accomplish the object, the present invention provides a conductive material comprising:

(A) a π-conjugated polymer,
(B) a dopant polymer which contains one or more repeating units selected from "a1" to "a4" respectively shown by the following general formula (1) and has a weight-average molecular weight in the range of 1,000 to 500,000, and
(C) one or more salts selected from the group consisting of a monovalent copper salt of carboxylic acid, a monovalent copper salt of β-diketone, and a monovalent copper salt of β-ketoester,

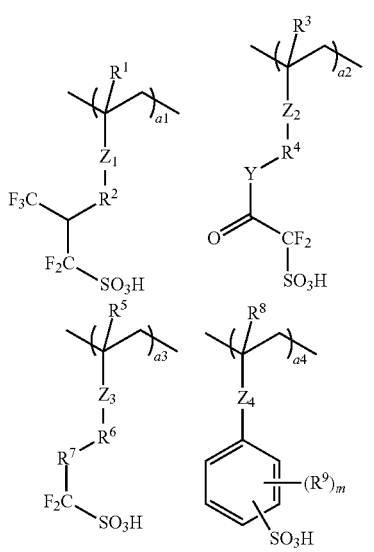

(1)

wherein $R^1$, $R^3$, $R^5$, and $R^8$ independently represent a hydrogen atom or a methyl group; $R^2$, $R^4$, and $R^6$ independently represent a single bond, an ester group, or a linear, branched, or cyclic hydrocarbon group having 1 to 12 carbon atoms and optionally containing either or both of an ether group and an ester group; $R^7$ represents a linear or branched alkylene group having 1 to 4 carbon atoms in which 1 or 2 hydrogen atoms in $R^7$ are optionally substituted with a fluorine atom; $R^9$ represents a fluorine atom or a trifluoromethyl group; $Z_1$, $Z_2$, and $Z_3$ independently represent a single bond, a phenylene group, a naphthylene group, an ether group, or an ester group; $Z_4$ represents a single bond, an ether group, or an ester group; "Y" represents an oxygen atom or an NH group; "m" is an integer of 1 to 4; and "a1", "a2", "a3", and "a4" are each a number satisfying $0 \leq a1 \leq 1.0$, $0 \leq a2 \leq 1.0$, $0 \leq a3 \leq 1.0$, $0 \leq a \leq 1.0$, and $0 < a1+a2+a3+a4 \leq 1.0$.

The conductive material as mentioned above has excellent film-formability, and also can form a conductive film having high transparency, conductivity, and flatness, and having superior flexibility when the film is formed from the material.

The component (B) preferably further contains a repeating unit "b" shown by the following general formula (2),

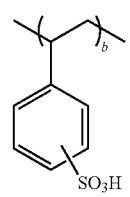

(2)

wherein "b" is a number satisfying $0 < b < 1.0$.

By containing the repeating unit "b", the conductivity of the material can be further enhanced.

The component (B) is preferably a block copolymer.

If the component (B) is a block copolymer, the conductivity of the material can be further enhanced.

The component (A) is preferably a polymer formed by polymerization of one or more precursor monomers selected from the group consisting of pyrrole, thiophene, selenophene, tellurophene, aniline, a polycyclic aromatic compound, and a derivative thereof.

Such monomers can be readily polymerized, and have excellent stability in air; and thus, the component (A) can be readily synthesized.

The component (C) is preferably one or more salts selected from those shown by the following general formulae (3-1) to (3-3),

(3-1)

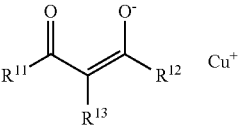

(3-2)

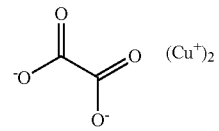

(3-3)

wherein "p" is an integer of 1 to 6; $R^{10}$ represents a hydrogen atom or a linear, branched, or cyclic hydrocarbon group having 1 to 30 carbon atoms with a valence of "p", and when $R^{10}$ is a hydrocarbon group, $R^{10}$ optionally contains a halogen atom, a nitrogen atom, a hydroxy group, an ether group, an ester group, an amino group, an amide group, a carbamate group, a carbonate group, a sulfonate ester group, a thiol group, a sulfide group, a carbonyl group, a sulfonyl group, a lactone group, a lactam group, a sultone group, or a nitro group; $R^{11}$ and $R^{12}$ independently represent a linear, branched, or cyclic alkyl group having 1 to 20 carbon atoms, an alkenyl group having 2 to 20 carbon atoms, an alkynyl group having 2 to 20 carbon atoms, or an aryl group having 6 to 20 carbon atoms, and $R^{11}$ and $R^{12}$ optionally contain a hydroxy group, an alkoxy group, an ether group, an ester group, an amino group, an amide group, a sulfonate ester group, a halogen atom, a cyano group, a nitro group, a carbonate group, a carbamate group, a thiol group, a sulfide group, a thioketone group, or a heteroaromatic ring; and $R^{13}$ represents a hydrogen atom, a linear, branched, or cyclic alkyl group having 1 to 8 carbon atoms, or a phenyl group.

Such conductive material can form a conductive film with more enhanced conductivity and flatness.

The conductive material preferably has dispersibility in water or in an organic solvent.

In addition, the present invention provides a substrate having a conductive film formed thereon, wherein the conductive film is formed from the above-mentioned conductive material.

Thus, the conductive material of the present invention can give a conductive film by applying it onto a substrate or the like to form a film thereon.

The conductive film thus formed has excellent conductivity and transparency, so that it may function as a transparent electrode layer.

As described above, the solvent of the inventive conductive material, in which one or more salts selected from the group consisting of a monovalent copper salt of carboxylic acid, a monovalent copper salt of β-diketone, a monovalent copper salt of β-ketoester is added as component (C) to a conductive polymer formed from the π-conjugated polymer of the component (A) together with the dopant polymer of the component (B) having a superacidic sulfo group, brings good filterability and film-formability by spin coating. Moreover, a conductive film formed by using the inventive conductive material has an excellent conductivity, transparency, flatness, flexibility, and durability as well as low surface roughness. Further, such a conductive material has excellent film-formability onto both an organic substrate and an inorganic substrate.

In addition, the conductive film formed from the above-mentioned conductive material has excellent conductivity, transparency, flatness, flexibility, and the like, so that this film may function as a transparent electrode layer, especially as a flexible transparent electrode.

DETAILED DESCRIPTION OF THE PREFERRED EMBODIMENTS

As mentioned above, it has been desired to develop a conductive film-forming material which can form a conductive film having high conductivity and transparency, and excellent flexibility and flatness.

The present inventors have diligently studied to accomplish the above-mentioned objects and consequently found that when a dopant polymer having a repeating unit that contains an α-fluorinated sulfo group or a dopant polymer having a repeating unit of fluorinated benzenesulfonic acid is used in place of polystyrene sulfonic acid (PSS), which has been widely used as a dopant of a conductive polymer material, the superacidic dopant polymer strongly interacts with the π-conjugated polymer, and therefore, the visible light absorption region of the π-conjugated polymer is shifted, which leads to improvement in transparency; and further, the π-conjugated polymer is strongly ionically bonded to the dopant polymer, which leads to improvement in stability to light and heat. Furthermore, they have found that the film-formability by spin coating could be improved and higher flatness of the film could be obtained at the timing of the film formation. The inventors have also found that an addition of one or more salts selected from a monovalent copper salt of carboxylic acid, a monovalent copper salt of β-diketone, a monovalent copper salt of β-ketoester to the foregoing conductive polymer makes a conductive material which has higher conductivity and higher flatness of a film compared to the case of a simple substance of the conductive polymer, and accordingly the conductive material can form a conductive film with excellent conductivity, transparency, film flatness, etc.; thereby brought the present invention to completion.

That is, the present invention is a conductive material comprising:

(A) a π-conjugated polymer, (B) a dopant polymer which contains one or more repeating units selected from "a1" to "a4" respectively shown by the following general formula (1) and has a weight-average molecular weight in the range of 1,000 to 500,000, and (C) one or more salts selected from the group consisting of a monovalent copper salt of carboxylic acid, a monovalent copper salt of β-diketone, and a monovalent copper salt of β-ketoester,

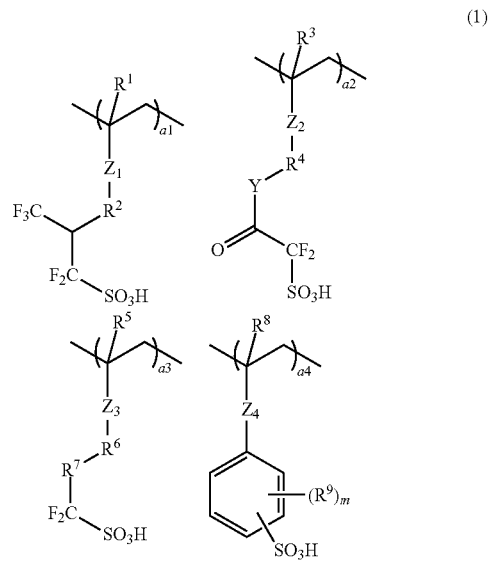

wherein $R^1$, $R^3$, $R^5$, and $R^8$ independently represent a hydrogen atom or a methyl group; $R^2$, $R^4$, and $R^6$ independently represent a single bond, an ester group, or a linear, branched, or cyclic hydrocarbon group having 1 to 12 carbon atoms and optionally containing either or both of an ether group and an ester group; $R^7$ represents a linear or branched alkylene group having 1 to 4 carbon atoms in which 1 or 2 hydrogen atoms in $R^7$ are optionally substituted with a fluorine atom; $R^9$ represents a fluorine atom or a trifluoromethyl group; $Z_1$, $Z_2$, and $Z_3$ independently represent a single bond, a phenylene group, a naphthylene group, an ether group, or an ester group; $Z_4$ represents a single bond, an ether group, or an ester group; "Y" represents an oxygen atom or an NH group; "m" is an integer of 1 to 4; and "a1", "a2", "a3", and "a4" are each a number satisfying $0 \leq a1 \leq 1.0$, $0 \leq a2 \leq 1.0$, $0 \leq a3 \leq 1.0$, $0 \leq a4 \leq 1.0$, and $0 < a1+a2+a3+a4 \leq 1.0$.

Hereinafter, the present invention will be described in detail, but the present invention is not limited thereto.

Herein, "conductive" means "electrically conductive."

[(A) π-Conjugated Polymer]

The conductive material of the present invention contains a π-conjugated polymer as component (A). The component (A) may be a polymer obtained by polymerization of a precursor monomer (i.e. organic monomer molecule) to form a π-conjugated chain which is a structure having a single bond and a double bond alternately and successively.

Illustrative examples of the precursor monomer include monocyclic aromatic compounds such as pyrroles, thiophenes, thiophene vinylenes, selenophenes, tellurophenes, phenylenes, phenylene vinylenes, and anilines; polycyclic aromatic compounds such as acenes; and acetylenes; and a homopolymer or a copolymer of these monomers can be used as the component (A).

Among these monomers, in view of easiness in polymerization and stability in air, pyrrole, thiophene, selenophene, tellurophene, aniline, a polycyclic aromatic compound, and a derivative thereof are preferable. Particularly preferable are pyrrole, thiophene, aniline, and a derivative thereof; especially thiophenes because of the highest conductivity and the highest transparency in the visible light, though not limited thereto.

If the conductive material of the present invention particularly contains polythiophene as the component (A), it is expected to be developed into the application to touch panel, organic EL display, organic EL lighting, etc., because of its high conductivity and high transparency in the visible light. On the other hand, if the conductive material of the present invention contains polyaniline as the component (A), it is difficultly applied to display and so on since its absorption in the visible light is larger and the conductivity thereof is lower compared with the case of containing polythiophene, but it can be considered to use it for a top coat to prevent electric charge of the resist upper layer film due to an electron in the EB (electron beam) lithography since it can be readily spin-coated because of low viscosity.

The component (A) may attain a sufficient conductivity even if the monomers which will constitute the π-conjugated polymer is not substituted; however, in order to further enhance the conductivity, monomers substituted with an alkyl group, a carboxy group, a sulfo group, an alkoxy group, a hydroxy group, a cyano group, a halogen atom, or the like may also be used.

Illustrative examples of the monomers of pyrroles, thiophenes, and anilines include pyrrole, N-methyl pyrrole, 3-methyl pyrrole, 3-ethyl pyrrole, 3-n-propyl pyrrole, 3-butyl pyrrole, 3-octyl pyrrole, 3-decyl pyrrole, 3-dodecyl pyrrole, 3,4-dimethyl pyrrole, 3,4-dibutyl pyrrole, 3-carboxy pyrrole, 3-methyl-4-carboxy pyrrole, 3-methyl-4-carboxyethyl pyrrole, 3-methyl-4-carboxybutyl pyrrole, 3-hydroxy pyrrole, 3-methoxy pyrrole, 3-ethoxy pyrrole, 3-butoxy pyrrole, 3-hexyloxy pyrrole, and 3-methyl-4-hexyloxy pyrrole; thiophene, 3-methyl thiophene, 3-ethyl thiophene, 3-propyl thiophene, 3-butyl thiophene, 3-hexyl thiophene, 3-heptyl thiophene, 3-octyl thiophene, 3-decyl thiophene, 3-dodecyl thiophene, 3-octadecyl thiophene, 3-bromo thiophene, 3-chloro thiophene, 3-iodo thiophene, 3-cyano thiophene, 3-phenyl thiophene, 3,4-dimethyl thiophene, 3,4-dibutyl thiophene, 3-hydroxy thiophene, 3-methoxy thiophene, 3-ethoxy thiophene, 3-butoxy thiophene, 3-hexyloxy thiophene, 3-heptyloxy thiophene, 3-octyloxy thiophene, 3-decyloxy thiophene, 3-dodecyloxy thiophene, 3-octadecyloxy thiophene, 3,4-dihydroxy thiophene, 3,4-dimethoxy thiophene, 3,4-diethoxy thiophene, 3,4-dipropoxy thiophene, 3,4-dibutoxy thiophene, 3,4-dihexyloxy thiophene, 3,4-diheptyloxy thiophene, 3,4-dioctyloxy thiophene, 3,4-didecyloxy thiophene, 3,4-didodecyloxy thiophene, 3,4-ethylenedioxy thiophene, 3,4-ethylenedithio thiophene, 3,4-propylenedioxy thiophene, 3,4-butenedioxy thiophene, 3-methyl-4-methoxy thiophene, 3-methyl-4-ethoxy thiophene, 3-carboxy thiophene, 3-methyl-4-carboxy thiophene, 3-methyl-4-carboxymethyl thiophene, 3-methyl-4-carboxyethyl thiophene, 3-methyl-4-carboxybutyl thiophene, 3,4-(2,2-dimethylpropylenedioxy) thiophene, 3,4-(2,2-diethylpropylenedioxy) thiophene, (2,3-dihydrothieno[3,4-b][1,4]dioxin-2-yl)methanol; aniline, 2-methyl aniline, 3-methyl aniline, 2-ethyl aniline, 3-ethyl aniline, 2-propyl aniline, 3-propyl aniline, 2-butyl aniline, 3-butyl aniline, 2-isobutyl aniline, 3-isobutyl aniline, 2-methoxy aniline, 2-ethoxy aniline, 2-aniline sulfonic acid, and 3-aniline sulfonic acid.

Among them, a (co)polymer consisting of one or two compounds selected from pyrrole, thiophene, N-methyl pyrrole, 3-methyl thiophene, 3-methoxy thiophene, and 3,4-ethylenedioxy thiophene is preferably used in view of resistance value and reactivity. Moreover, a homopolymer consisting of pyrrole or 3,4-ethylenedioxy thiophene has high conductivity; and therefore it is more preferable.

Meanwhile, for a practical reason, the repeat number of these repeating units (i.e. precursor monomers) in the component (A) is preferably in the range of 2 to 20, more preferably 6 to 15.

In addition, the molecular weight of the component (A) is preferably about 130 to about 5,000.

[(B) Dopant Polymer]

The conductive material of the present invention contains a dopant polymer as component (B). This dopant polymer of the component (B) contains one or more repeating units selected from "a1" to "a4" respectively represented by the following general formula (1). That is, the dopant polymer of the component (B) is a superacidic polymer which contains a fluorinated sulfonic acid,

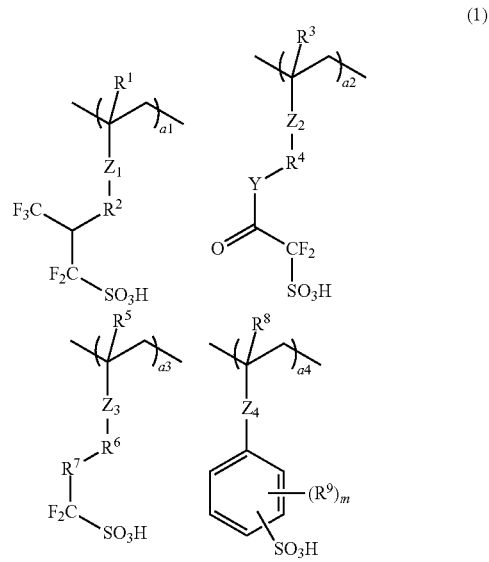

(1)

wherein $R^1$, $R^3$, $R^5$, and $R^8$ independently represent a hydrogen atom or a methyl group; $R^2$, $R^4$, and $R^6$ independently represent a single bond, an ester group, or a linear, branched, or cyclic hydrocarbon group having 1 to 12 carbon atoms and optionally containing either or both of an ether group and an ester group; $R^7$ represents a linear or branched alkylene group having 1 to 4 carbon atoms in which 1 or 2 hydrogen atoms in $R^7$ are optionally substituted with a fluorine atom; $R^9$ represents a fluorine atom or a trifluoromethyl group; $Z_1$, $Z_2$, and $Z_3$ independently represent a single bond, a phenylene group, a naphthylene group, an ether group, or an ester group; $Z_4$ represents a single bond, an ether group, or an ester group; "Y" represents an oxygen atom or an NH group; "m" is an integer of 1 to 4; and "a1", "a2", "a3", and "a4" are each a number satisfying 0≤a1≤1.0, 0≤a2≤1.0, 0≤a3≤1.0, 0≤a4≤1.0, and 0<a1+a2+a3+a4≤1.0.
Illustrative examples of the monomer to give the repeating unit "a1" include the following compounds,
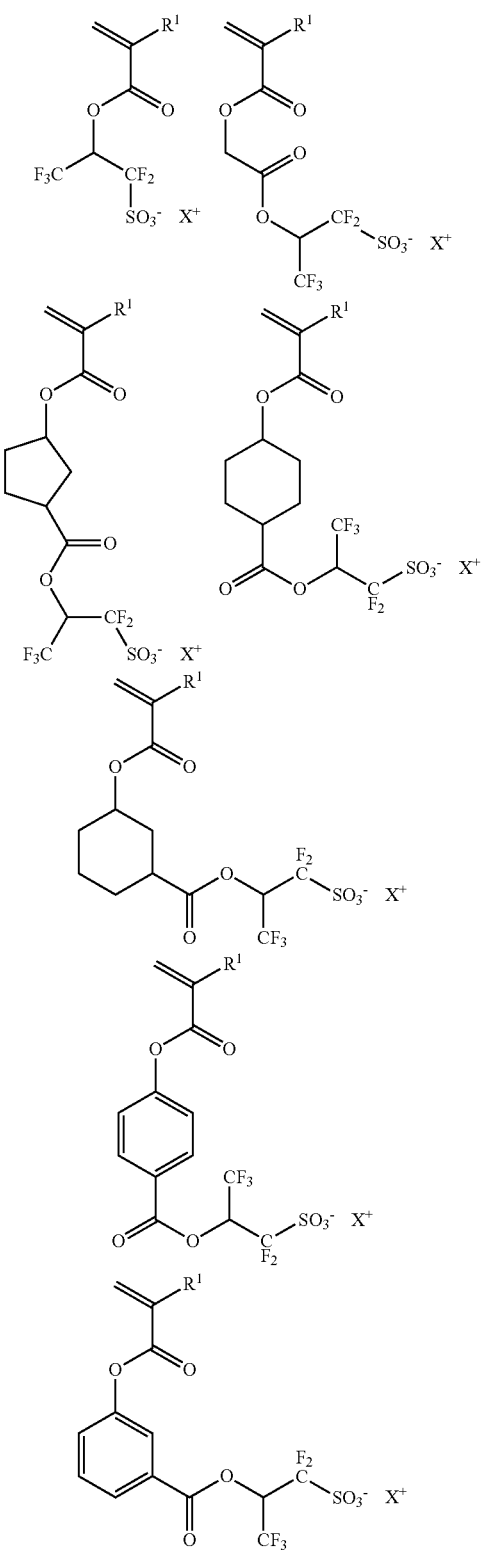
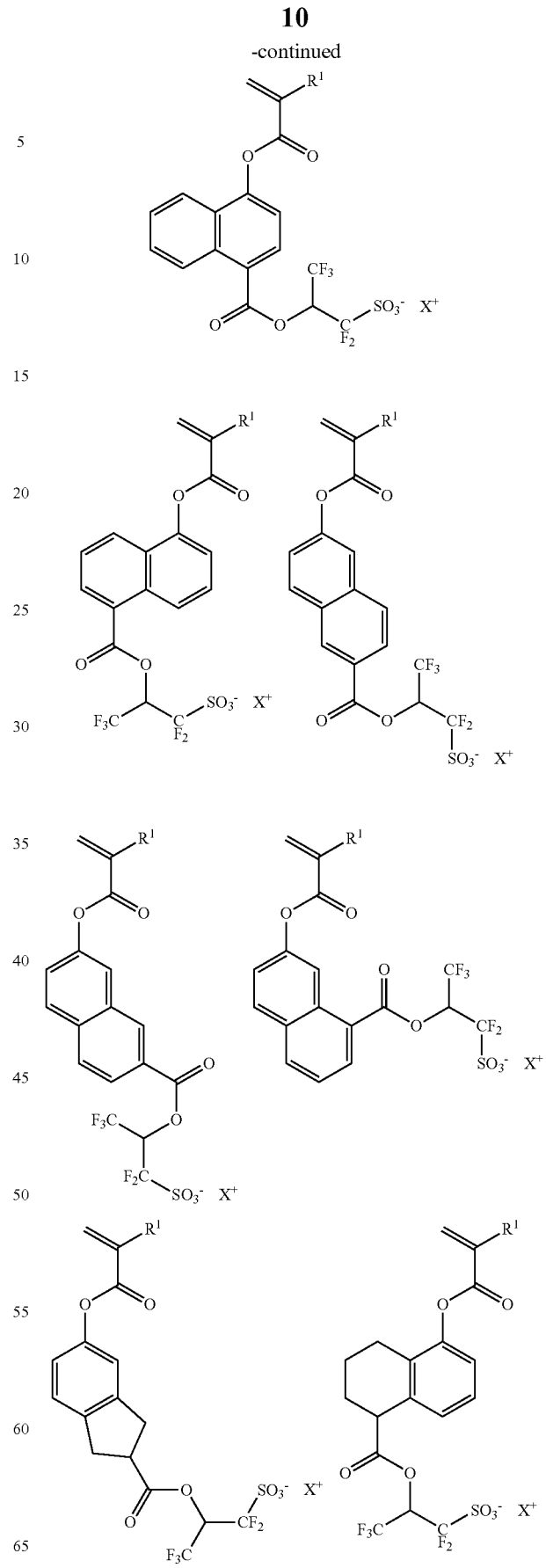

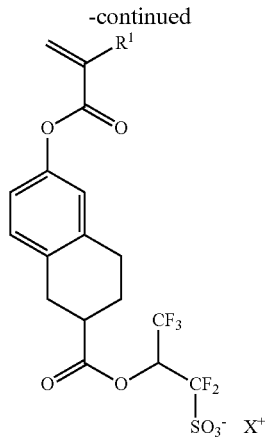
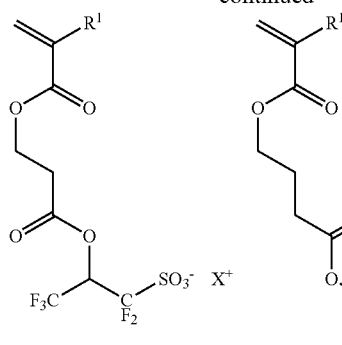
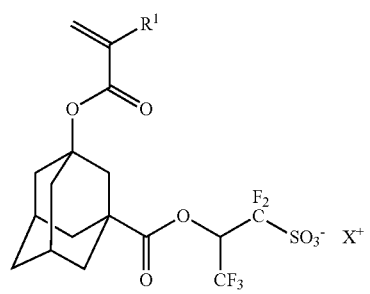
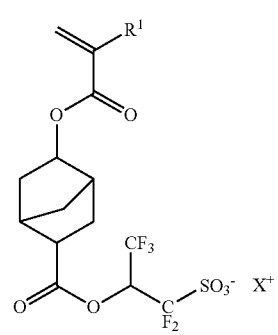
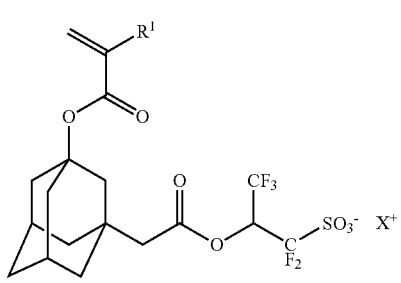
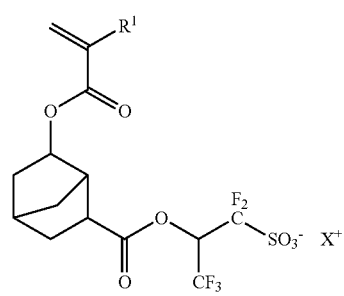
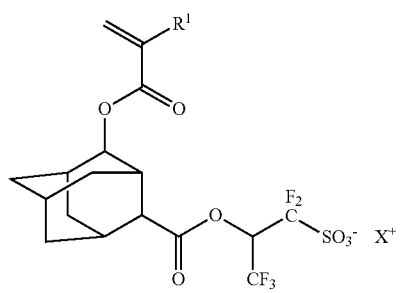
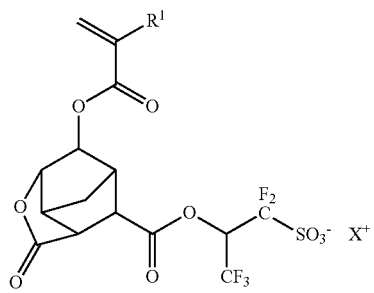
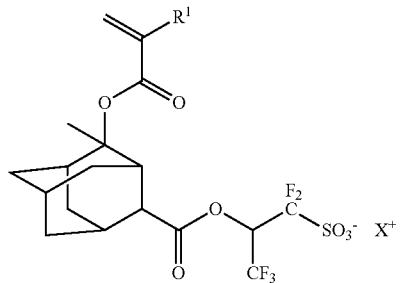
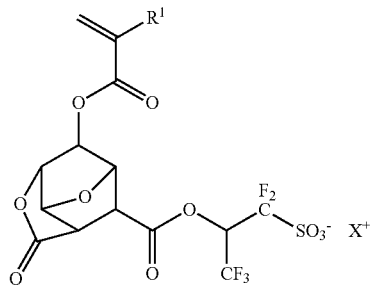

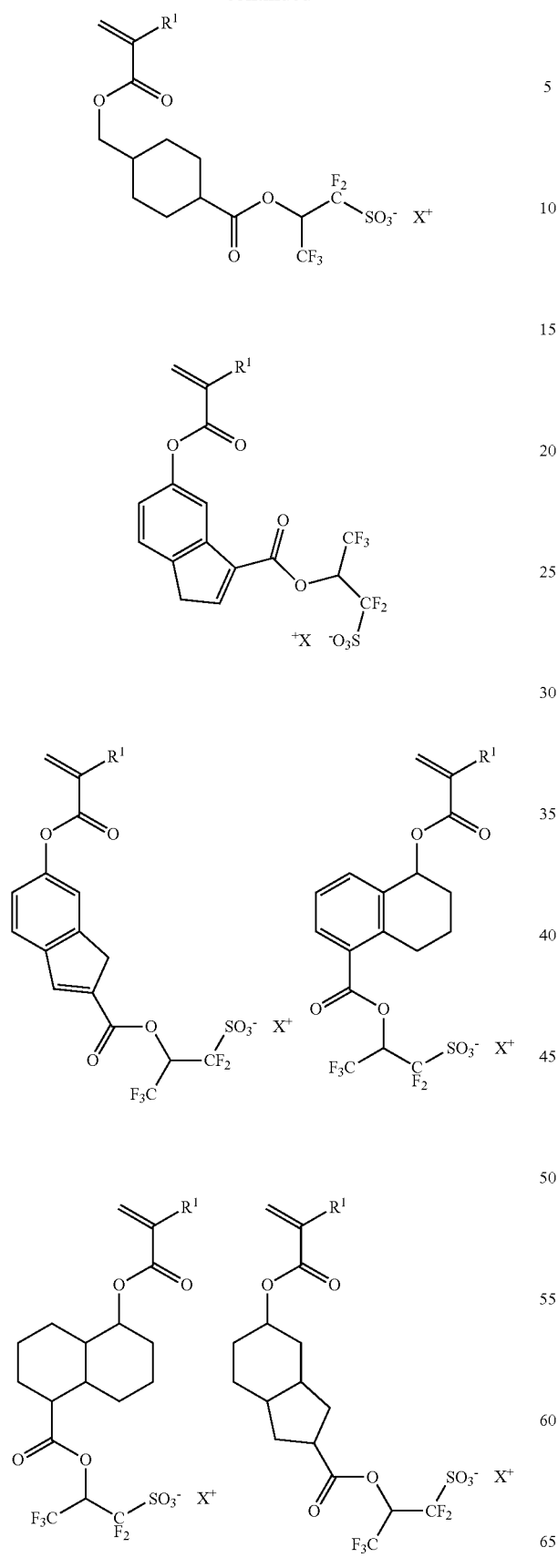
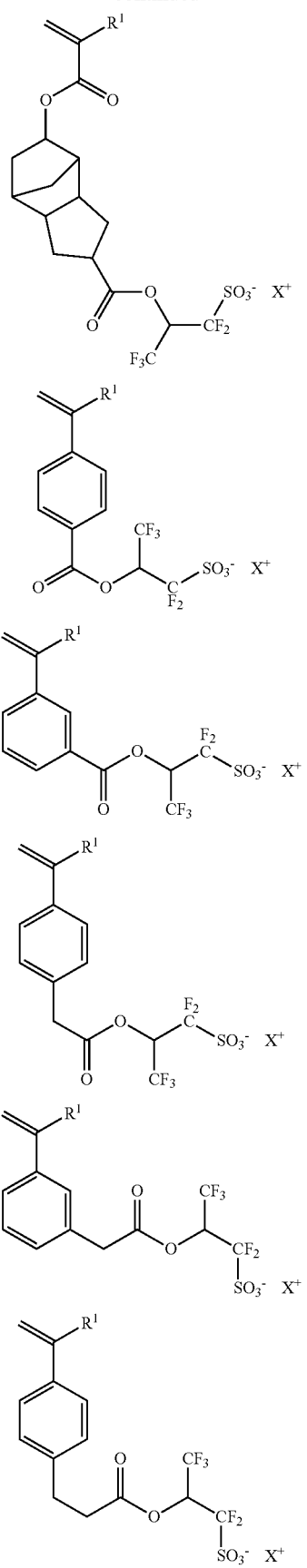

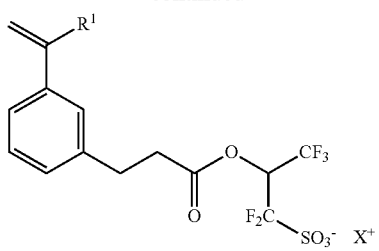
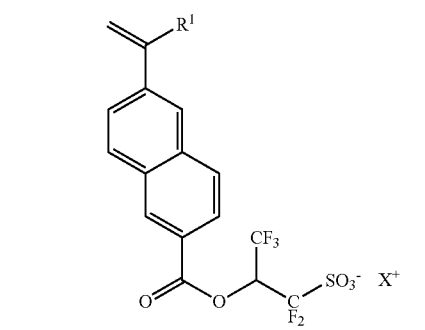
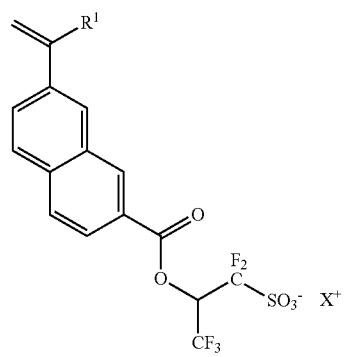
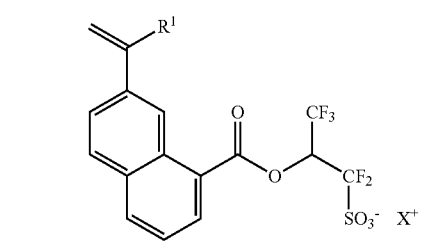
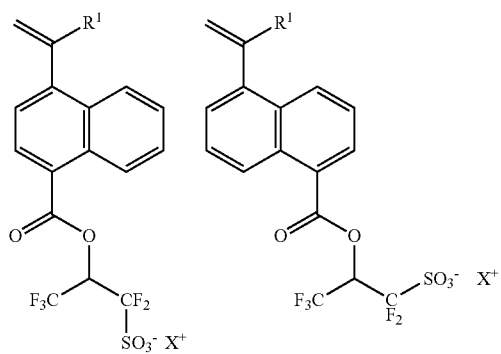
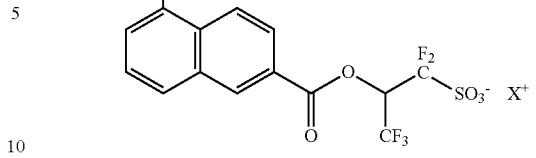
wherein R¹ has the same meaning as defined above; and X represents a hydrogen atom, a lithium atom, a sodium atom, a potassium atom, an amine, or a sulfonium.
Illustrative examples of the monomer to give the repeating unit "a2" include the following compounds,
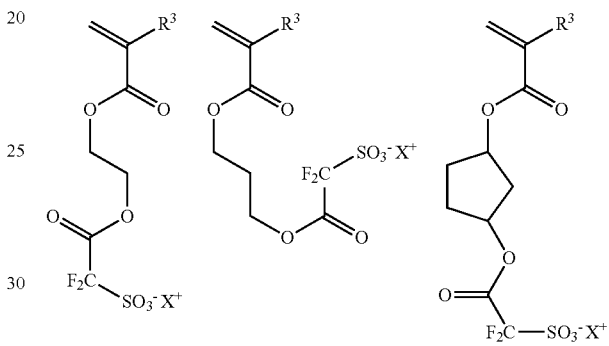
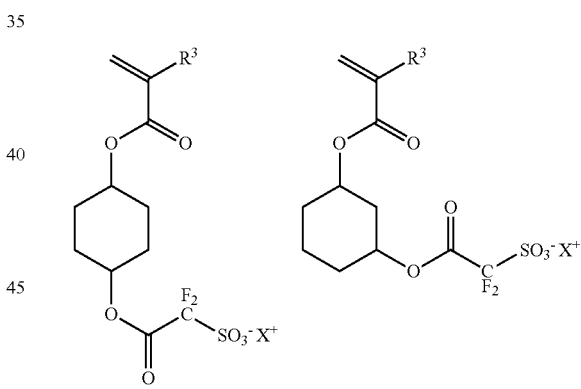
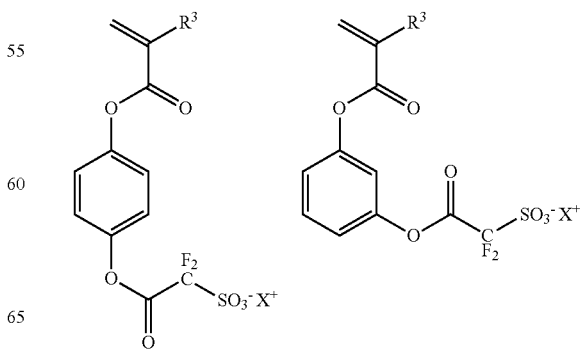

-continued
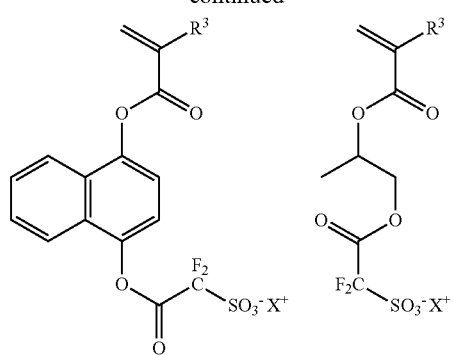
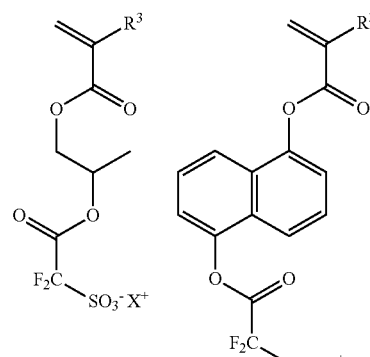
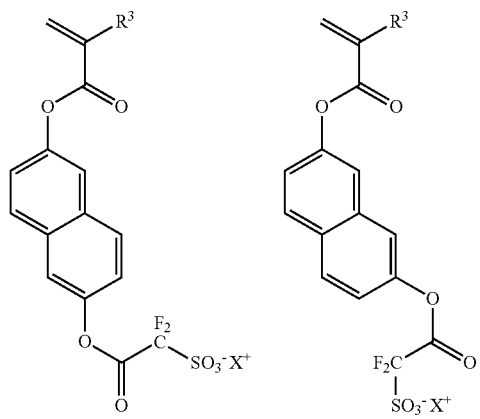
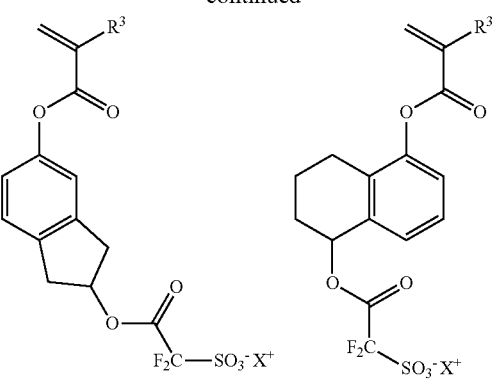
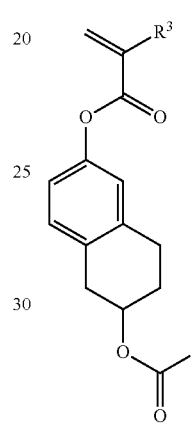
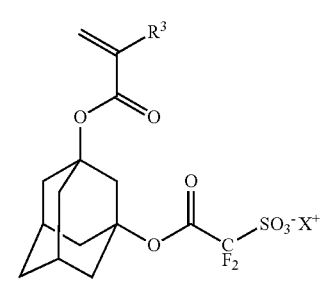
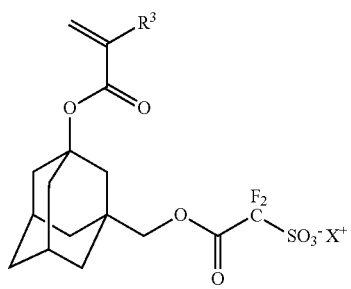
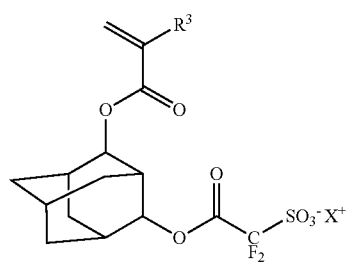
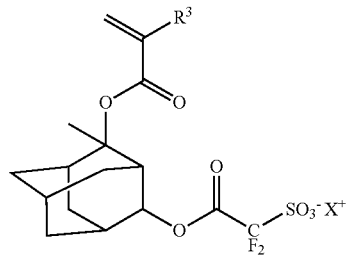

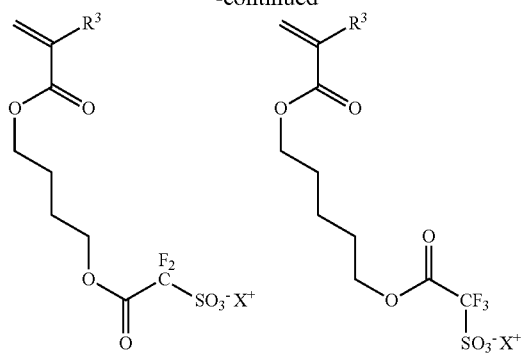
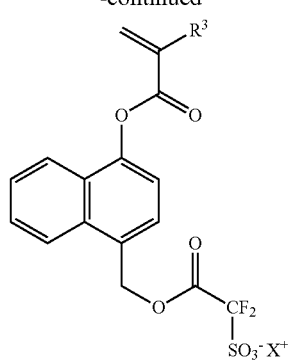
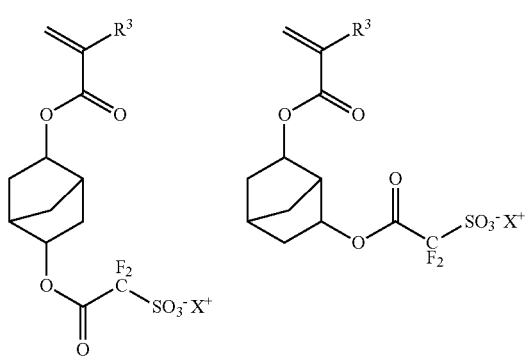
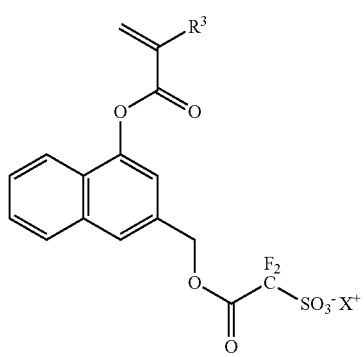
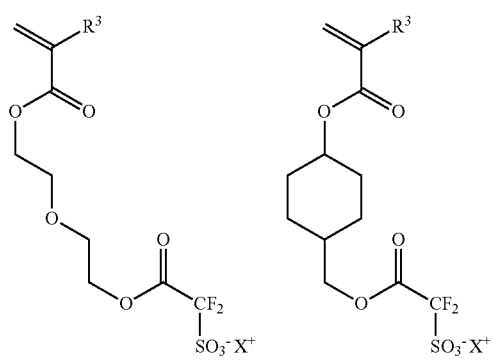
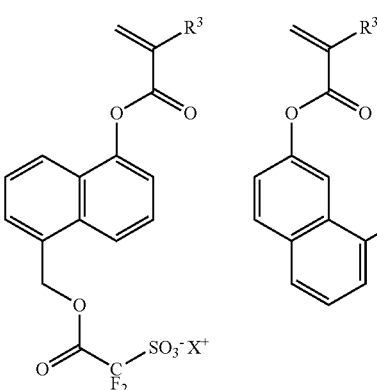
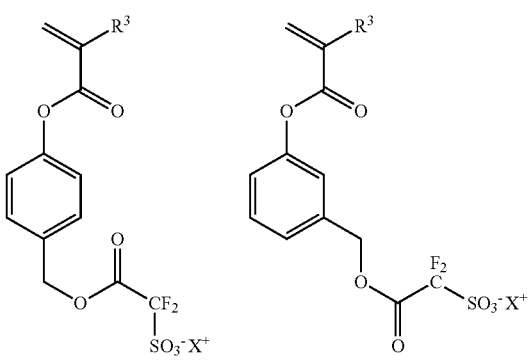
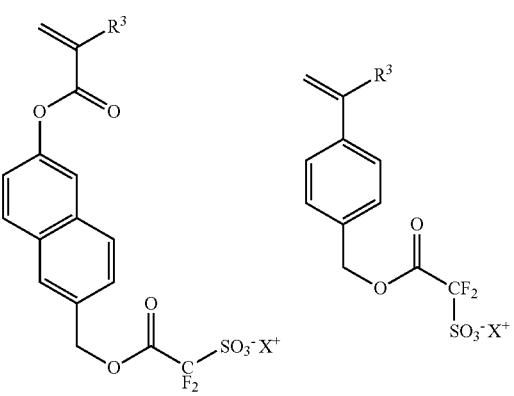

-continued
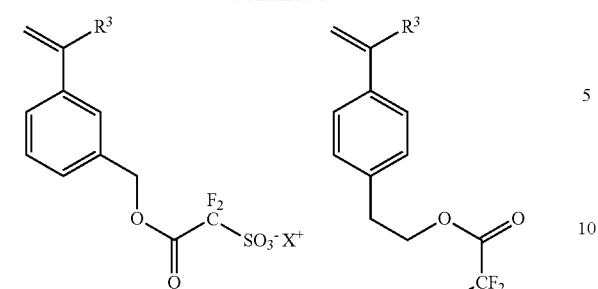
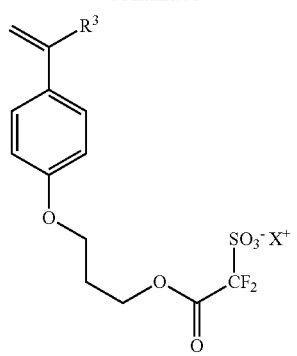
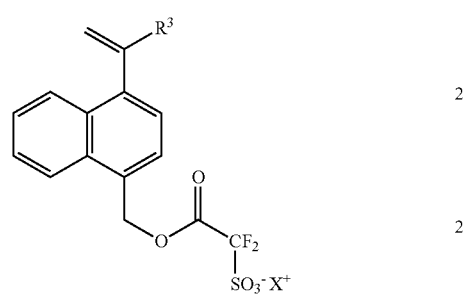
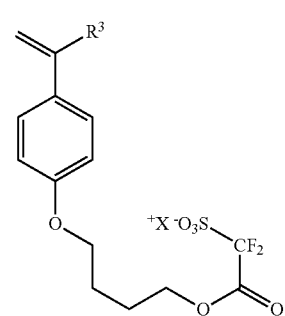
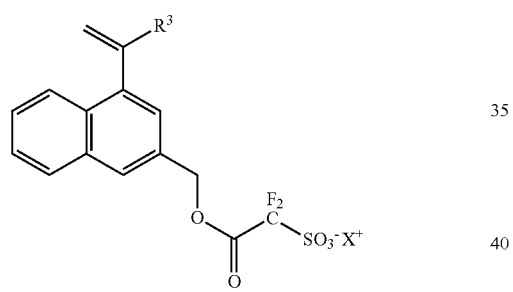
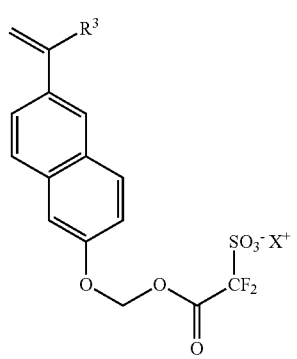
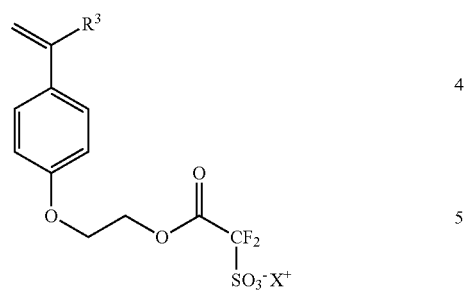
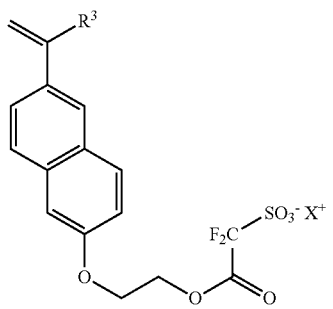
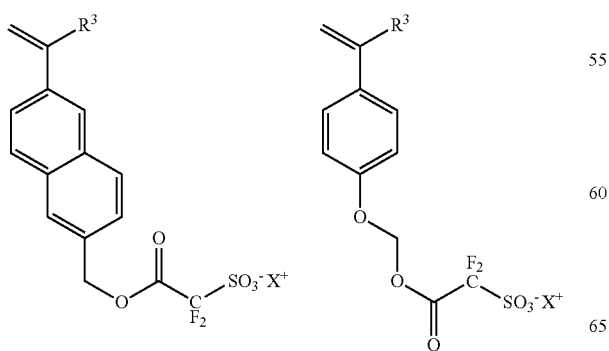
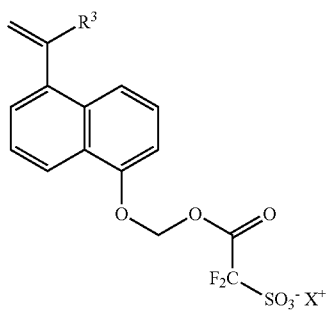

-continued
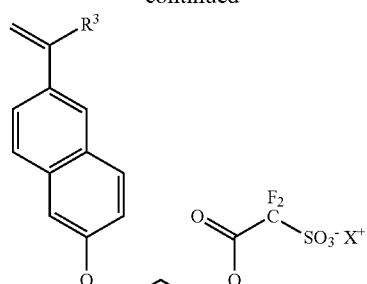
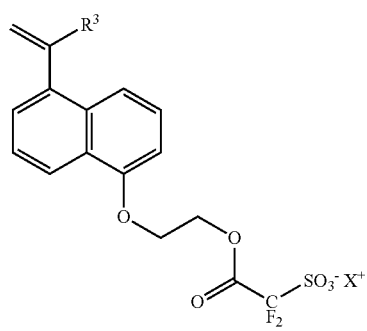
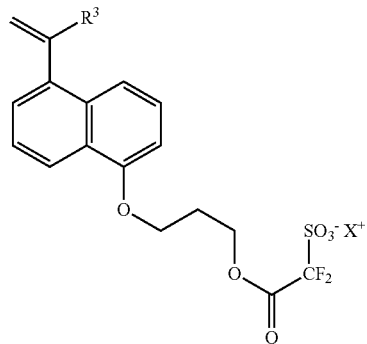
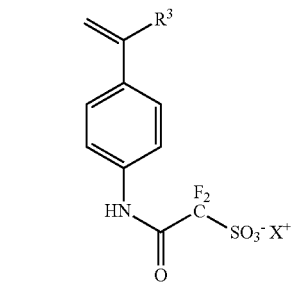
wherein R³ has the same meaning as defined above; and X represents a hydrogen atom, a lithium atom, a sodium atom, a potassium atom, an amine, or a sulfonium.
Illustrative examples of the monomer to give the repeating unit "a3" include the following compounds,
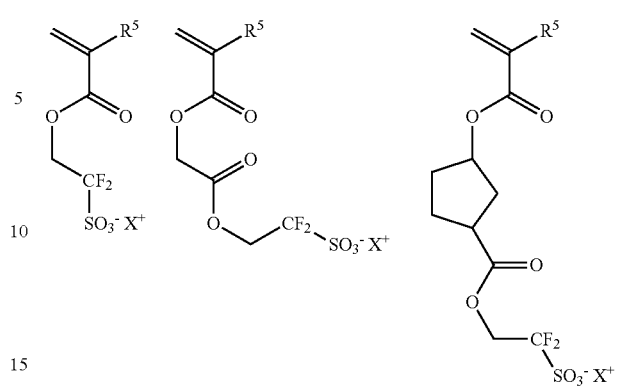
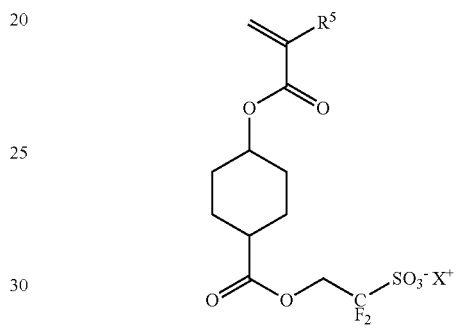
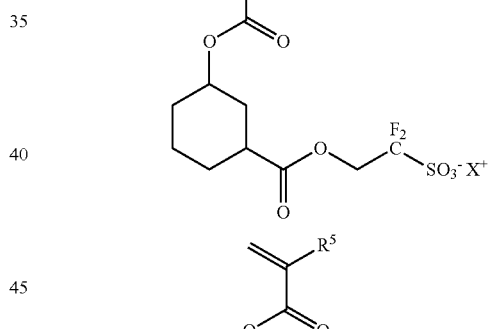
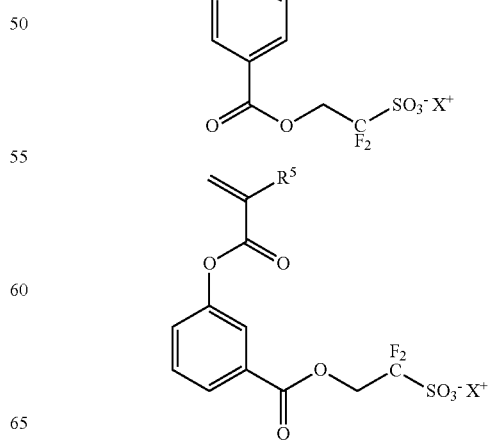

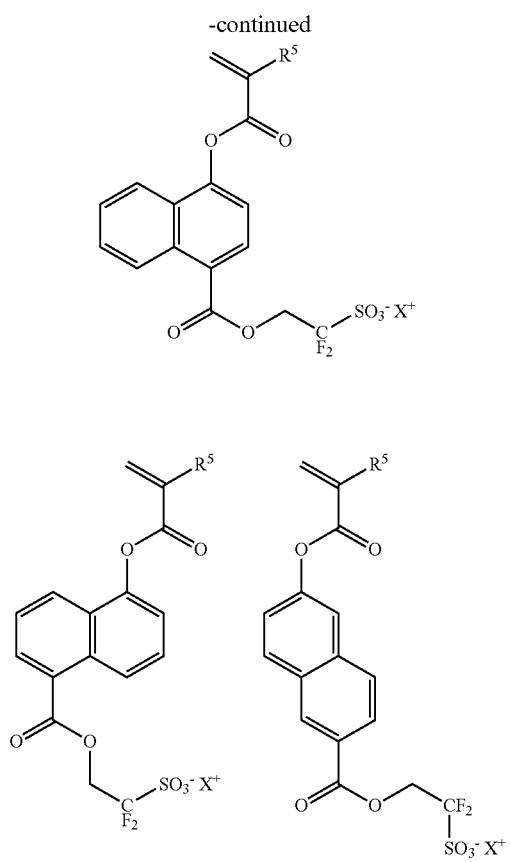
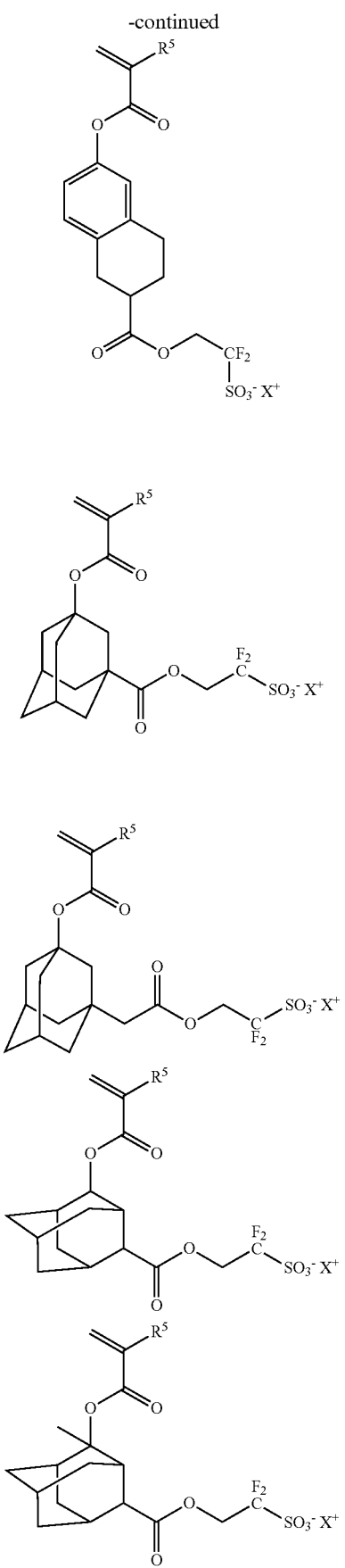

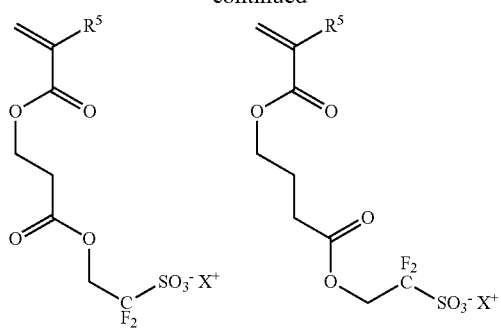
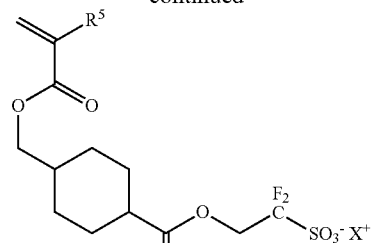
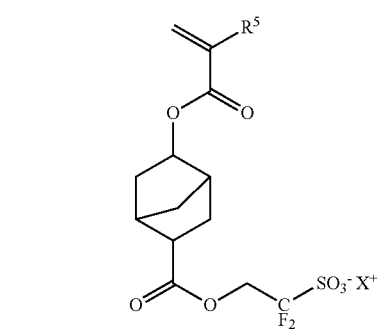
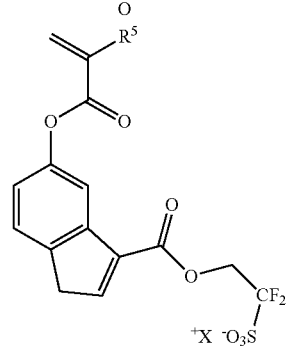
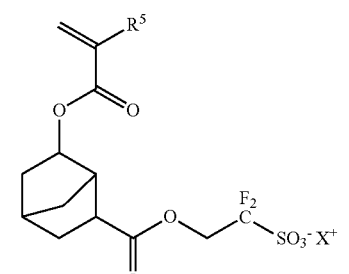
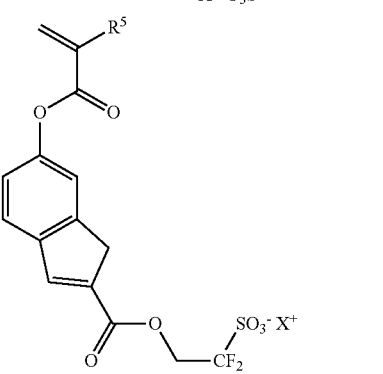
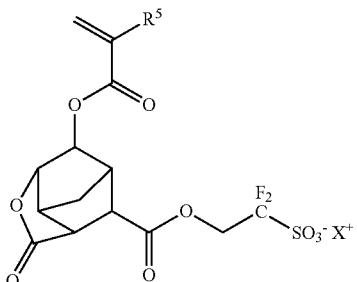
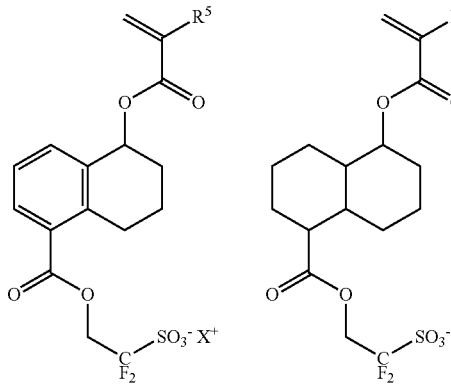
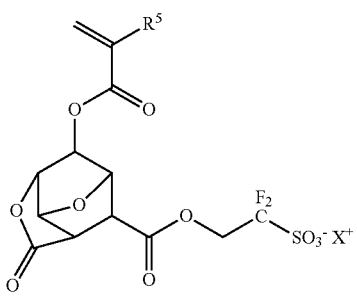
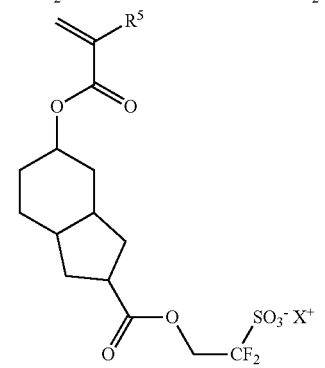

-continued
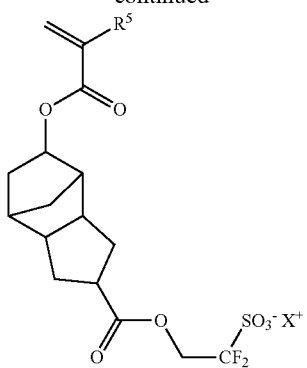
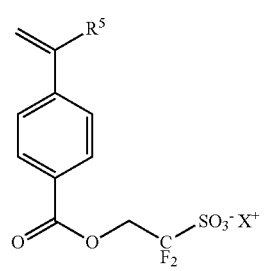
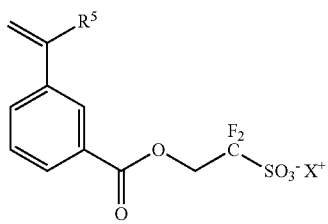
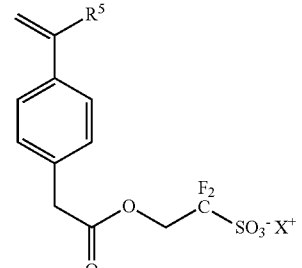
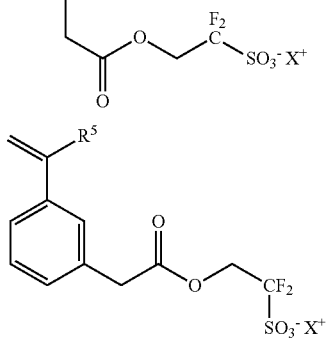
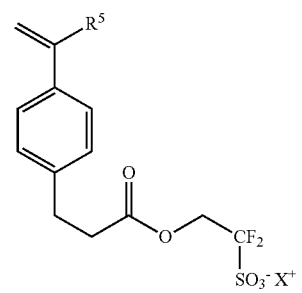
-continued
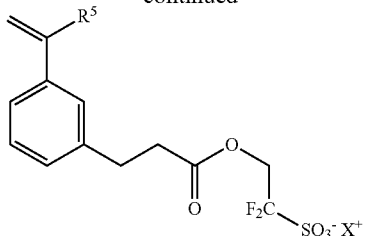
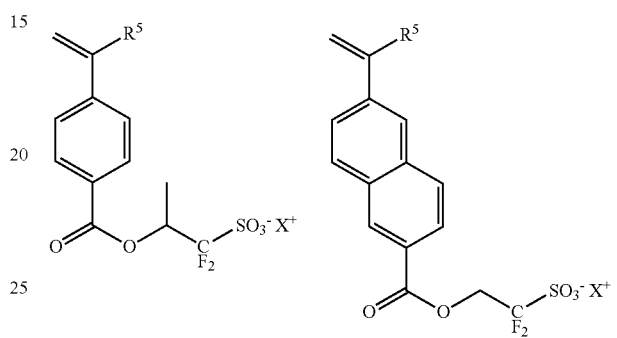
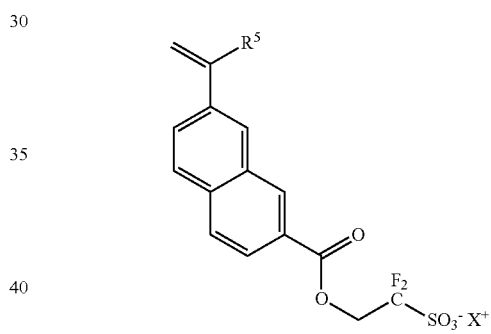
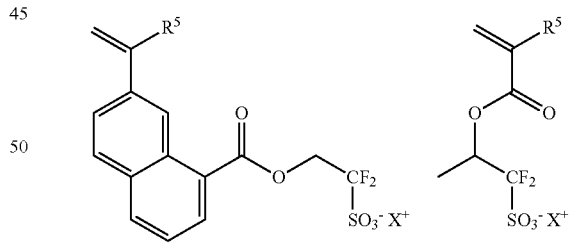

-continued

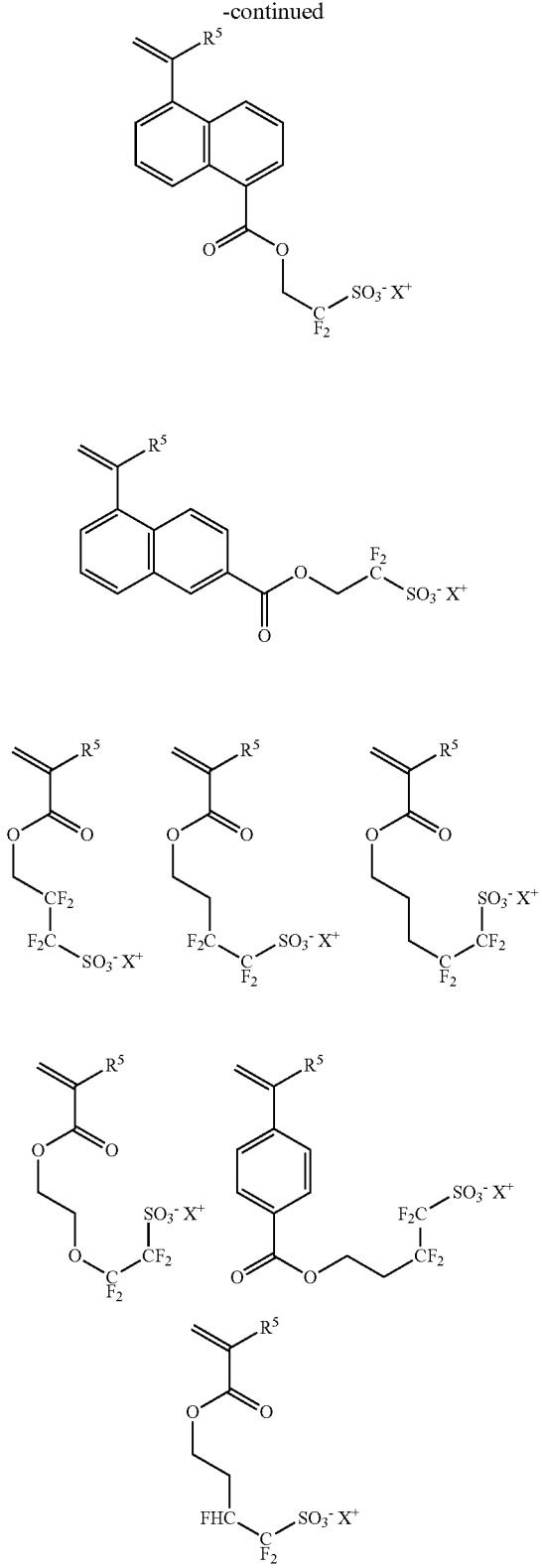

wherein $R^5$ has the same meaning as defined above; and X represents a hydrogen atom, a lithium atom, a sodium atom, a potassium atom, an amine, or a sulfonium.

Illustrative examples of the monomer to give the repeating unit "a4" include the following compounds,

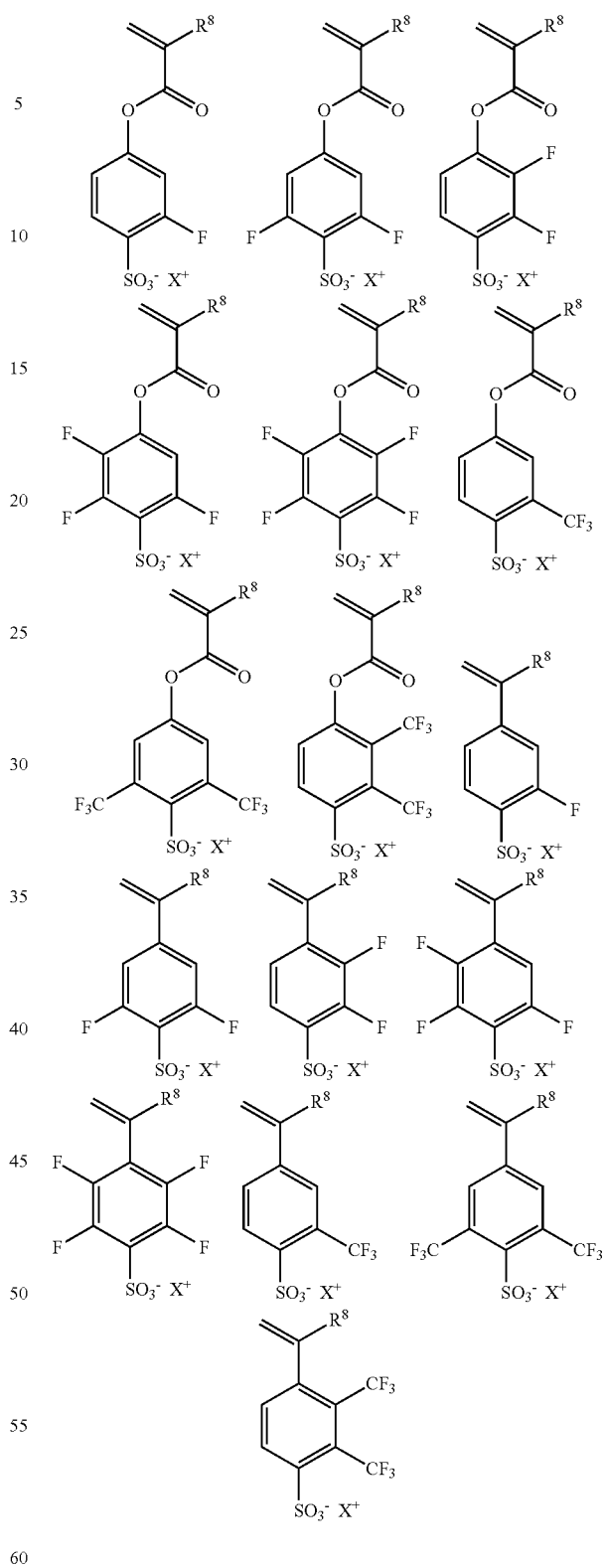

wherein $R^8$ has the same meaning as defined above; and X represents a hydrogen atom, a lithium atom, a sodium atom, a potassium atom, an amine, or a sulfonium.

By using such a component (B), the material can be improved in filterability, film-formability, affinity to an organic solvent and an organic substrate, and transmittance after film formation.

Also, the component (B) preferably further contains a repeating unit "b" shown by the following general formula (2). By containing the repeating unit "b", the conductivity can be further enhanced.

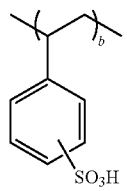

(2)

wherein "b" is a number satisfying 0<b<1.0.

Illustrative examples of the monomer to give the repeating unit "b" include the following compounds,

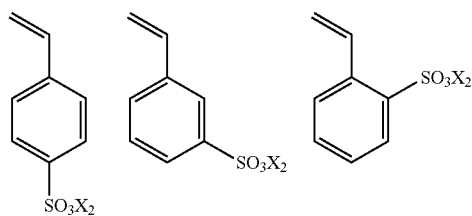

wherein $X_2$ represents a hydrogen atom, a lithium atom, a sodium atom, a potassium atom, an amine, or a sulfonium.

If X and/or $X_2$ are amine, (P1a-3) described in paragraph (0048) of Japanese Patent Laid-Open Publication No. 2013-228447 may be mentioned as examples.

Here, as mentioned before, "a1", "a2", "a3", and "a4" are each a number satisfying 0≤a1≤1.0, 0≤a2≤1.0, 0≤a3≤1.0, 0≤a4≤1.0, and 0<a1+a2+a3+a4≤1.0; preferably 0.2≤a1+a2+a3+a4≤1.0. If 0<a1+a2+a3+a4≤1.0 (namely, if any of the repeating units "a1" to "a4" is contained), the effect of the present invention can be obtained; and if 0.2≤a1+a2+a3+a4≤1.0, more excellent effect can be obtained.

If the repeating unit "b" is contained, in view of enhancing the conductivity, "b" is preferably in the range of 0.3≤b<1.0, more preferably 0.3≤b≤0.8.

In addition, the proportion of the repeating units "a1+a2+a3+a4" and the repeating unit "b" is preferably in the range of 0.2≤a1+a2+a3+a4≤0.7 and 0.3≤b≤0.8, more preferably 0.3≤a1+a2+a3+a4≤0.6 and 0.4≤b≤0.7.

In addition, the dopant polymer of the component (B) may contain a repeating unit "c" besides the repeating units "a1" to "a4" and the repeating unit "b"; and examples of the repeating unit "c" include a styrene type, a vinylnaphthalene type, a vinylsilane type, acenaphthylene, indene, and vinylcarbazole.

Illustrative examples of the monomer to give the repeating unit "c" include the following compounds,

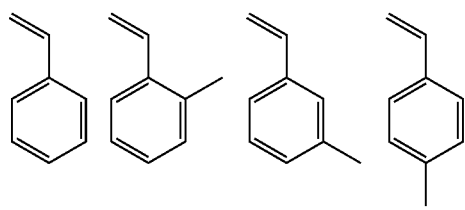

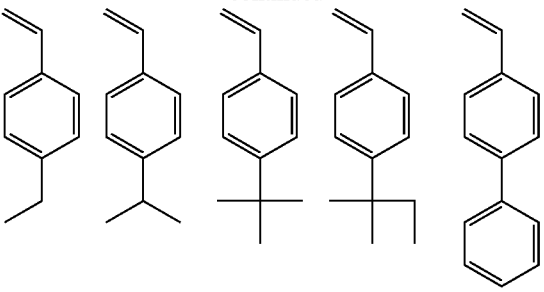

-continued

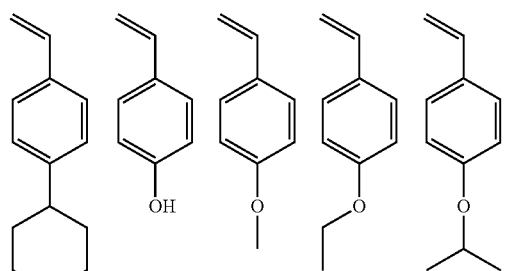

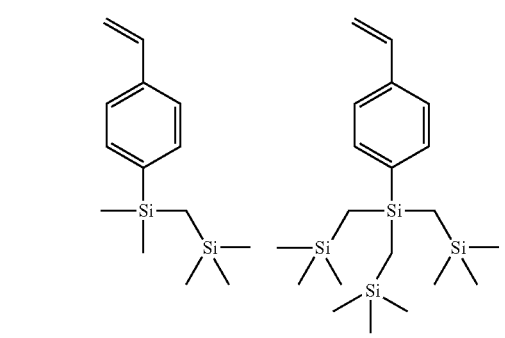

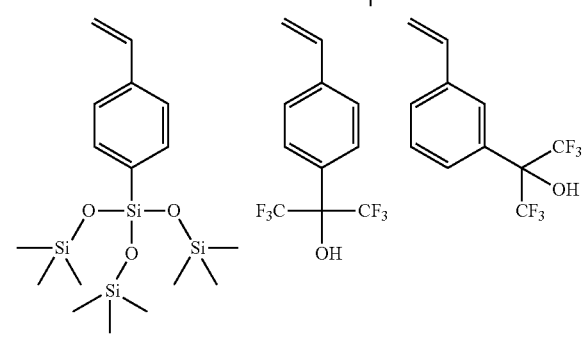

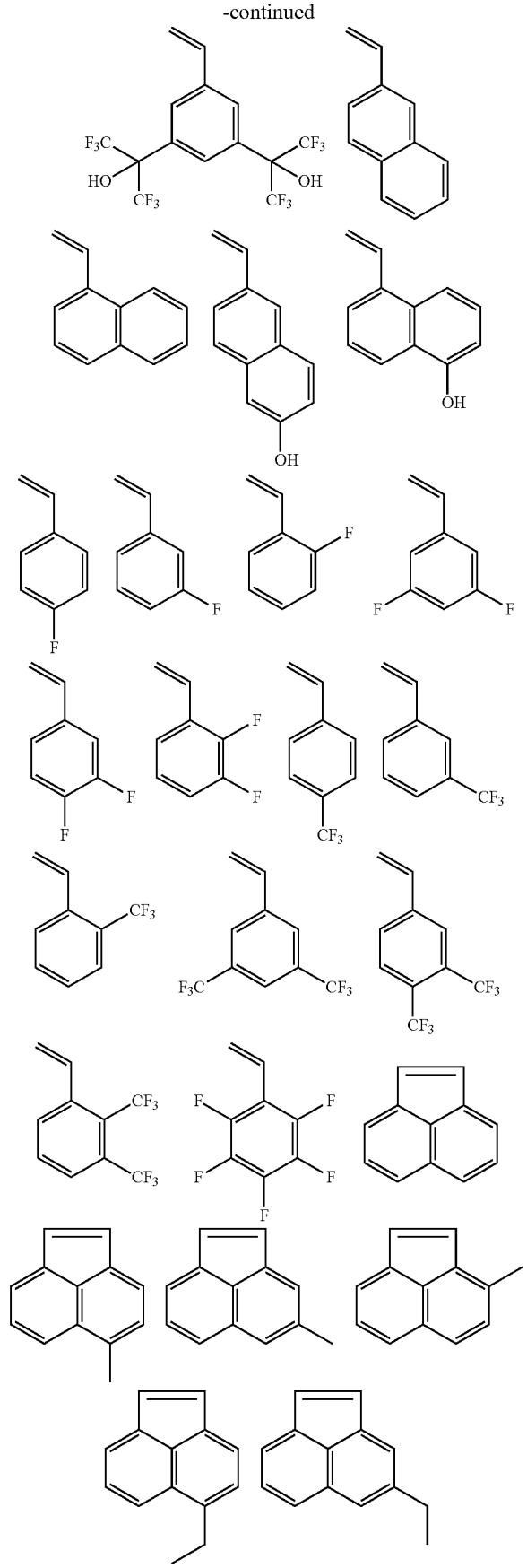
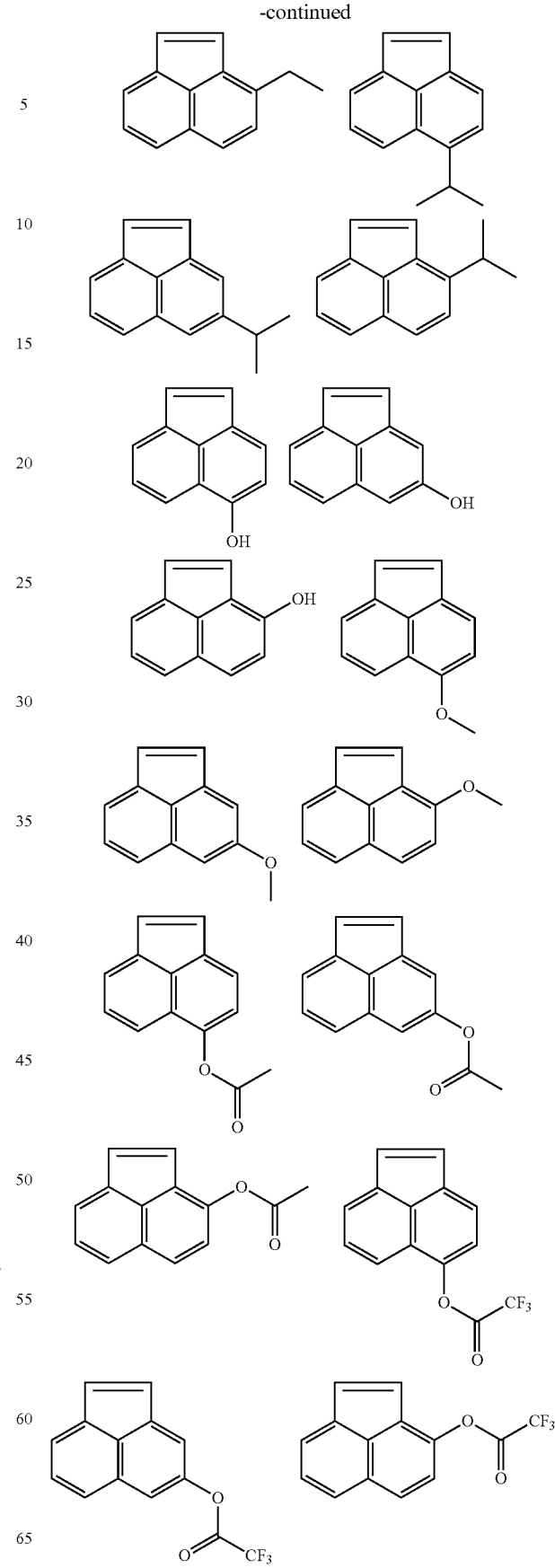

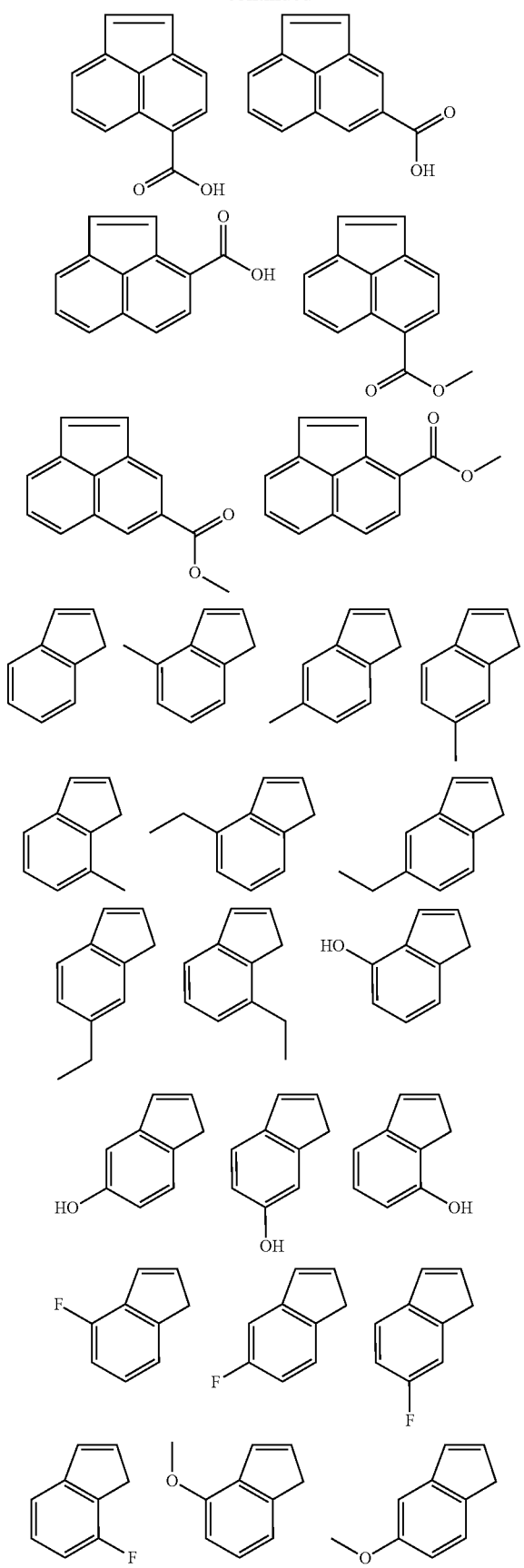
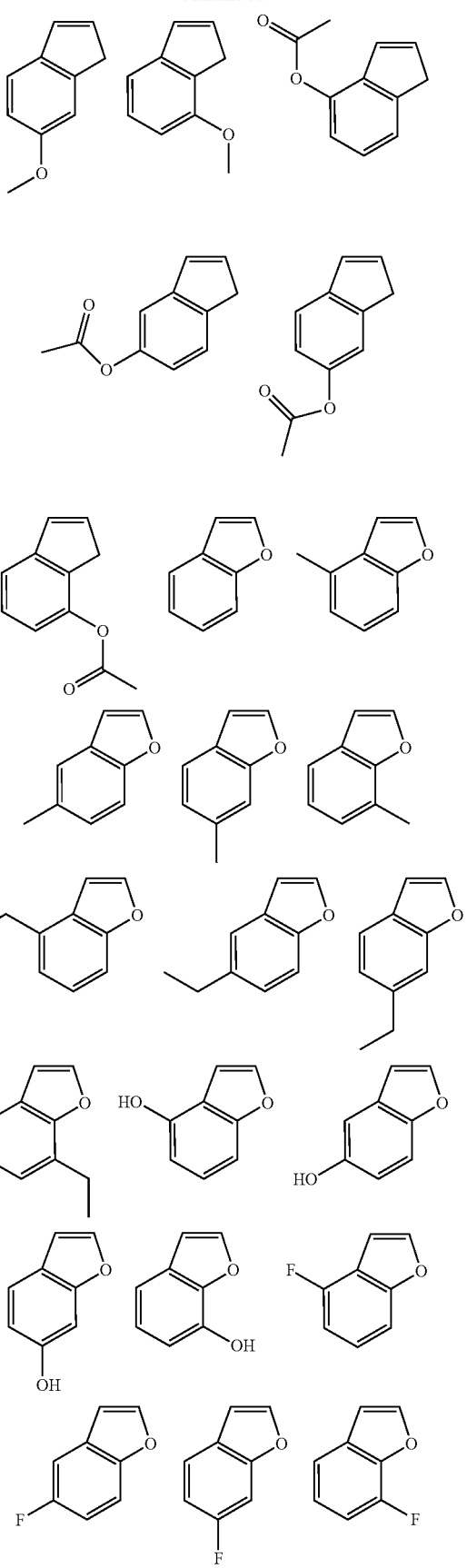

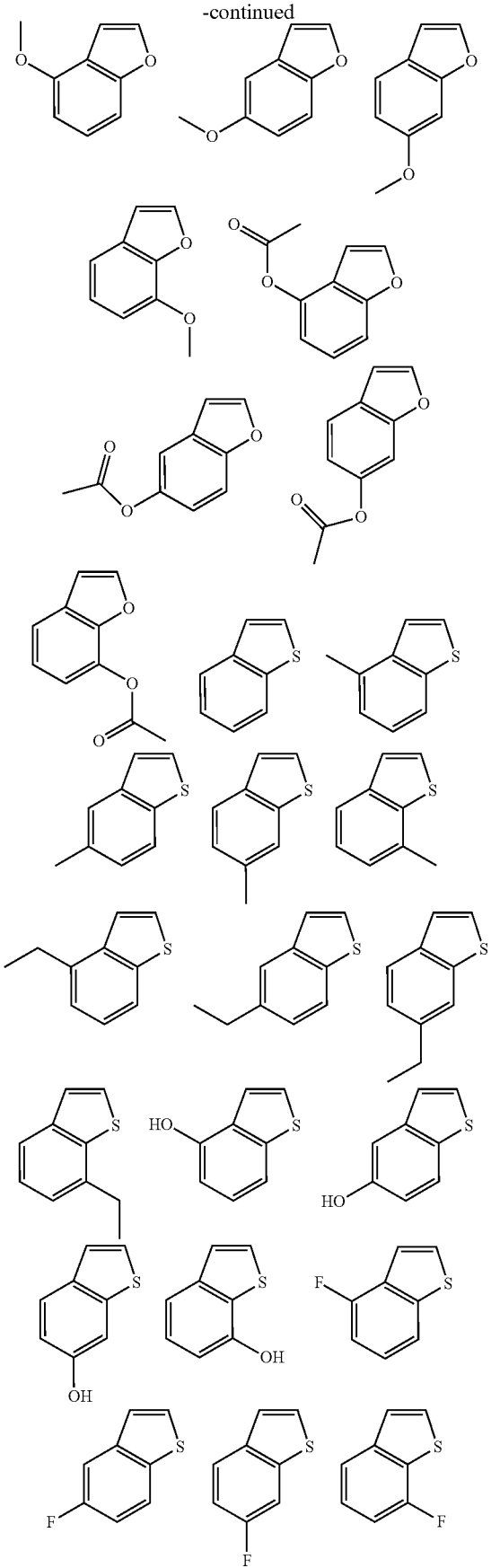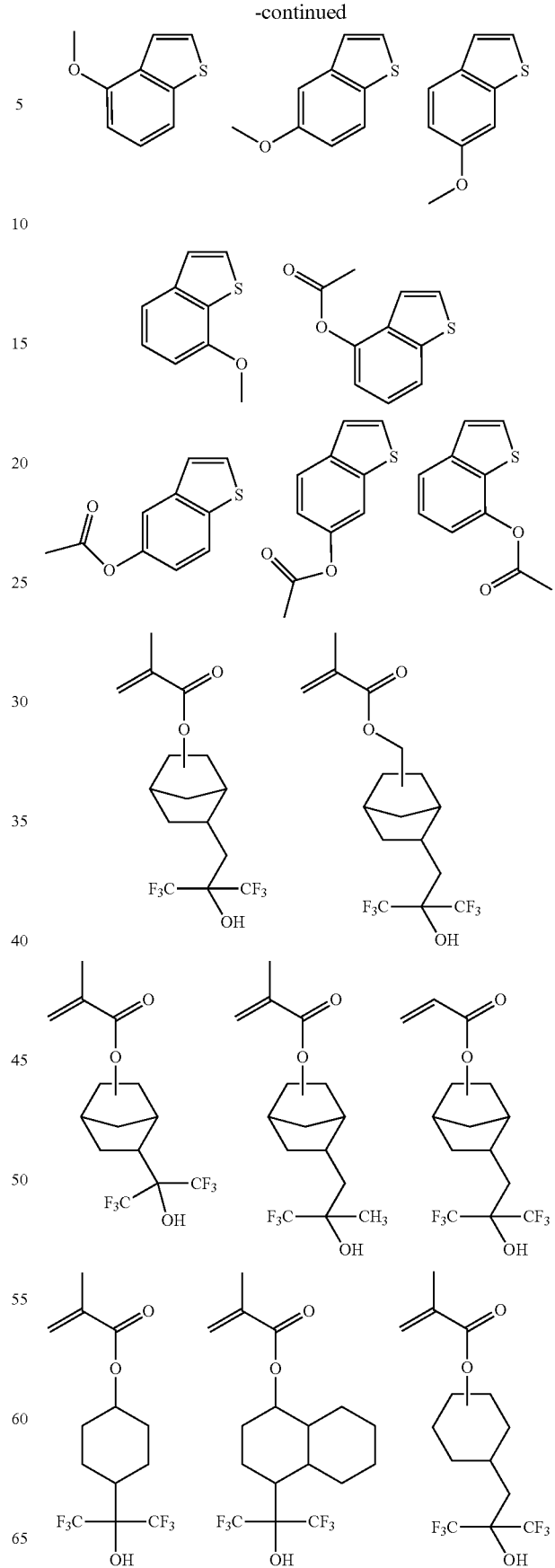

-continued
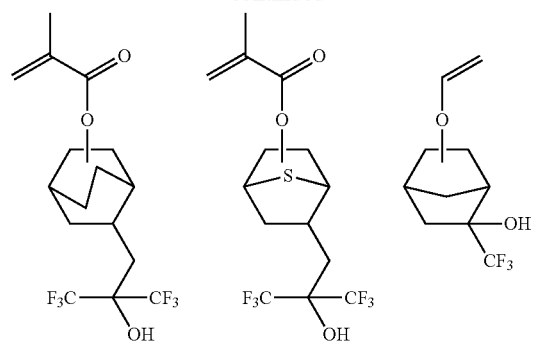
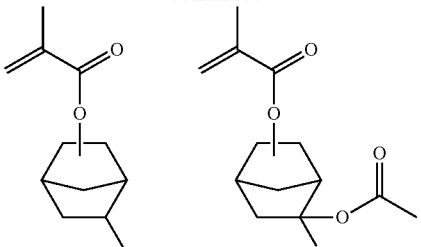
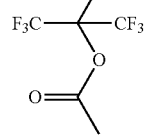
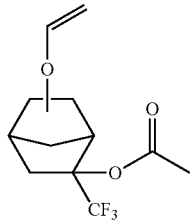
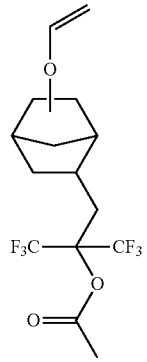
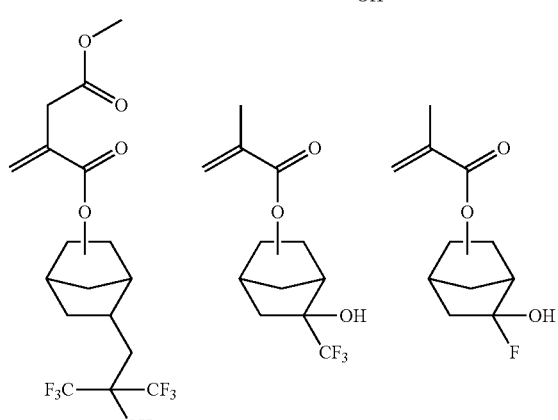
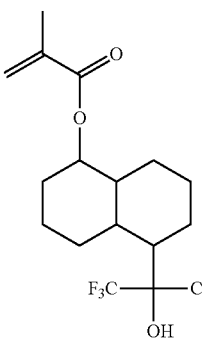
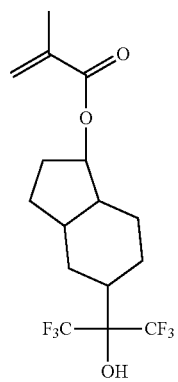
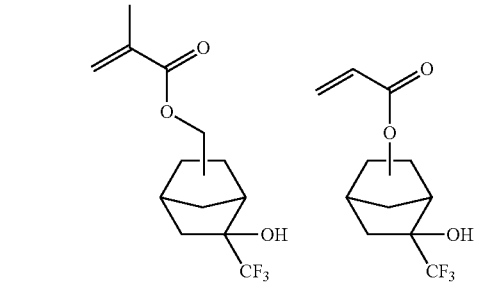
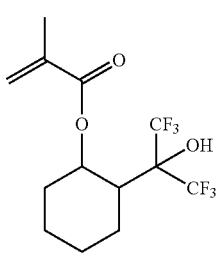
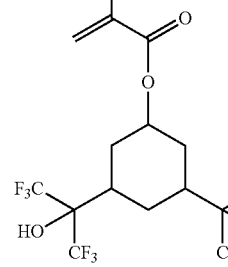
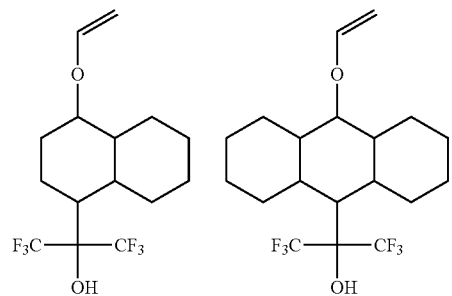
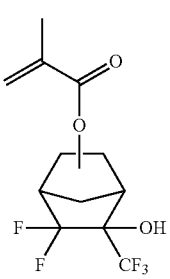
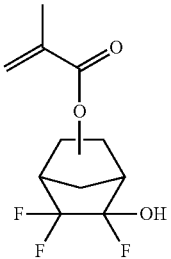

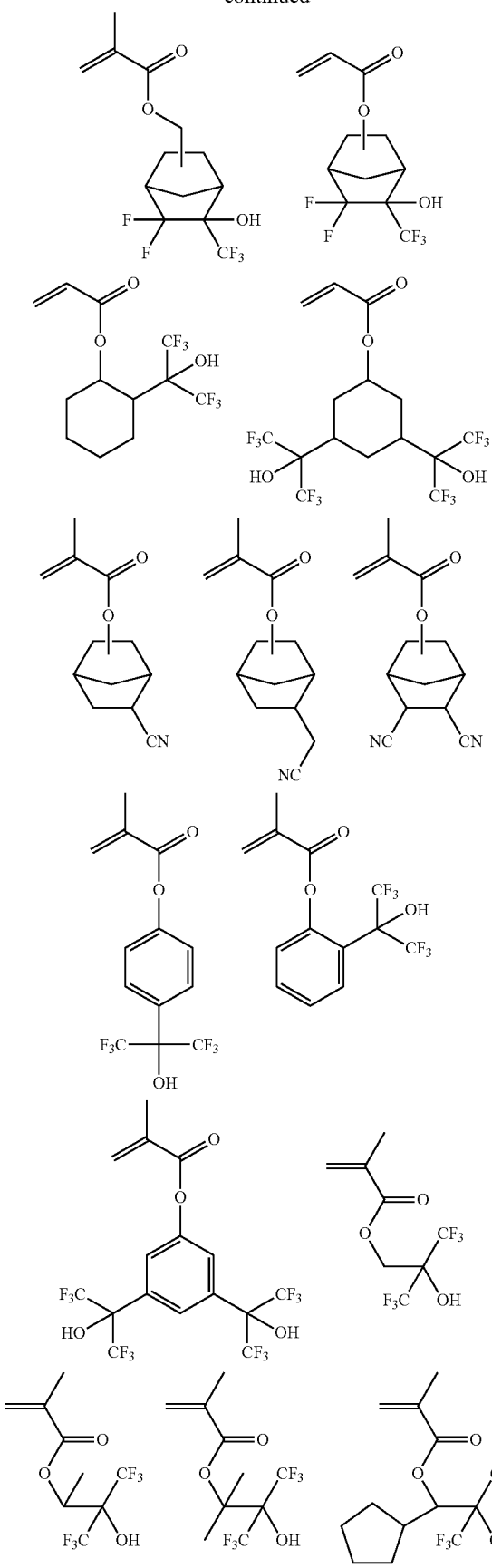
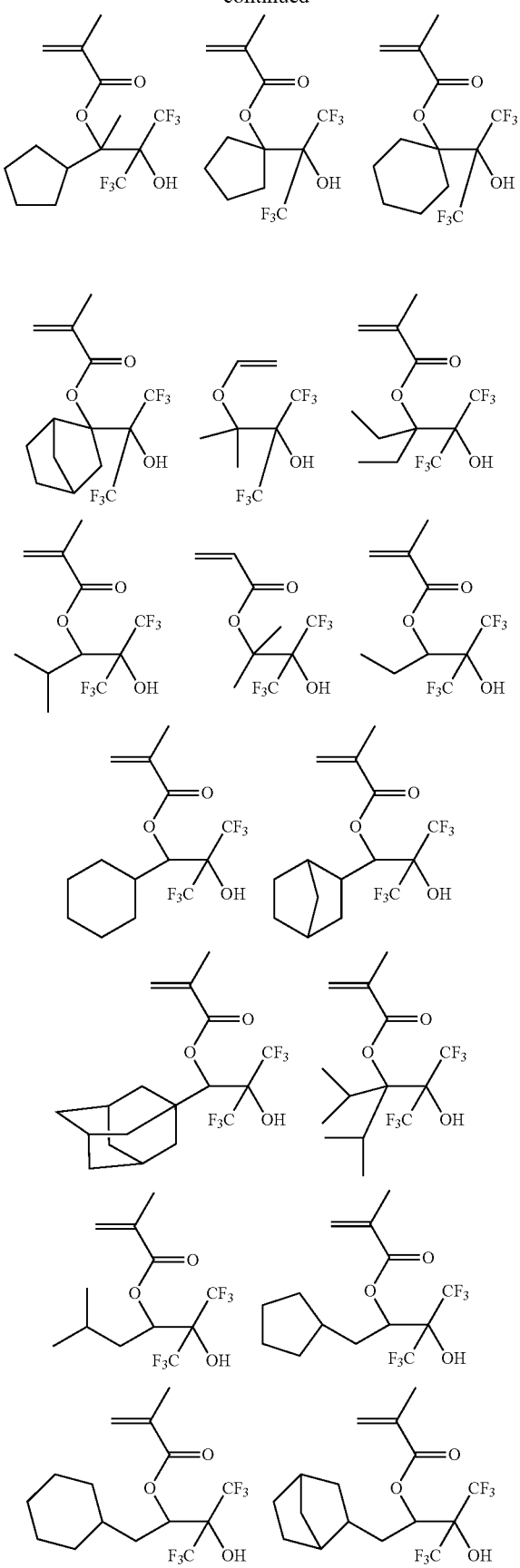

-continued
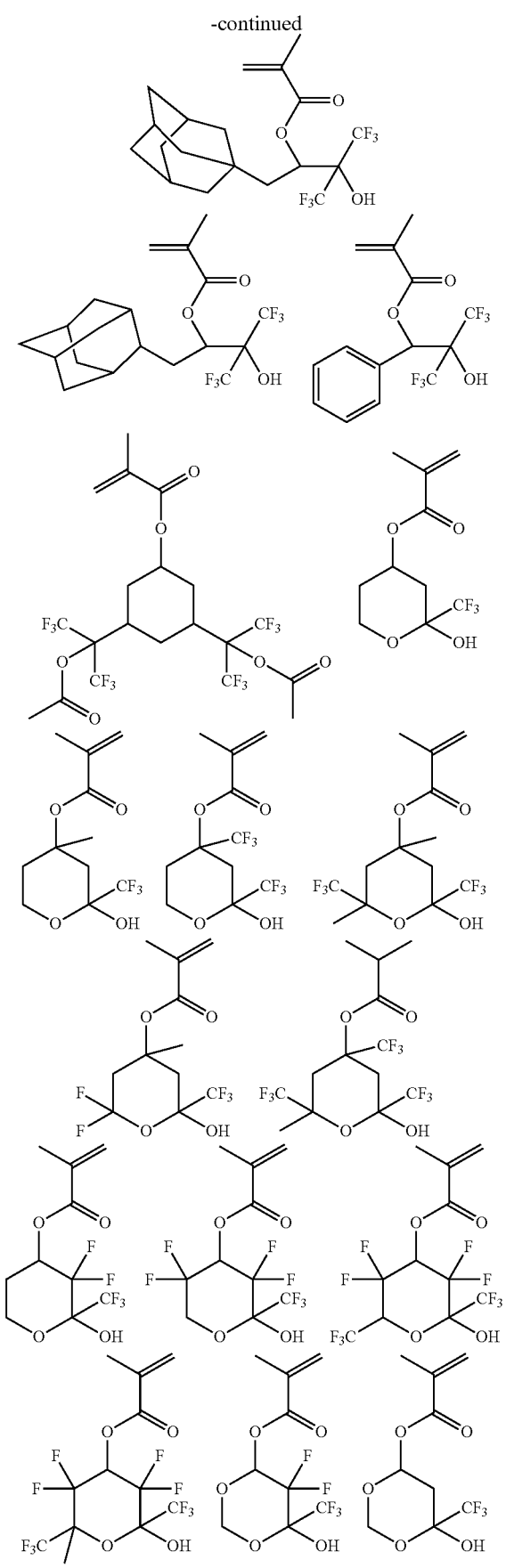
-continued
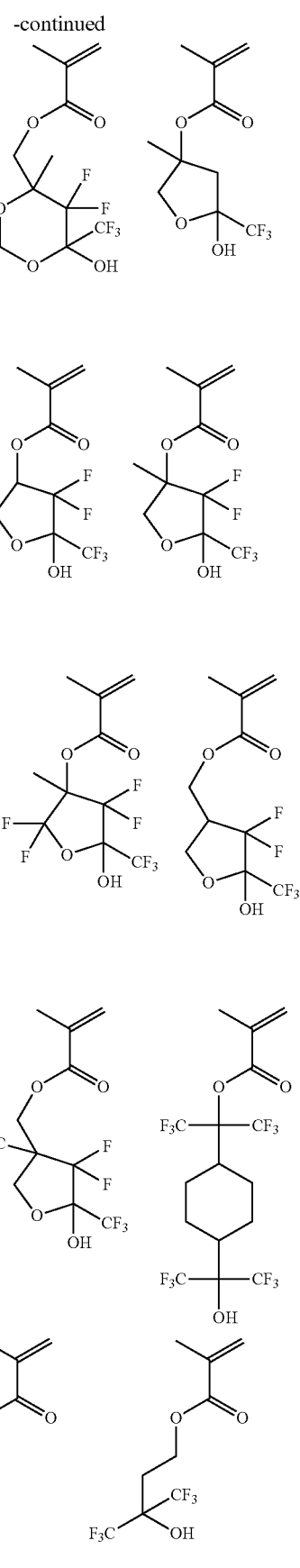

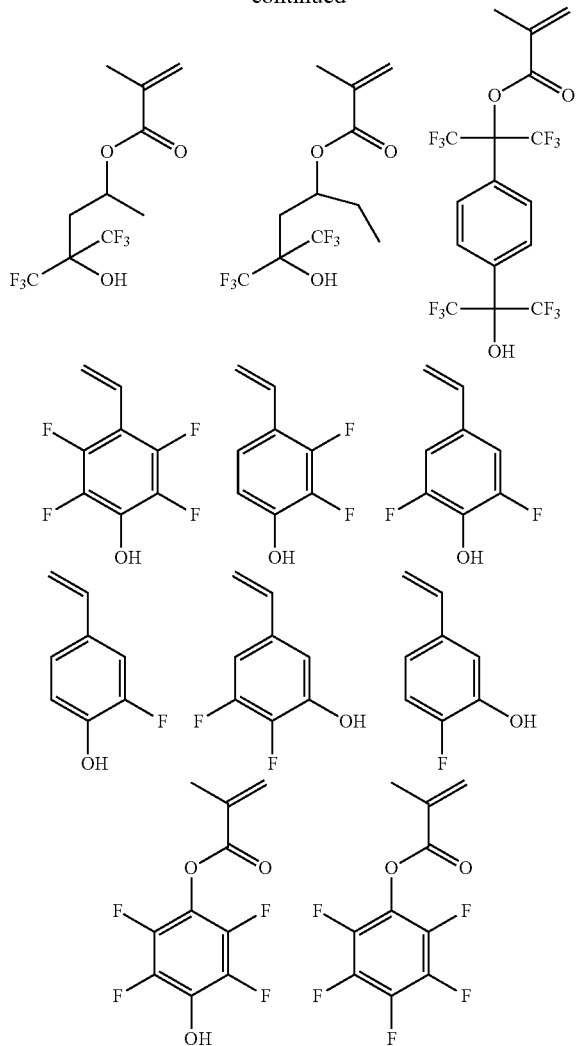

Among the monomers to give the repeating unit "c", the monomer containing fluorine is copolymerized to form a copolymer with lowered conductivity but improved transparence, having enhanced hole injection efficiency and lengthened life.

The dopant polymer of the component (B) may be synthesized, for example, by a method in which intended monomers to give the repeating units "a1" to "a4", "b", and "c" as mentioned above are subjected to thermal polymerization in an organic solvent by adding a radical polymerization initiator, thereby obtaining a (co)polymer of the dopant polymer.

Examples of the organic solvent to be used in the polymerization include toluene, benzene, tetrahydrofuran, diethyl ether, dioxane, cyclohexane, cyclopentane, methylethyl ketone, and γ-butyrolactone.

Examples of the radical polymerization initiator include 2,2'-azobisisobutyronitrile (AIBN), 2,2'-azobis(2,4-dimethylvaleronitrile), dimethyl 2,2'-azobis(2-methylpropionate), benzoylperoxide, and lauroylperoxide.

The reaction temperature is preferably in the range of 50 to 80° C.; and the reaction time is preferably in the range of 2 to 100 hours, more preferably 5 to 20 hours.

In the dopant polymer of the component (B), the monomer to give the repeating units "a1" to "a4" may be one kind or two or more kinds; and a combination of a methacryl type monomer and a styrene type monomer is preferable in order to enhance the polymerizability.

In the case that two or more kinds of monomer to give the repeating units "a1" to "a4" are used, the respective monomers may be copolymerized randomly or as a block. When a block-copolymerized polymer (block copolymer) is formed, the sea-island structure is formed by agglomeration among the repeating unit portions composed of respective two or more repeating units "a1" to "a4", whereby generating a special structure around the dopant polymer; and as a result, the merit to enhance the conductivity may be expected.

The monomers to give the repeating units "a1" to "a4", "b", and "c" may be copolymerized randomly, or each of these may be copolymerized as a block. In this case, similarly to the case of the repeating units "a1" to "a4" as mentioned above, the merit to enhance the conductivity may be expected by forming a block copolymer.

In the case that the random copolymerization is carried out by a radical polymerization, the polymerization is generally performed by heating a mixture containing monomers to be copolymerized and a radical polymerization initiator. When the polymerization of a first monomer is initiated in the presence of a radical polymerization initiator and then followed by addition of a second monomer, the resulting polymer has a structure that the first monomer is polymerized at one side of the polymer molecule, and the second monomer is polymerized at the other side. In this case, however, the repeating units of the first and second monomers are mixedly present at the middle portion, thus it has a different structure from the block copolymer. In order to form the block copolymer by radical polymerization, living radical polymerization is preferably used.

In a living radical polymerization method called RAFT polymerization (Reversible Addition Fragmentation chain Transfer polymerization), radicals at the polymer terminal are always living, so that it is possible to form a diblock copolymer composed of a block of the repeating unit of the first monomer and a block of the repeating unit of the second monomer by starting the polymerization with a first monomer, and then adding a second monomer at the time when the first monomer has been consumed. In addition, it is also possible to form a triblock copolymer by starting the polymerization with a first monomer, then adding a second monomer at the time when the first monomer has been consumed, and then adding a third monomer thereto.

The RAFT polymerization has the characteristic that the polymer having narrow molecular weight distribution (dispersity) can be obtained. In particular, when the RAFT polymerization is carried out by adding monomers all at once, a polymer having further narrower molecular weight distribution can be obtained.

Meanwhile, in the dopant polymer of the component (B), the molecular weight distribution (Mw/Mn) is preferably in the range of 1.0 to 2.0, particularly preferably in the range of narrower dispersity of 1.0 to 1.5. If the dispersity is narrow, lowering of transmittance of the conductive film which is formed from the conductive material using this polymer can be prevented.

To carry out the RAFT polymerization, a chain transfer agent is necessary; and illustrative examples thereof include 2-cyano-2-propylbenzo thioate, 4-cyano-4-phenylcarbonothioyl thiopentanoic acid, 2-cyano-2-propyldodecyl trithiocarbonate, 4-cyano-4-[(dodecylsulfanylthiocarbonyl)sulfanyl]pentanoic acid, 2-(dodecylthiocarbonothioylthio)-2-methylpropanoic acid, cyanomethyl dodecylthiocarbonate, cyanomethyl methyl(phenyl)carbamothioate, bis(thiobenzoyl) disulfide, and bis(dodecylsulfanylthiocarbonyl) disulfide. Among them, 2-cyano-2-propylbenzo thioate is especially preferable.

The repeating units "a1" to "a4", "b", and "c" are preferably in the proportion of 0<a1+a2+a3+a4≤1.0, 0<b<1.0, and 0≤c<1.0, more preferably 0.1≤a1+a2+a3+a4≤0.9, 0.1≤b≤0.9, and 0≤c≤0.8, much more preferably 0.2≤a1+a2+a3+a4≤0.8, 0.2≤b≤0.8, and 0≤c≤0.5.

Also, it is preferred that a1+a2+a3+a4+b+c=1.

The weight-average molecular weight of the dopant polymer of the component (B) is in the range of 1,000 to 500,000, preferably 2,000 to 200,000. If the weight-average molecular weight is less than 1,000, the heat resistance is insufficient, and homogeneity in the composite solution with the component (A) becomes poor. On the other hand, if the weight-average molecular weight thereof is more than 500,000, not only the conductivity deteriorates but also the viscosity increases thereby deteriorating the workability and decreasing the dispersibility into water or into an organic solvent.

The weight-average molecular weight (Mw) is a measured value in terms of polyethylene oxide, polyethylene glycol, or polystyrene by gel permeation chromatography (GPC) using water, dimethyl formamide (DMF), or tetrahydrofuran (THF) as a solvent.

As to the monomer to constitute the dopant polymer of the component (B), a monomer having a sulfo group may be used. Alternatively, a monomer having a lithium salt, a sodium salt, a potassium salt, an ammonium salt, or a sulfonium salt of a sulfo group may be used as a monomer to perform a polymerization reaction, and after the polymerization, these salts may be converted into a sulfo group by an ion-exchange resin.

[(C) Monovalent Copper Salts of Carboxylic Acid, β-Diketone, β-Ketoester]

The conductive material of the present invention contains one or more salts selected from the group consisting of a monovalent copper salt of carboxylic acid, a monovalent copper salt of β-diketone, and a monovalent copper salt of β-ketoester (hereinafter, referred to as a monovalent copper salt) as component (C). Particularly, the component (C) is preferably one or more salts selected from those shown by the following general formulae (3-1) to (3-3),

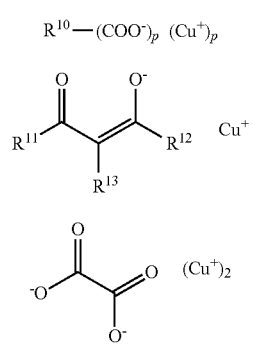

wherein "p" is an integer of 1 to 6; $R^{10}$ represents a hydrogen atom or a linear, branched, or cyclic hydrocarbon group having 1 to 30 carbon atoms with a valence of "p", and when $R^{10}$ is a hydrocarbon group, $R^{10}$ optionally contains a halogen atom, a nitrogen atom, a hydroxy group, an ether group, an ester group, an amino group, an amide group, a carbamate group, a carbonate group, a sulfonate ester group, a thiol group, a sulfide group, a carbonyl group, a sulfonyl group, a lactone group, a lactam group, a sultone group, or a nitro group; $R^{11}$ and $R^{12}$ independently represent a linear, branched, or cyclic alkyl group having 1 to 20 carbon atoms, an alkenyl group having 2 to 20 carbon atoms, an alkynyl group having 2 to 20 carbon atoms, or an aryl group having 6 to 20 carbon atoms, and $R^{11}$ and $R^{12}$ optionally contain a hydroxy group, an alkoxy group, an ether group, an ester group, an amino group, an amide group, a sulfonate ester group, a halogen atom, a cyano group, a nitro group, a carbonate group, a carbamate group, a thiol group, a sulfide group, a thioketone group, or a heteroaromatic ring; and $R^{13}$ represents a hydrogen atom, a linear, branched, or cyclic alkyl group having 1 to 8 carbon atoms, or a phenyl group.

In the formula (3-1), when $R^{10}$ is a monovalent hydrocarbon group, $R^{10}$ represents a linear, branched, or cyclic alkyl group having 1 to 30 carbon atoms, a linear, branched, or cyclic alkenyl group having 2 to 30 carbon atoms, a linear, branched, or cyclic alkynyl group having 2 to 30 carbon atoms, or an aryl group having 6 to 30 carbon atoms.

Illustrative examples of a carboxylate ion to form a monovalent copper salt of carboxylic acid shown by the formulae (3-1) or (3-3) include the following. In these carboxylate ions, as the carbon number gets larger, the ions are more easily dissolved into an organic solvent.

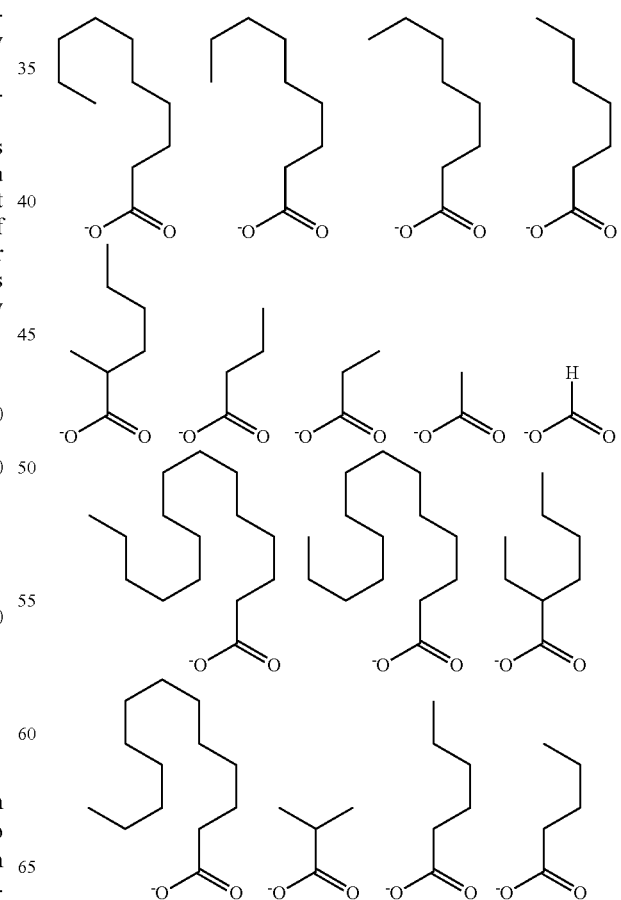

51
-continued
52
-continued
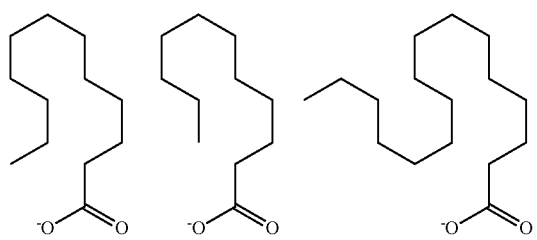
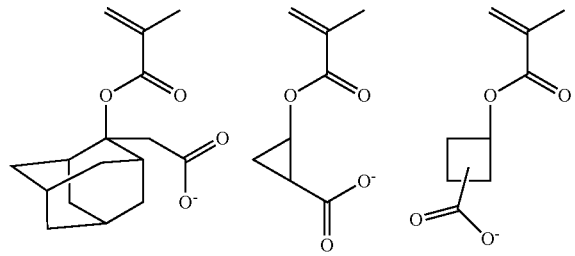
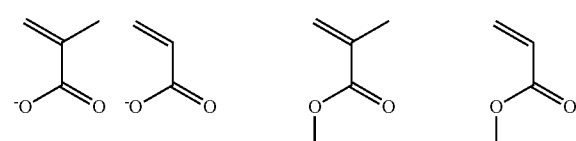
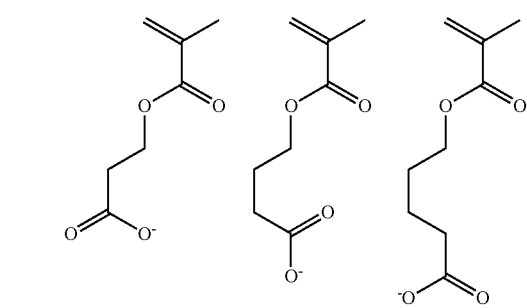
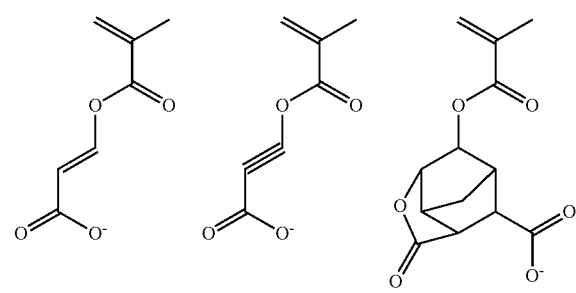
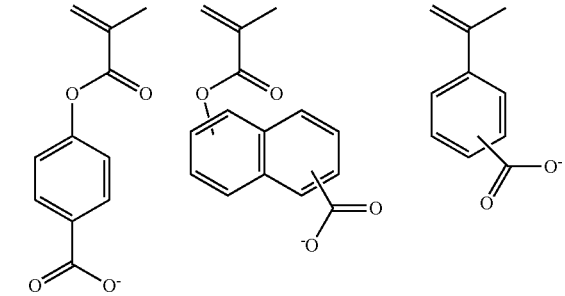
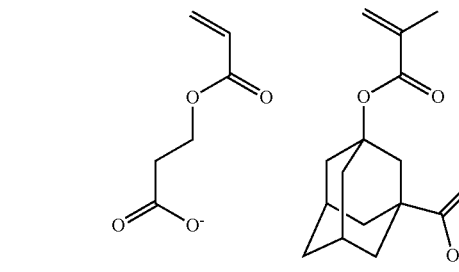
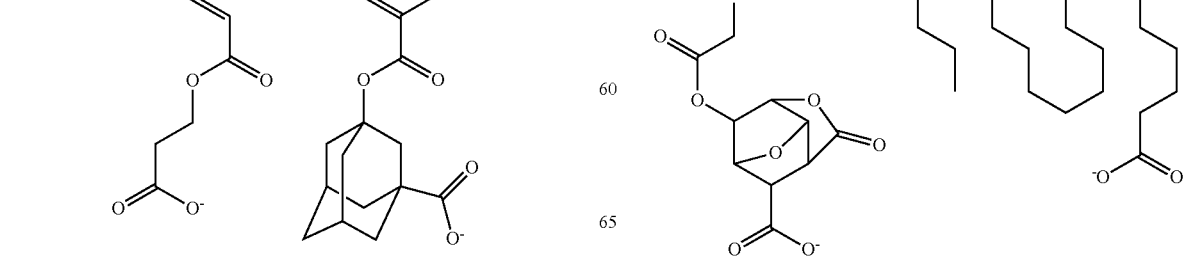

53
-continued
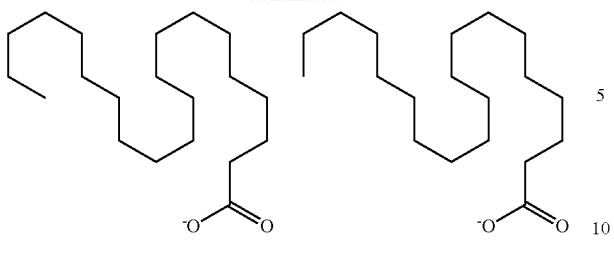
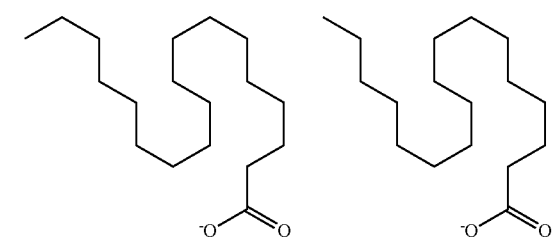
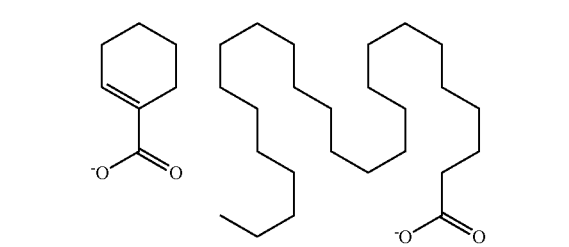
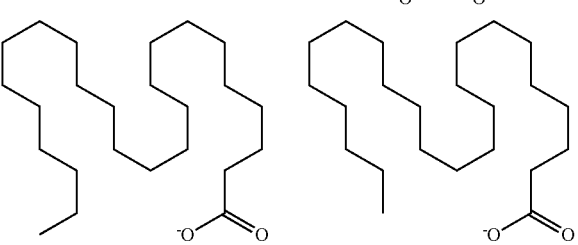
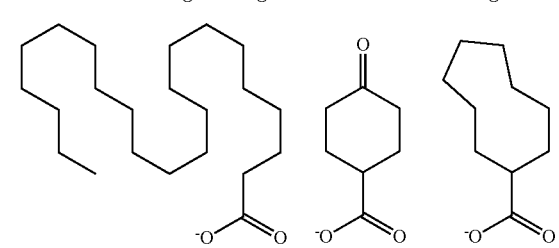
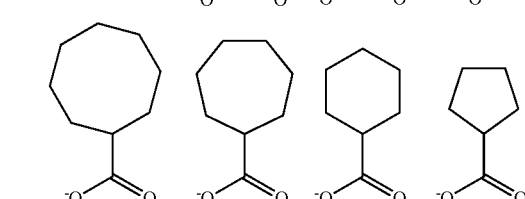
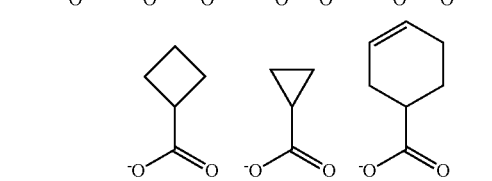
54
-continued
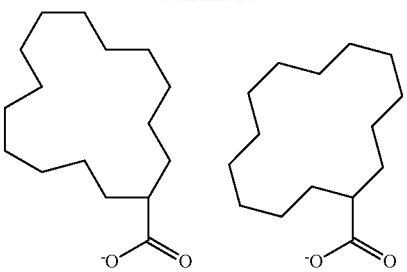
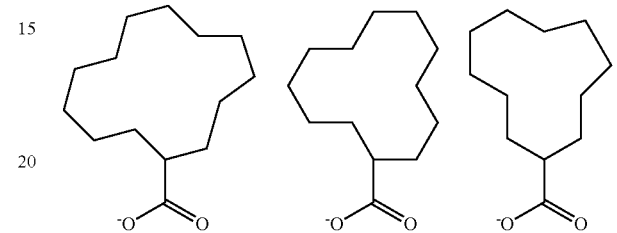
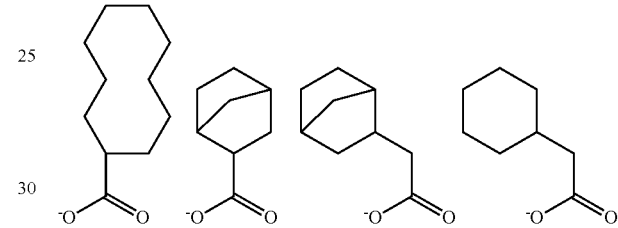
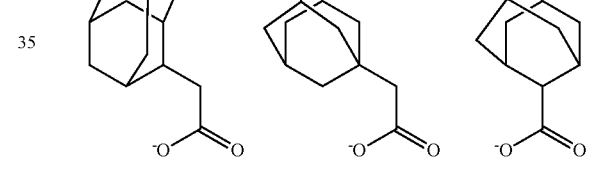
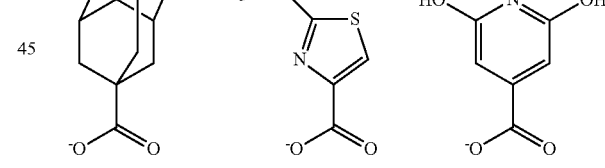
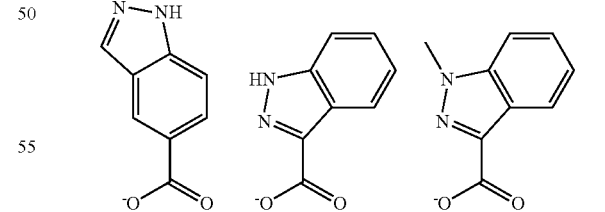
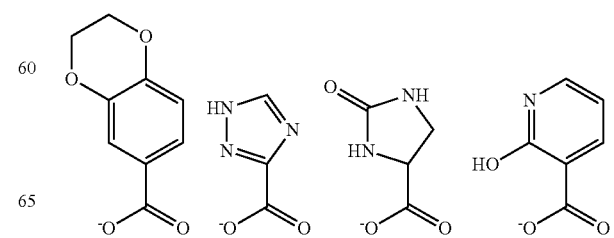

55
-continued
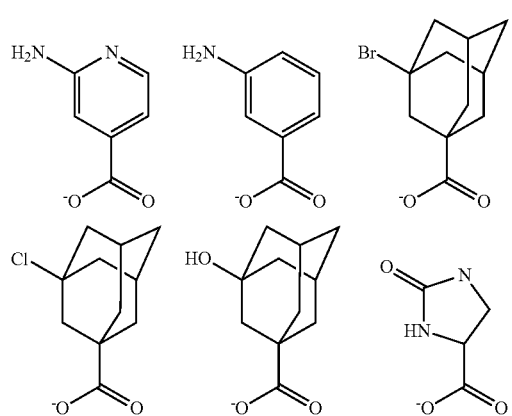
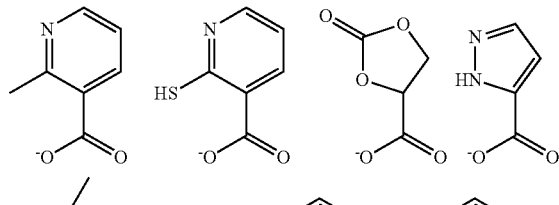
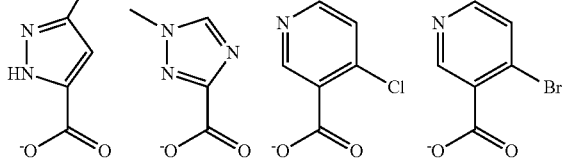
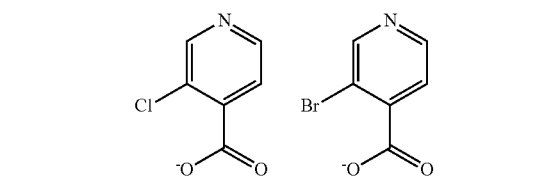
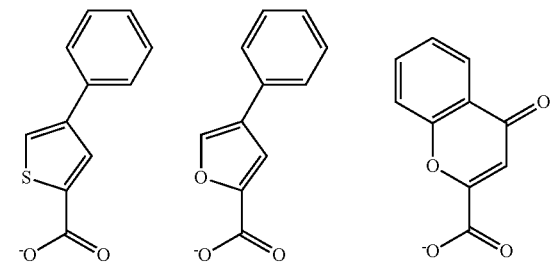
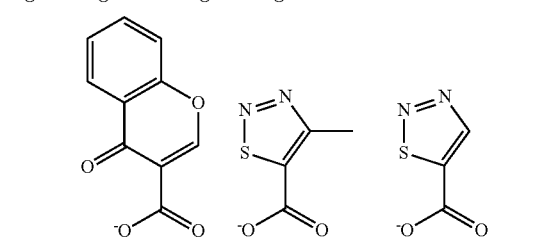
56
-continued
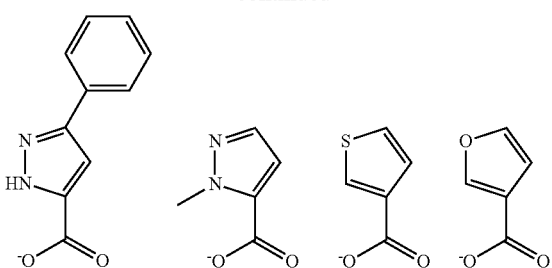
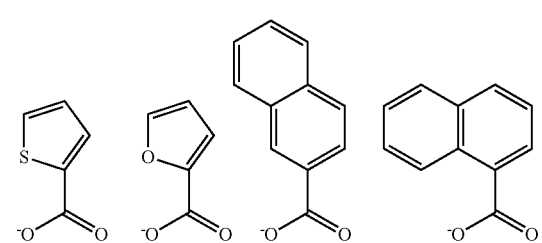
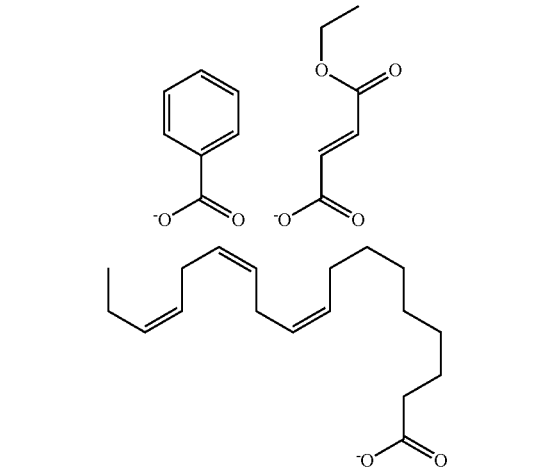
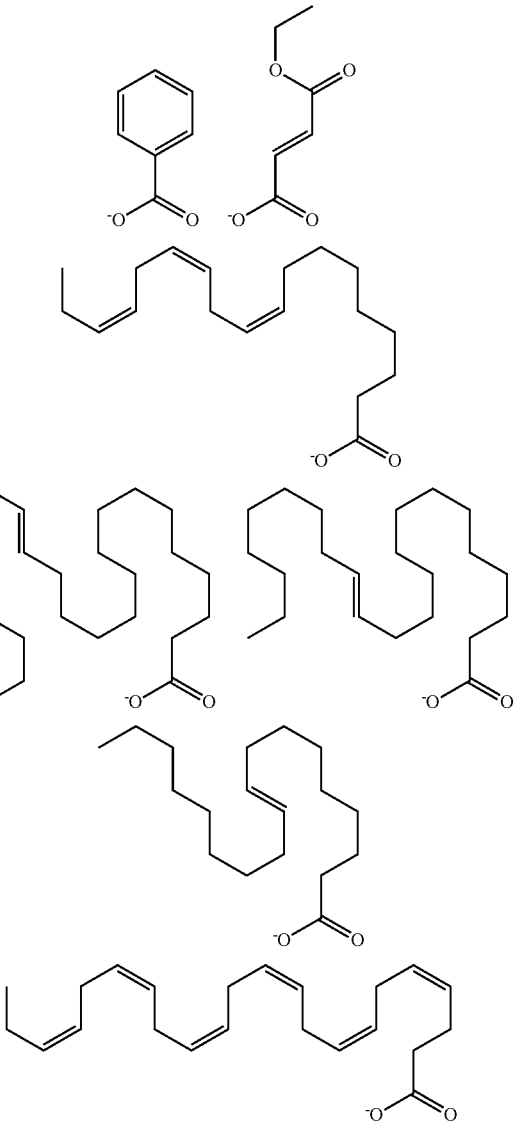

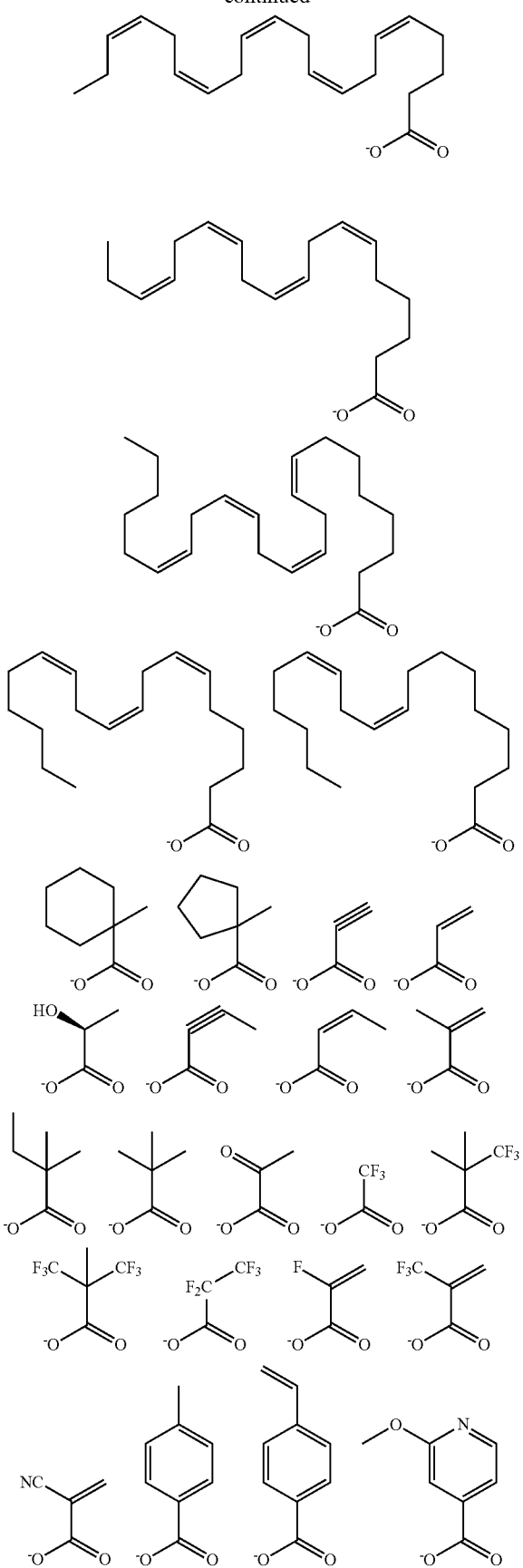
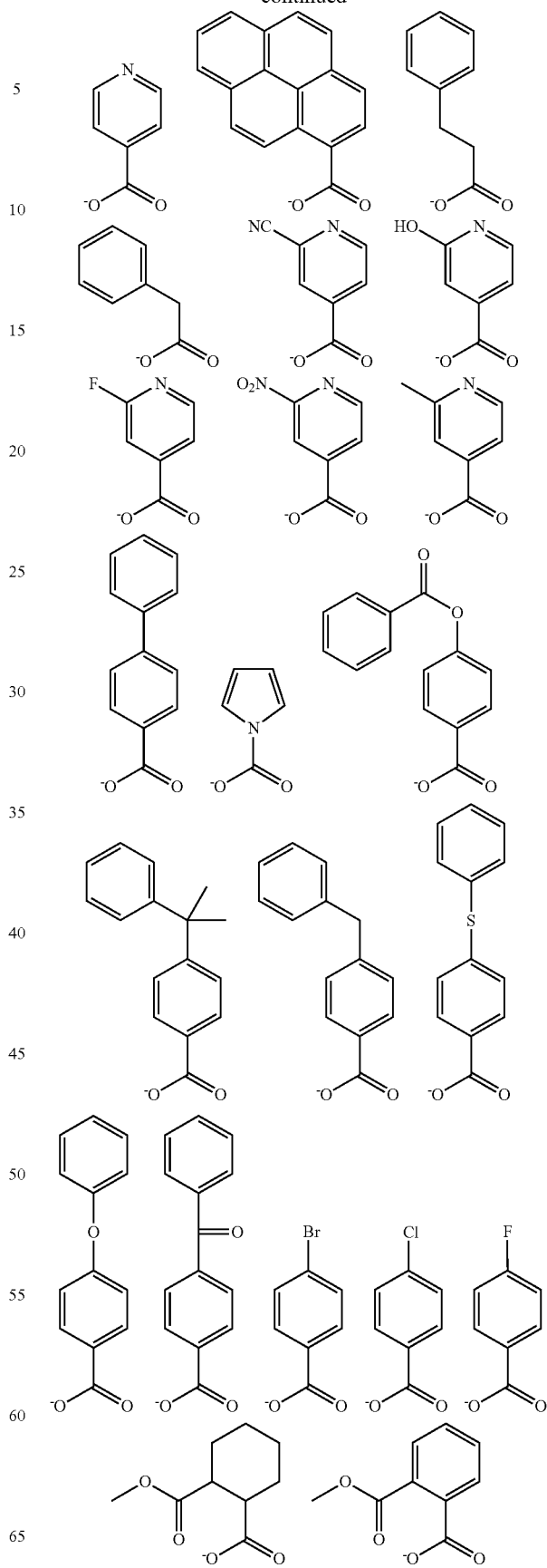

59
-continued
60
-continued
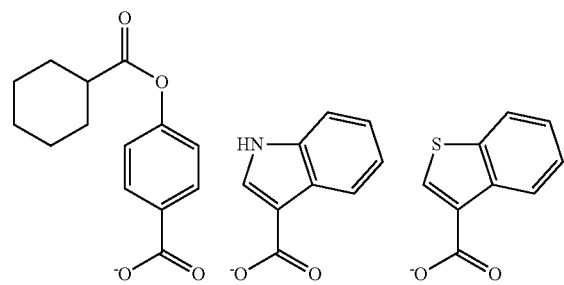
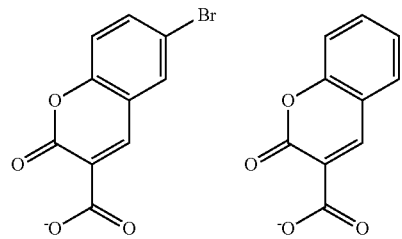

61
-continued
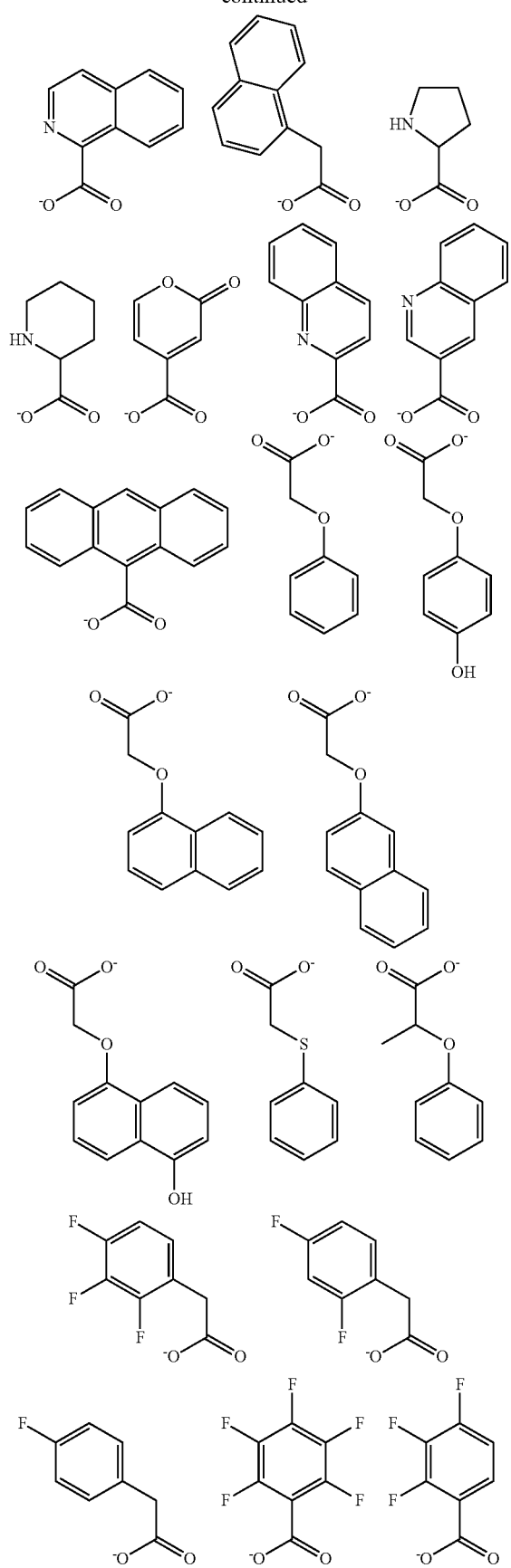
62
-continued
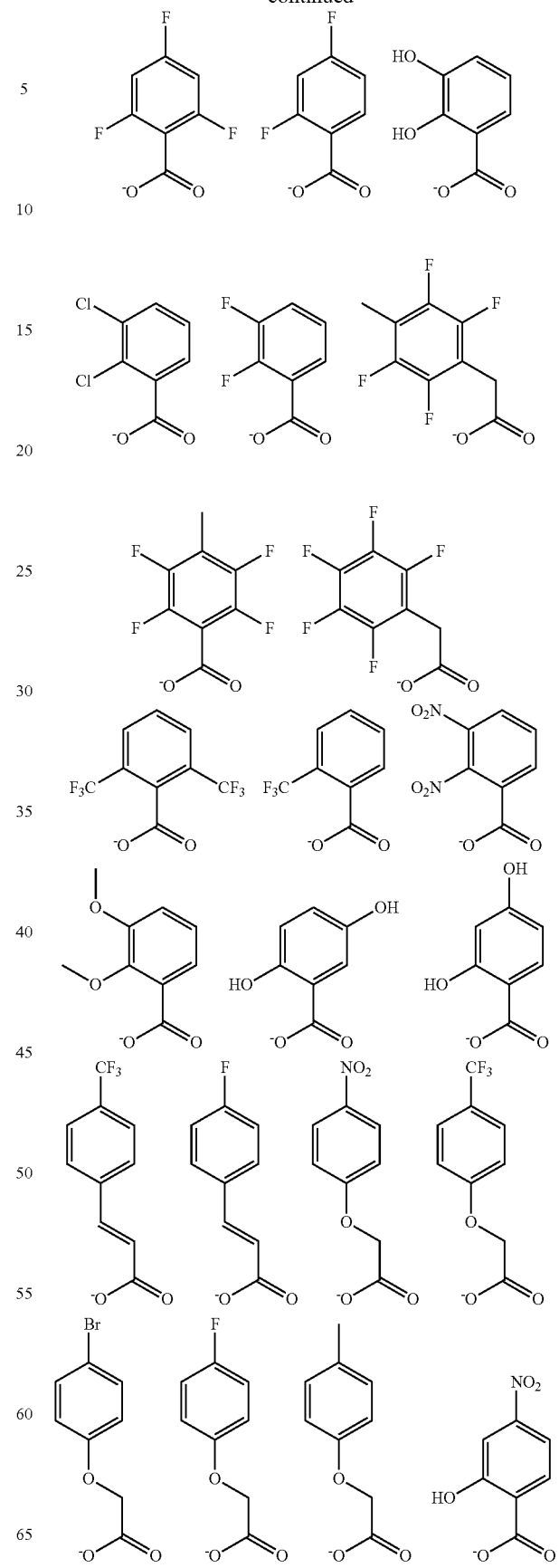

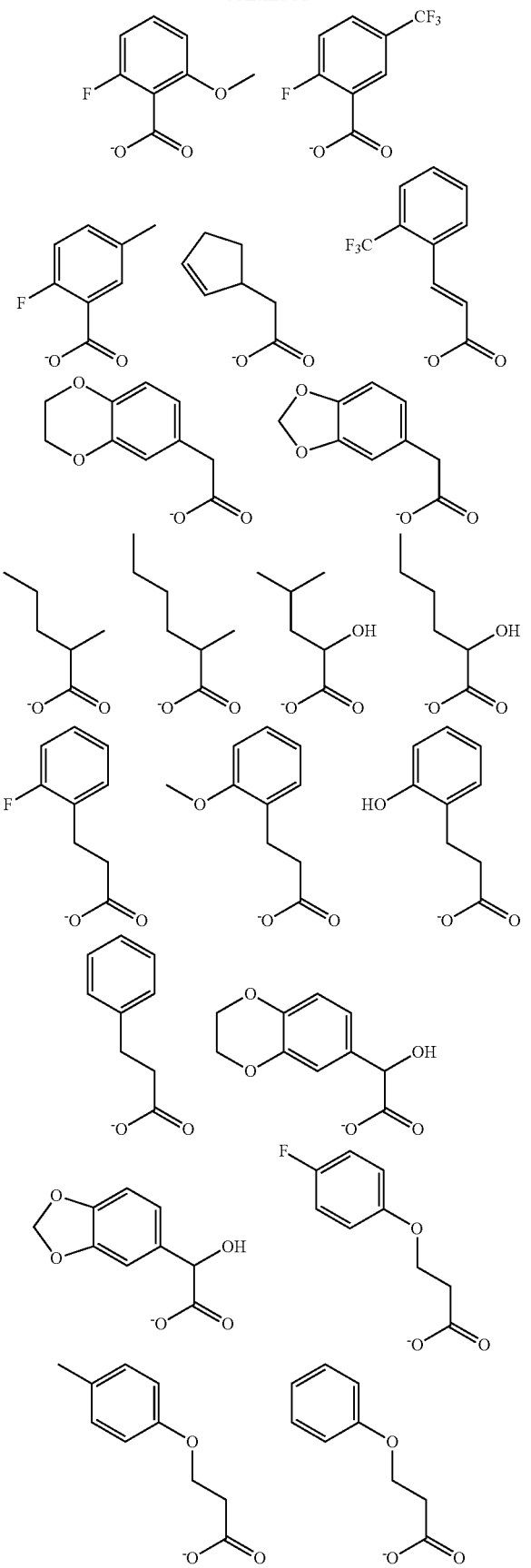
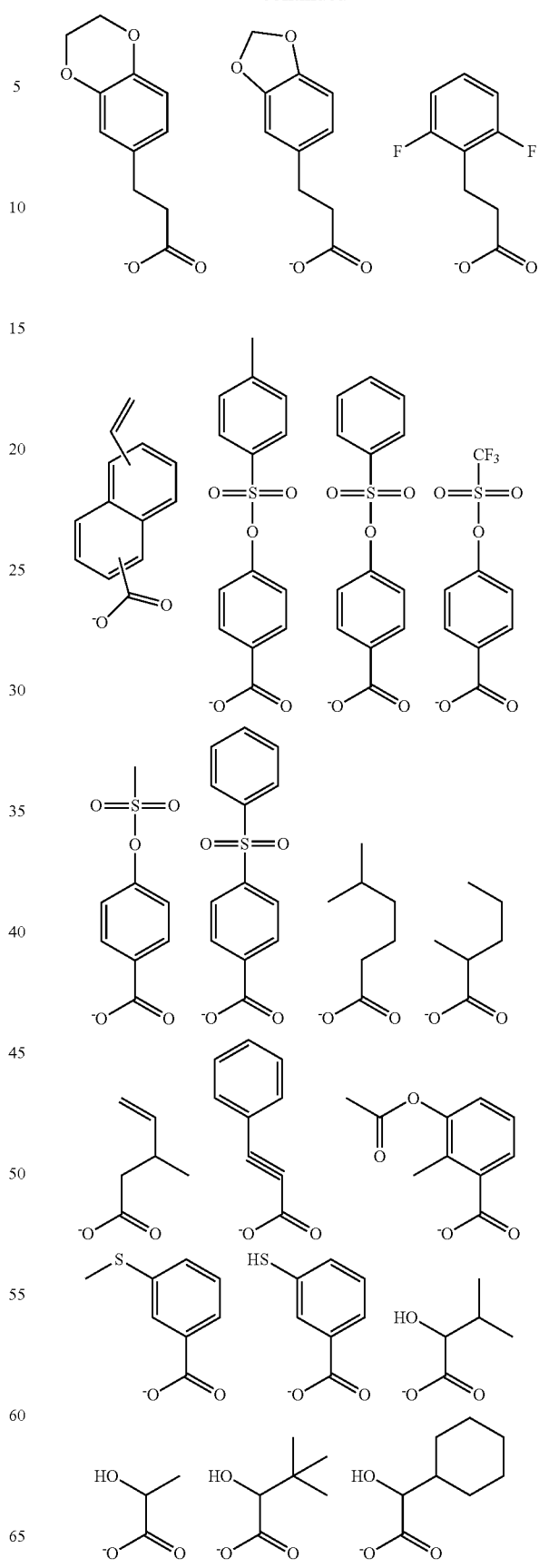

65
-continued
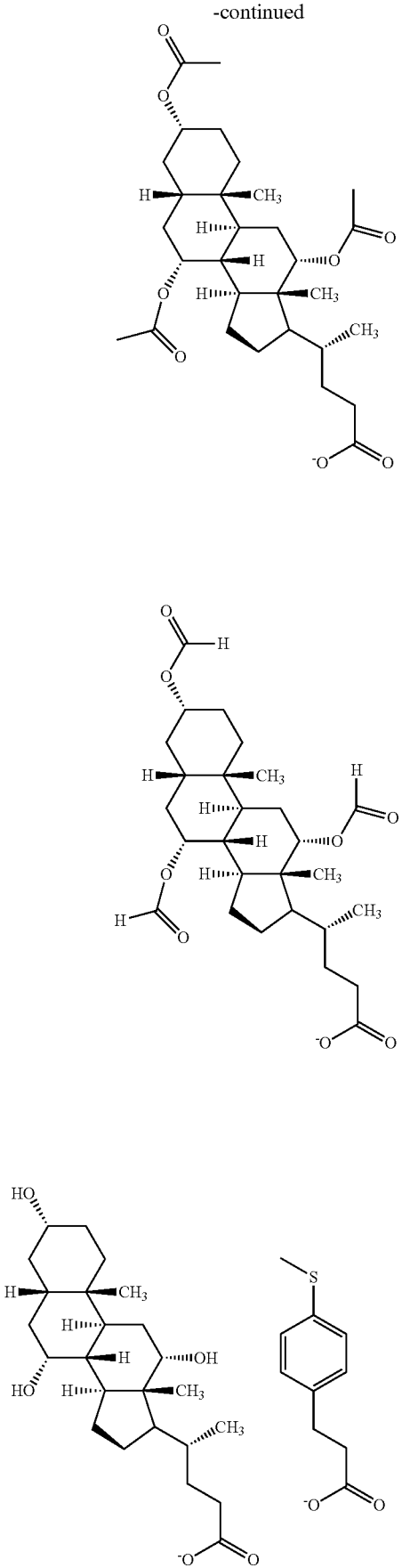
66
-continued
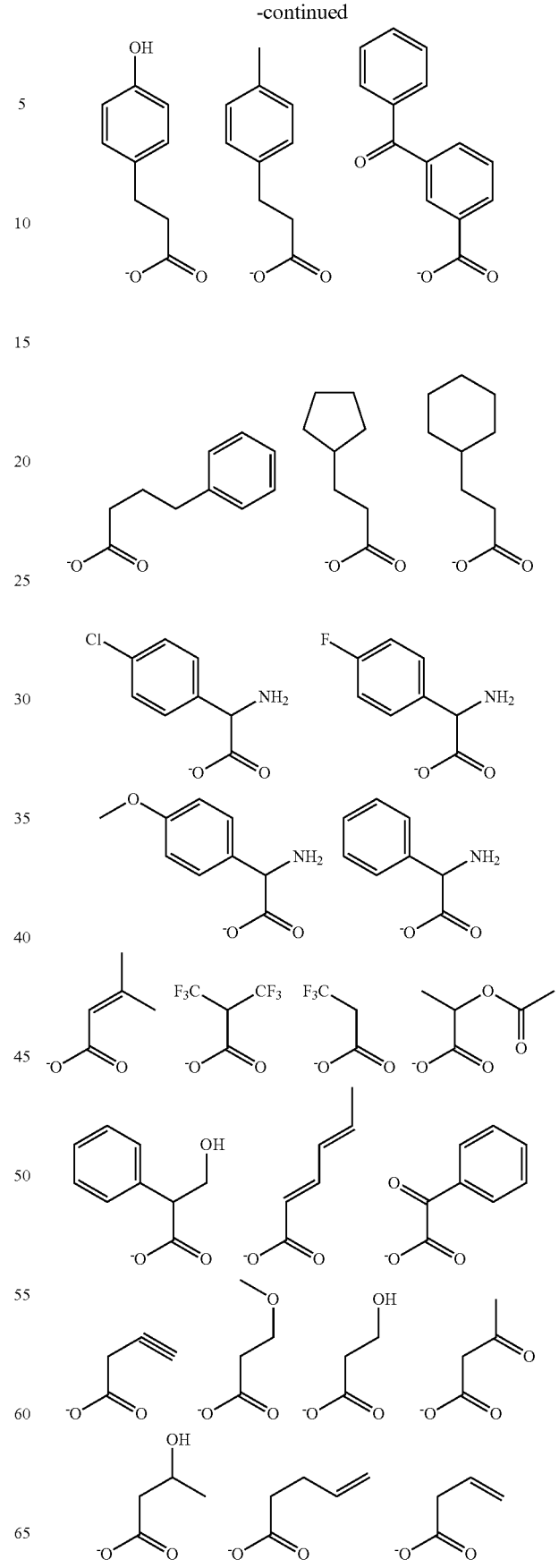

67
-continued
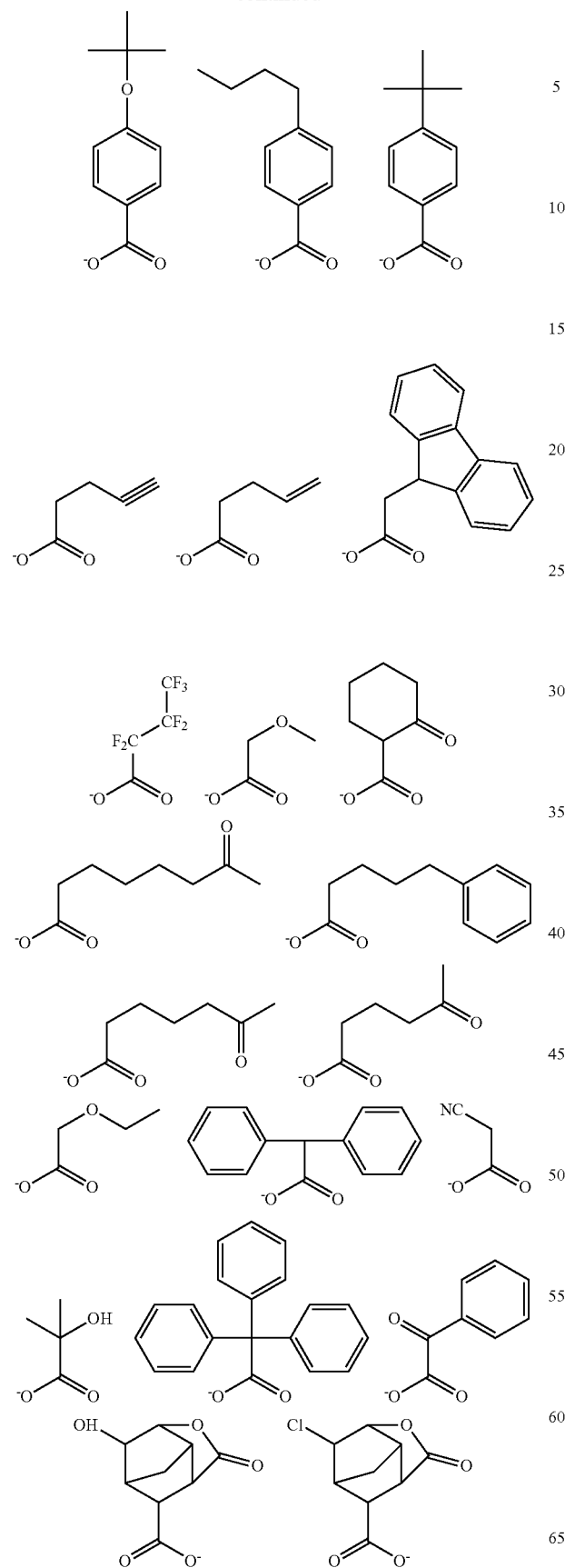
68
-continued
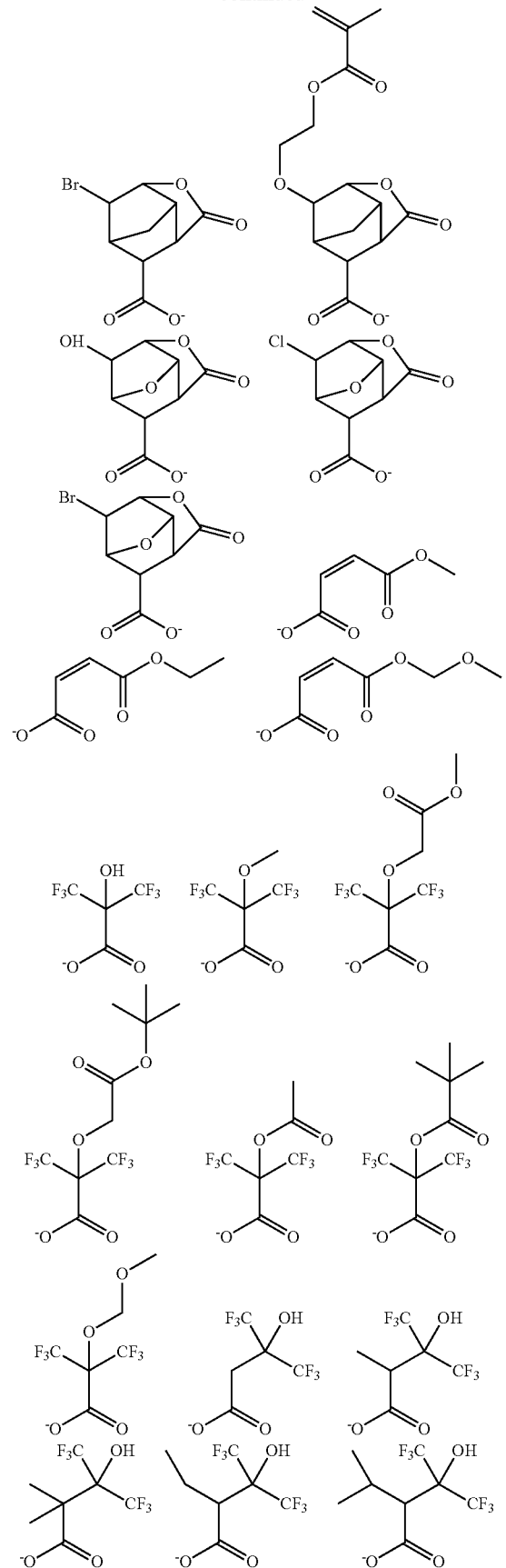

69
-continued
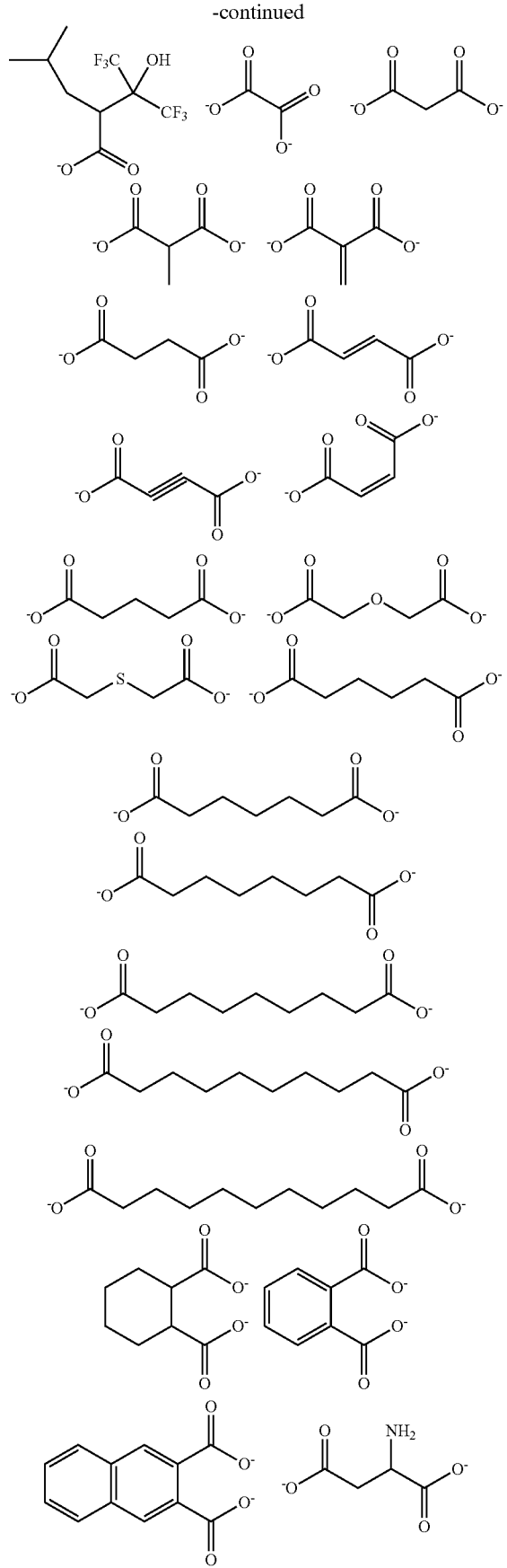
70
-continued
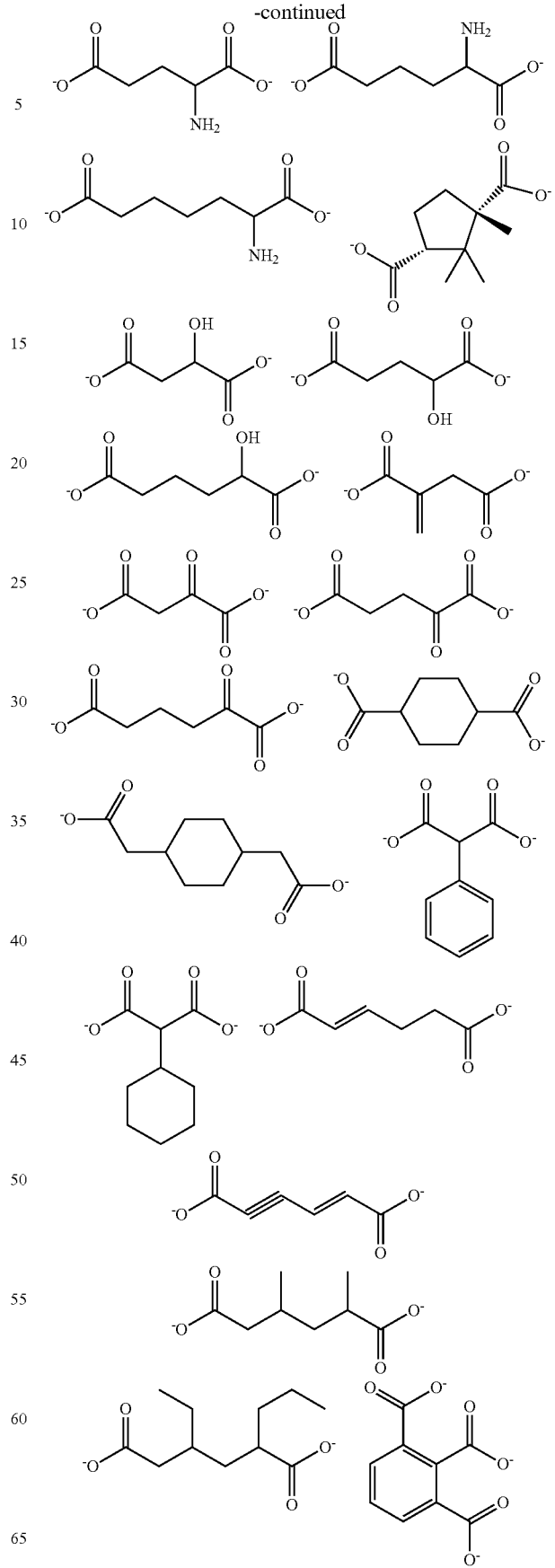

-continued
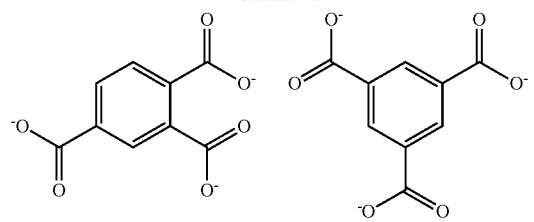
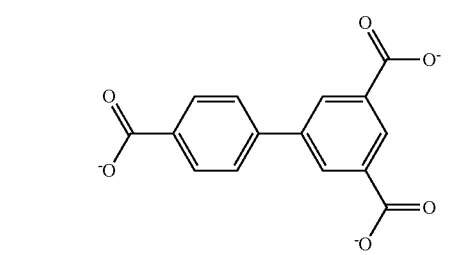
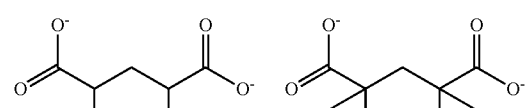
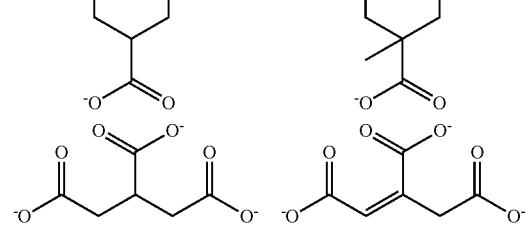
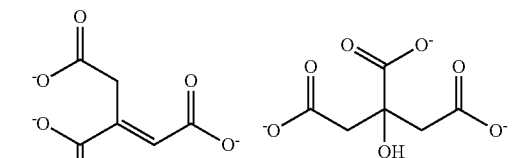
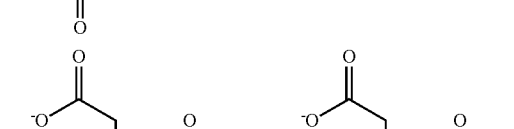
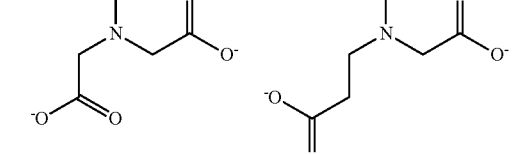
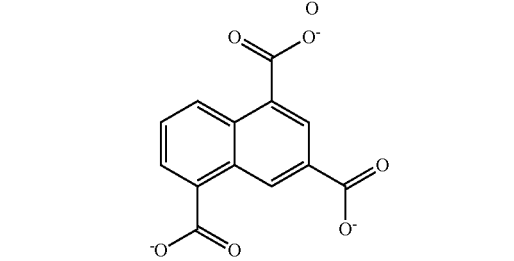
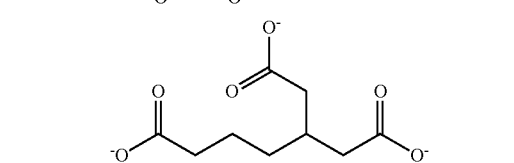
-continued
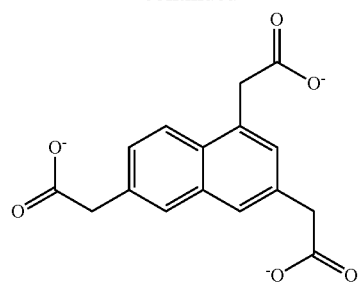
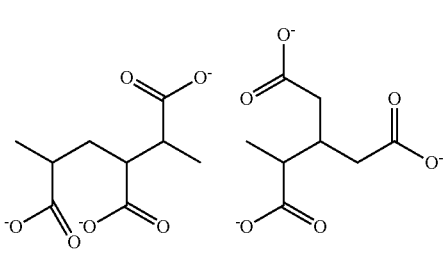
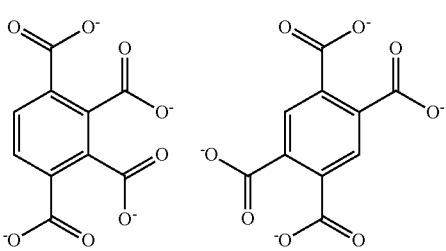
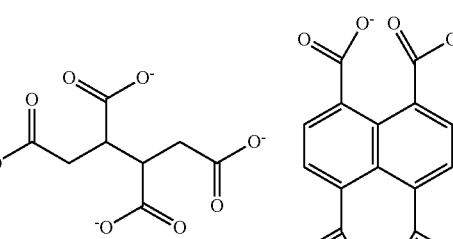
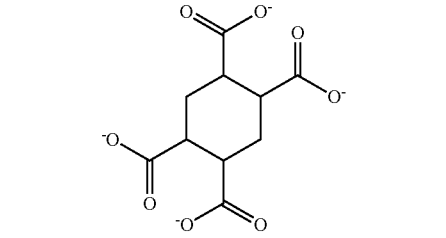
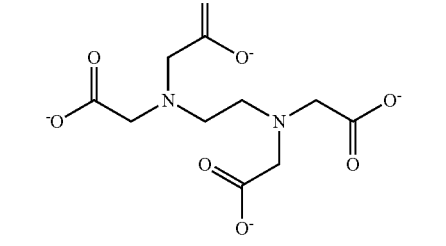

-continued

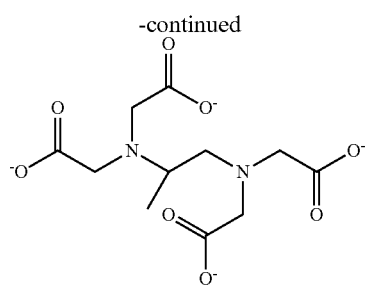
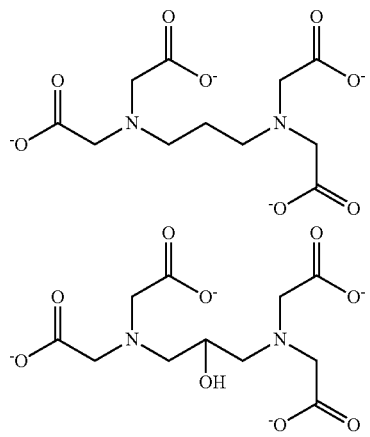
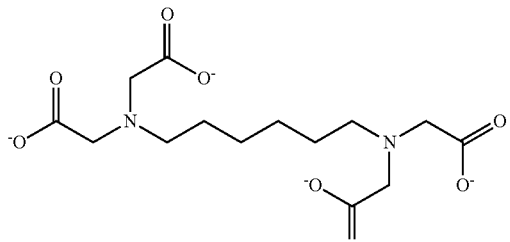
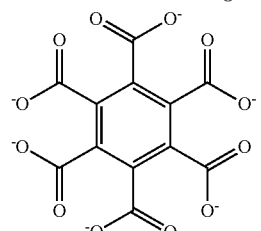
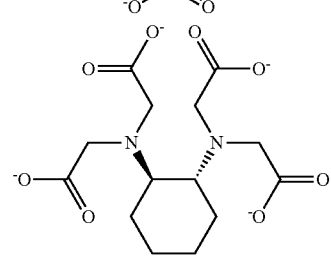
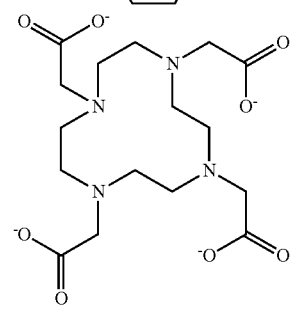

-continued

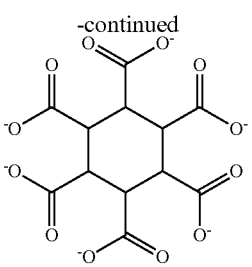

In the foregoing monovalent copper salts of β-diketone and β-ketoester, the β-diketones and β-ketoesters form a complex with copper through enolization. For example, acetylacetone, which is one of the β-diketones, forms a complex with copper through enolization as follows.

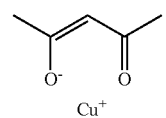

Illustrative examples of β-diketones (i.e. substituted or unsubstituted acetylacetones) and β-ketoesters shown by the formula (3-2) include the following.

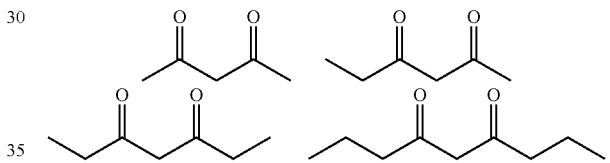
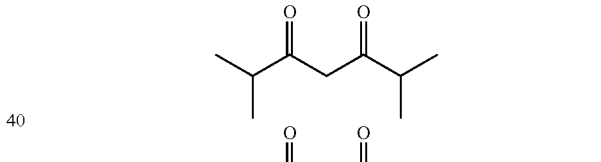
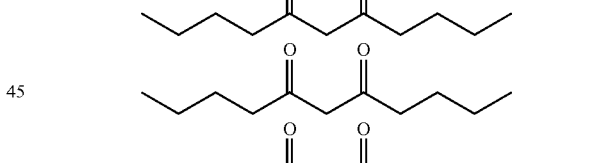
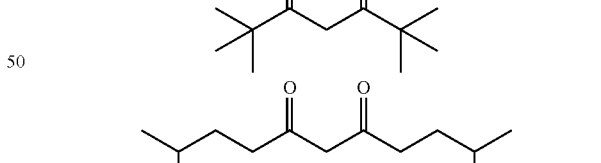
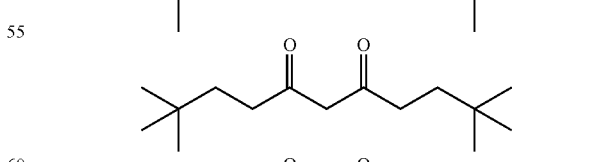
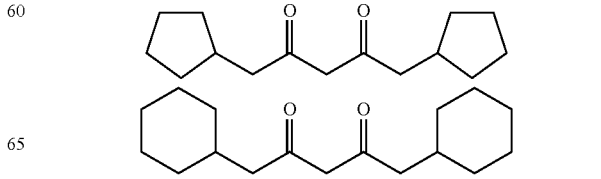
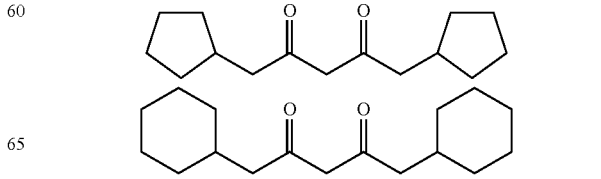

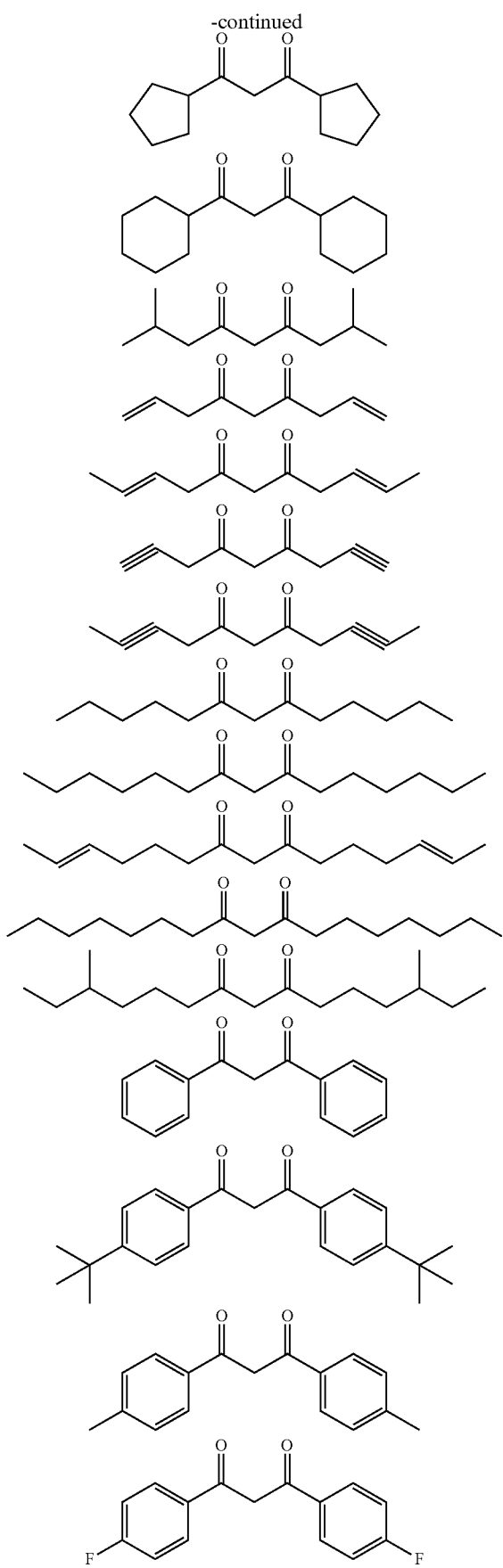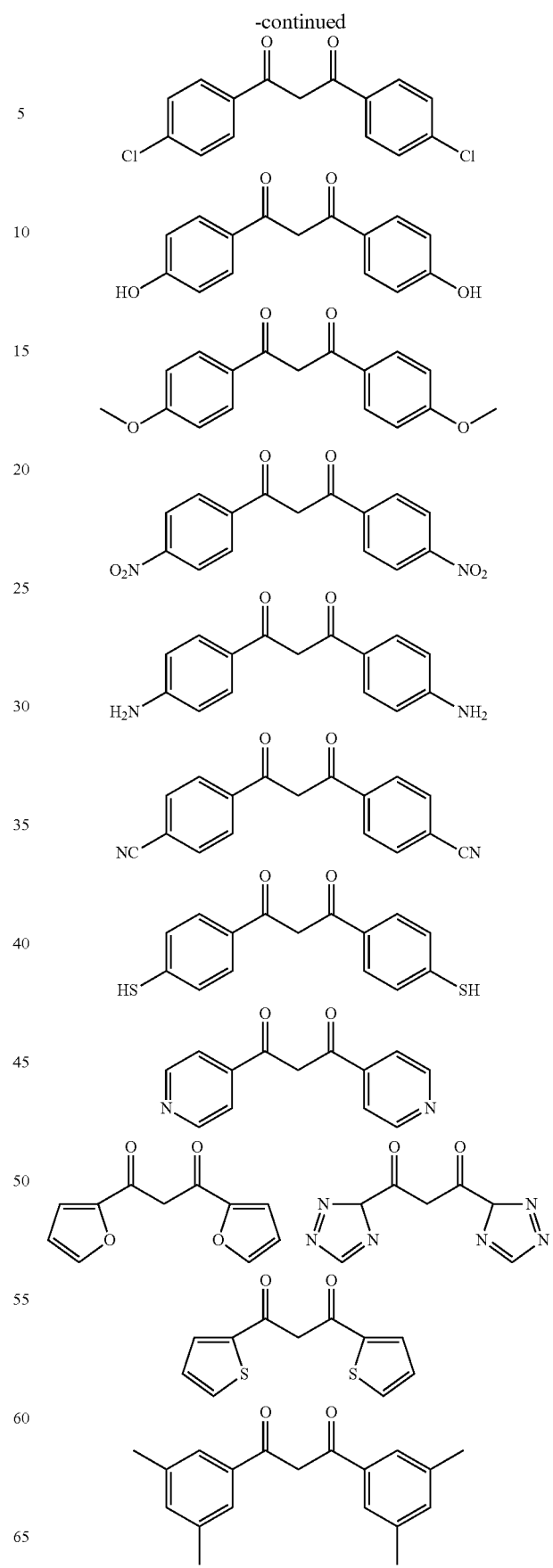

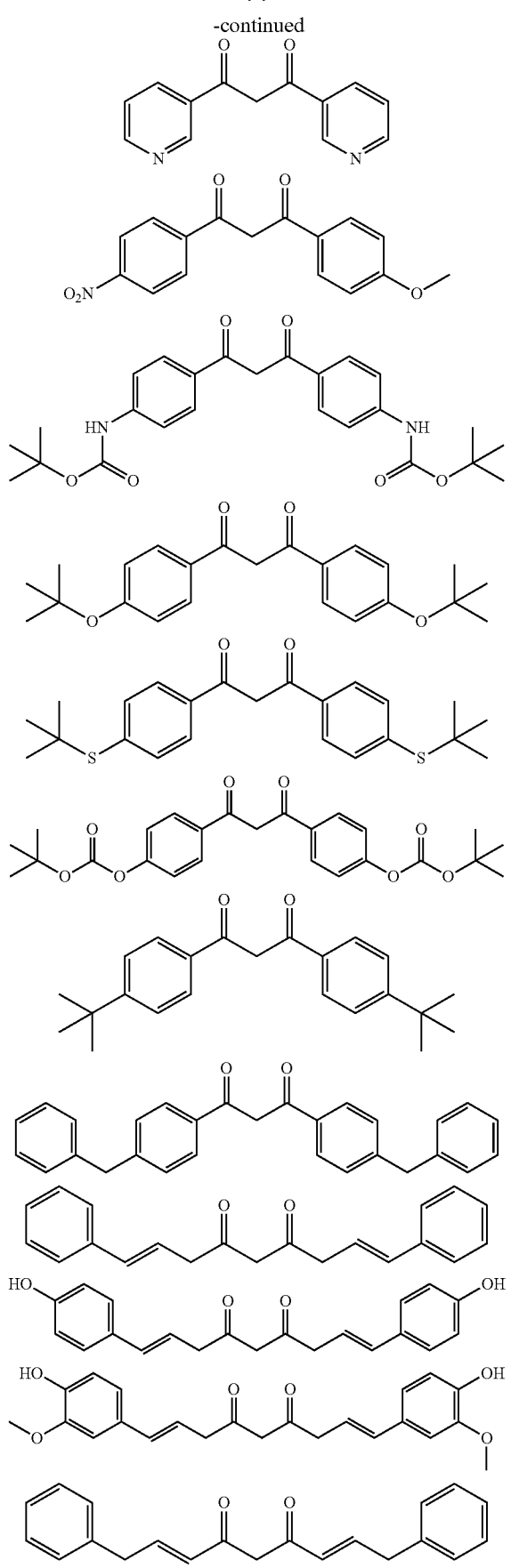
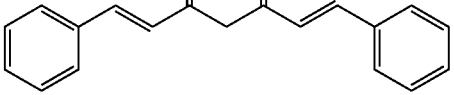
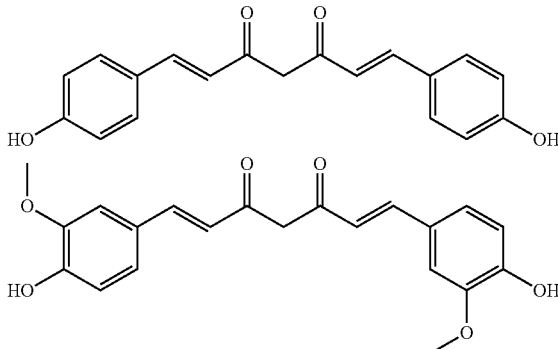
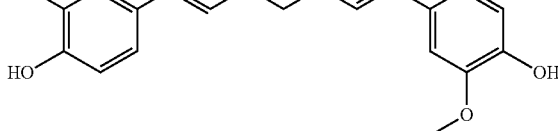
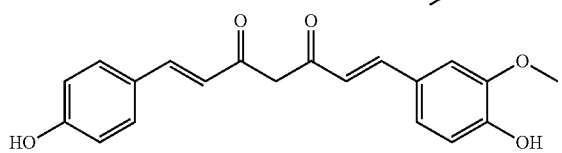
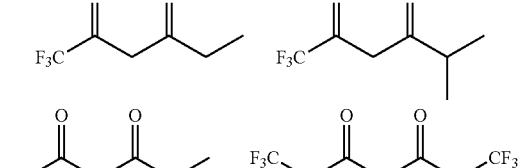
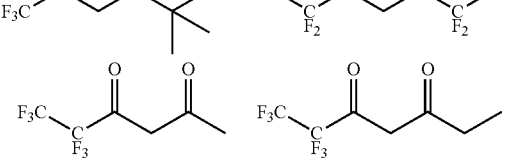
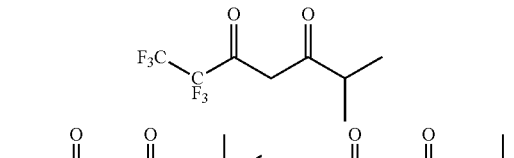
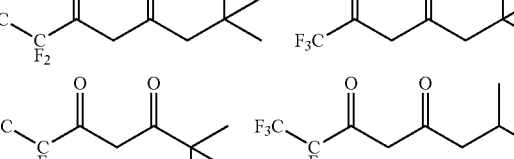
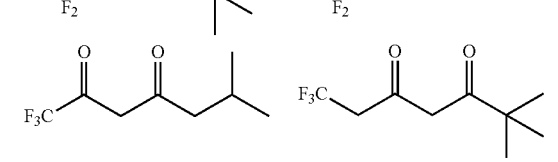
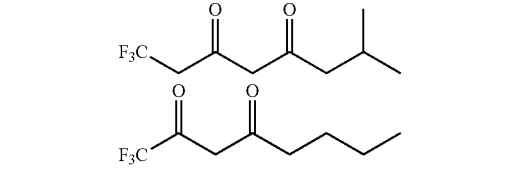

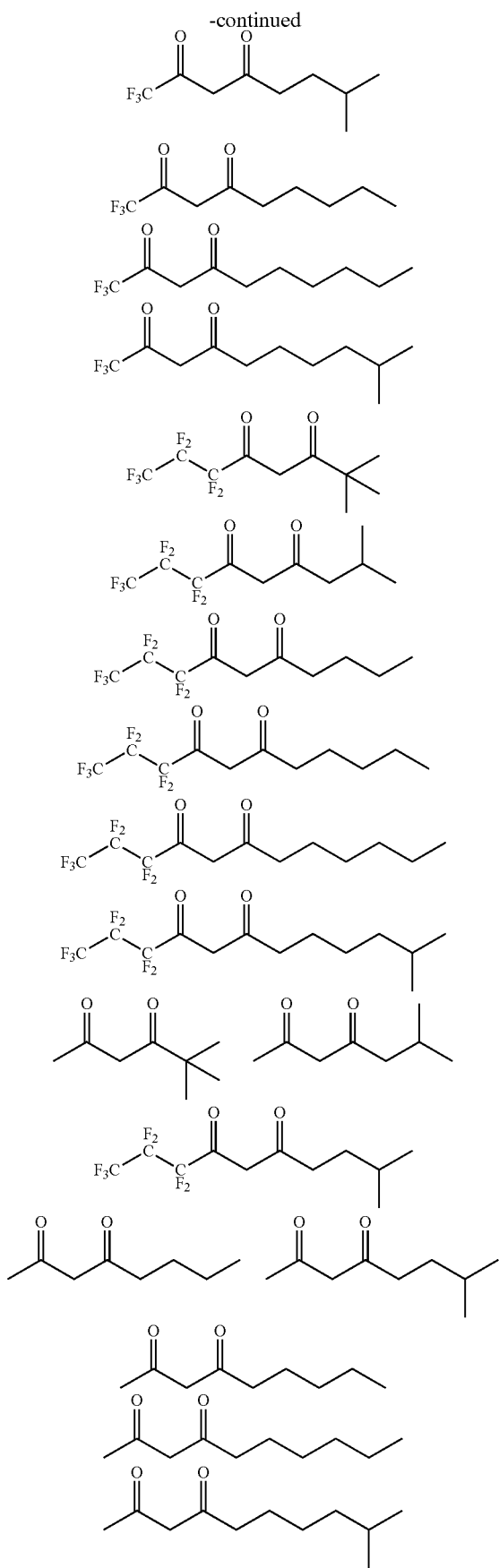
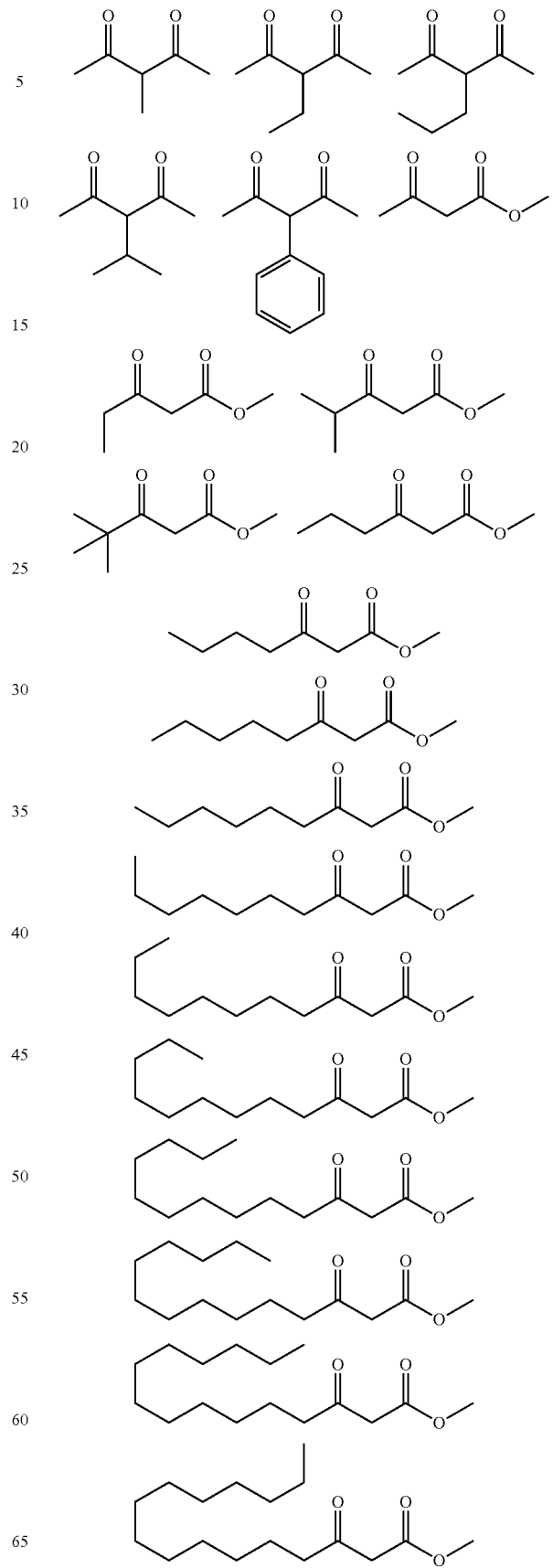

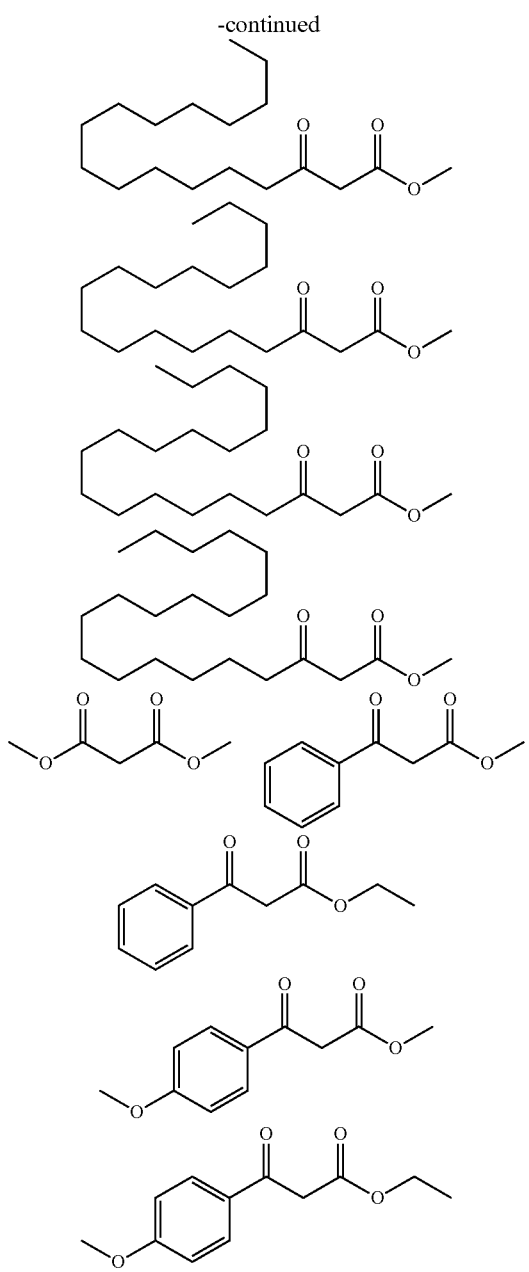

The foregoing monovalent copper salts of carboxylic acid, β-diketone, and β-ketoester can be hydrate.

The content of the component (C) is preferably 0.1 to 200 parts by mass, more preferably 0.5 to 100 parts by mass, further preferably 1 to 50 parts by mass based on 100 parts by mass of the total amount of the component (A) and the component (B).

The composite of polythiophene and polystyrene sulfonic acid (PEDOT-PSS) has a particle shape, and is said to have a form in which the conductive polythiophene is crystallized, and is coated with the polystyrene sulfonic acid surrounding thereof from the results of X-ray diffraction. The polystyrene sulfonic acid forms a polaron in which charge of a double bond of polythiophene is localized, thereby improving the conductivity. The polystyrene sulfonic acid has a function as a dopant for improving the conductivity of polythiophene and a function for improving the dispersibility to water by covering polythiophene, which is insoluble. The polystyrene sulfonic acid is, however, an insulation material. The polythiophene part in the particle is highly conductive, but the conductivity becomes low when the surround is coated with an insulation shell of polystyrene sulfonic acid.

The aqueous dispersion of PEDOT-PSS improves its conductivity by adding small amounts of solvent such as ethylene glycol, diethylene glycol, DMSO. This is explained that the addition of solvent breaks the polystyrene sulfonic acid shells to allow the polythiophene particles to exchange electrons with each other.

When a monovalent copper salt is added as in the present invention, the superacidic component (B) and copper form a salt. This is because positively charged metal is more stable in view of the energy when it forms a salt with superacid, which is more negatively charged. Although the component (B) is an insulation material covering the outsides of thiophene particles, the conductivity is enhanced with the outsides being stuck with highly conductive copper salts to activate mobility of electrons between the particles. In addition, monovalent copper salts have higher conductivity compared to divalent copper salts, and are appropriate to the object of the present invention thereby.

[Other Additives]
(Surfactant)

In the present invention, a surfactant may be added to enhance the wettability to a body to be processed such as a substrate. As the surfactant, various surfactants of nonionic, cationic, and anionic type may be mentioned. Illustrative examples thereof include nonionic surfactants such as polyoxyethylene alkyl ether, polyoxyethylene alkyl phenyl ether, polyoxyethylene carboxylate, sorbitan ester, and polyoxyethylene sorbitan ester; cationic surfactants such as alkyltrimethylammonium chloride and alkylbenzylammonium chloride; anionic surfactants such as alkyl or alkylallyl sulfate salt, alkyl or alkylallyl sulfonate salt, and dialkyl sulfosuccinate salt; amphoteric surfactants such as an amino acid type and a betaine type; acetylene alcohol type surfactants; and an acetylene alcohol type surfactant whose hydroxy group is modified with polyethylene oxide or polypropylene oxide.

(Conductivity Enhancer)

In the present invention, an organic solvent as a conductivity enhancer other than the main solvent may be added to enhance the conductivity of the conductive material. The additive solvent may be exemplified by a polar solvent, and illustrative examples thereof include ethylene glycol, diethylene glycol, triethylene glycol, polyethylene glycol, dimethyl sulfoxide (DMSO), dimethyl formamide (DMF), N-methyl-2-pyrrolidone (NMP), sulfolane, ethylene carbonate, and a mixture thereof. The adding amount is preferably in the range of 1.0 to 30.0% by mass, particularly preferably 3.0 to 10.0% by mass.

(Neutralizer)

In the present invention, an aqueous solution of the conductive material has an acidic pH. For the purpose of neutralizing it, nitrogen-containing aromatic cyclic compound described in paragraphs (0033) to (0045) of Japanese Patent Laid-Open Publication No. 2006-096975 or a cation described in paragraph (0127) of Japanese Patent No. 5264723 may be added to adjust the solution to neutral pH. By adjusting the pH of solution to near neutral, rust occurrence can be prevented when applied to a printer.

[Conductive Material]

The conductive material of the present invention includes the π-conjugated polymer of the component (A), the dopant polymer of the component (B), and the monovalent copper salt of the component (C), as mentioned above, in which the dopant polymer of the component (B) forms the composite by coordinating with the π-conjugated polymer of the component (A).

It is preferable that the conductive material of the present invention have dispersibility in water or in an organic solvent, and such conductive material brings excellent film-formability by spin coating onto an inorganic substrate or an organic substrate (i.e. substrate on which an inorganic film or an organic film has been formed) as well as excellent flatness of the film.

(Method for Producing the Conductive Material)

As a method for producing the conductive material (solution) of the present invention, which is not particularly limited, but for example, that can be produced by an addition of the monovalent copper salt of component (C) to a conductive polymer composite (solution) containing the π-conjugated polymer of component (A) and the dopant polymer of component (B).

The composite of the components (A) and (B) may be obtained, for example, by adding a raw material monomer of the component (A) (preferably pyrrole, thiophene, aniline, or a derivative monomer thereof) into an aqueous solution of the component (B) or a water/organic solvent mixed solution of the component (B), and then adding an oxidant, or an oxidation catalyst if needed, to perform an oxidative polymerization.

Illustrative examples of the oxidant and the oxidation catalyst include peroxodisulfate salts (i.e. persulfate salts) such as ammonium peroxodisulfate (i.e. ammonium persulfate), sodium peroxodisulfate (i.e. sodium persulfate), and potassium peroxodisulfate (i.e. potassium persulfate); transition metal compounds such as ferric chloride, ferric sulfate, and cupric chloride; metal oxides such as silver oxide and cesium oxide; peroxides such as hydrogen peroxide and ozone; organic peroxides such as benzoyl peroxide; and oxygen.

As the reaction solvent to be used for the oxidative polymerization, water or a mixture of water and a solvent may be used. As the solvent to be used here is preferably miscible with water and can dissolve or disperse the component (A) and the component (B). Illustrative examples thereof include polar solvents such as N-methyl-2-pyrrolidone, N,N'-dimethyl formamide, N,N'-dimethyl acetamide, dimethyl sulfoxide, and hexamethyl phosphortriamide; alcohols such as methanol, ethanol, propanol, and butanol; polyvalent aliphatic alcohols such as ethylene glycol, propylene glycol, dipropylene glycol, 1,3-butylene glycol, 1,4-butylene glycol, D-glucose, D-glucitol, isoprene glycol, butanediol, 1,5-pentanediol, 1,6-hexanediol, 1,9-nonanediol, and neopentyl glycol; carbonate compounds such as ethylene carbonate and propylene carbonate; cyclic ether compounds such as dioxane and tetrahydrofuran; chain ethers such as dialkyl ether, ethylene glycol monoalkyl ether, ethylene glycol dialkyl ether, propylene glycol monoalkyl ether, propylene glycol dialkyl ether, polyethylene glycol dialkyl ether, and polypropylene glycol dialkyl ether; heterocyclic compounds such as 3-methyl-2-oxazolidinone; and nitrile compounds such as acetonitrile, glutaronitrile, methoxyacetonitrile, propionitrile, and benzonitrile. These solvents may be used singly or as a mixture of two or more of them. The blending amount of these water-miscible solvents is preferably 50% by mass or less with respect to entirety of the reaction solvents.

Besides the dopant polymer of the component (B), another anion capable of being doped into the π-conjugated polymer of the component (A) may be used. As to the anion like this, an organic acid is preferable in view of controlling the characteristic of de-doping from the π-conjugated polymer, and also in view of dispersibility, heat resistance, environment resistance, and so force of the conductive material. As the organic acid, there may be mentioned an organic carboxylic acid, phenols, an organic sulfonic acid, etc.

As to the organic carboxylic acid, acids of aliphatic, aromatic, or alicyclic compound having one, or two or more carboxy groups may be used. Illustrative examples thereof include formic acid, acetic acid, oxalic acid, benzoic acid, phthalic acid, maleic acid, fumaric acid, malonic acid, tartaric acid, citric acid, lactic acid, succinic acid, monochloroacetic acid, dichloroacetic acid, trichloroacetic acid, trifluoro-acetic acid, nitroacetic acid, and triphenylacetic acid.

Illustrative examples of the phenols include cresol, phenol, and xylenol.

As to the organic sulfonic acid, acids of aliphatic, aromatic, or alicyclic compound having one, or two or more sulfo groups may be used. Illustrative examples of the compound having one sulfo group include methanesulfonic acid, ethanesulfonic acid, 1-propanesulfonic acid, 1-butanesulfonic acid, 1-hexanesulfonic acid, 1-heptanesulfonic acid, 1-octanesulfonic acid, 1-nonanesulfonic acid, 1-decanesulfonic acid, 1-dodecanesulfonic acid, 1-tetradecanesulfonic acid, 1-pentadecanesulfonic acid, 2-bromoethanesulfonic acid, 3-chloro-2-hydroxypropanesulfonic acid, trifluoromethanesulfonic acid, colistinmethanesulfonic acid, 2-acrylamide-2-methylpropanesulfonic acid, aminomethanesulfonic acid, 1-amino-2-naphthol-4-sulfonic acid, 2-amino-5-naphthol-7-sulfonic acid, 3-aminopropanesulfonic acid, N-cyclohexyl-3-aminopropanesulfonic acid, benzenesulfonic acid, p-toluenesulfonic acid, xylenesulfonic acid, ethylbenzenesulfonic acid, propylbenzenesulfonic acid, butylbenzenesulfonic acid, pentylbenzenesulfonic acid, hexylbenzenesulfonic acid, heptylbenzenesulfonic acid, octylbenzenesulfonic acid, nonylbenzenesulfonic acid, decylbenzenesulfonic acid, undecylbenzenesulfonic acid, dodecylbenzenesulfonic acid, pentadecylbenzenesulfonic acid, hexadecylbenzenesulfonic acid, 2,4-dimethylbenzenesulfonic acid, dipropylbenzenesulfonic acid, 4-aminobenzenesulfonic acid, o-aminobenzenesulfonic acid, m-aminobenzenesulfonic acid, 4-amino-2-chlorotoluene-5-sulfonic acid, 4-amino-3-methylbenzene-1-sulfonic acid, 4-amino-5-methoxy-2-methylbenzenesulfonic acid, 2-amino-5-methylbenzene-1-sulfonic acid, 4-amino-2-methylbenzene-1-sulfonic acid, 5-amino-2-methylbenzene-1-sulfonic acid, 4-acetamide-3-chlorobenzenesulfonic acid, 4-chloro-3-nitrobenzenesulfonic acid, p-chlorobenzenesulfonic acid, naphthalenesulfonic acid, methylnaphthalenesulfonic acid, propylnaphthalenesulfonic acid, butylnaphthalenesulfonic acid, pentylnaphthalenesulfonic acid, dimethylnaphthalenesulfonic acid, 4-amino-1-naphthalenesulfonic acid, 8-chloronaphthalene-1-sulfonic acid, polycondensation product of naphthalenesulfonic acid and formalin, and polycondensation product of melaminesulfonic acid and formalin.

Illustrative examples of the compound containing two or more sulfo groups include ethane disulfonic acid, butane disulfonic acid, pentane disulfonic acid, decane disulfonic acid, m-benzene disulfonic acid, o-benzene disulfonic acid, p-benzene disulfonic acid, toluene disulfonic acid, xylene disulfonic acid, chlorobenzene disulfonic acid, fluorobenzene disulfonic acid, aniline-2,4-disulfonic acid, aniline-2,5-disulfonic acid, diethylbenzene disulfonic acid, dibutylbenzene disulfonic acid, naphthalene disulfonic acid, methylnaphthalene disulfonic acid, ethylnaphthalene disulfonic acid, dodecylnaphthalene disulfonic acid, pentadecylnaphthalene disulfonic acid, butylnaphthalene disulfonic acid, 2-amino-1,4-benzene disulfonic acid, 1-amino-3,8-naphthalene disulfonic acid, 3-amino-1,5-naphthalene disulfonic acid, 8-amino-1-naphthol-3,6-disulfonic acid, anthracene disulfonic acid, butylanthracene disulfonic acid, 4-acetamide-4'-isothiocyanatostilbene-2,2'-disulfonic acid, 4-acetamide-4'-maleimidylstilbene-2,2'-disulfonic acid, 1-acetoxypyrene-3,6,8-trisulfonic acid, 7-amino-1,3,6- naphthalene trisulfonic acid, 8-aminonaphthalene-1,3,6-trisulfonic acid, and 3-amino-1,5,7-naphthalene trisulfonic acid.

These anions other than the component (B) may be added, before polymerization of the component (A), into a solution containing a raw material monomer of the component (A), the component (B), and an oxidant and/or an oxidative polymerization catalyst. Alternatively, it may be added into the conductive polymer composite (solution) which contains the component (A) after the polymerization and the component (B).

The composite including the component (A) and the component (B) thus obtained may be used after being pulverized by a homogenizer, a ball mill, or the like, if necessary.

For pulverization, a mixer/disperser which can apply a high shear force is preferably used. Illustrative examples of the mixer/disperser include a homogenizer, a high-pressure homogenizer, and a bead mill; among them, a high-pressure homogenizer is particularly preferable.

Illustrative examples of the high-pressure homogenizer include NanoVater (manufactured by Yoshida Kikai Co., Ltd.), Microfluidizer (manufactured by Powrex Corp.), and Ultimizer (manufactured by Sugino Machine Ltd.).

As the dispersion treatment using the high-pressure homogenizer, there may be mentioned a treatment in which the composite solutions before the dispersion treatment are collided from the opposite direction with each other under high pressure, or a treatment in which the solution is passed through an orifice or a slit under high pressure.

Before or after the pulverization, impurities may be removed by the measures such as filtration, ultrafiltration, and dialysis; and also, purification may be done by using a cationic ion-exchange resin, an anionic ion-exchange resin, a chelate resin, or the like.

The total content of the component (A) and the component (B) in the conductive material solution is preferably in the range of 0.05 to 5.0% by mass. If the total content of the component (A) and the component (B) is 0.05% by mass or more, sufficient conductivity can be obtained; and if it is 5.0% by mass or less, the uniform conductive coating film can be readily obtained.

The content of the component (B) is preferably such an amount that the sulfo group in the component (B) is in the range of 0.1 to 10 mole, more preferably 1 to 7 mol, per 1 mol of the component (A). If the content of the sulfo group in the component (B) is 0.1 mole or more, the doping effect to the component (A) is so high that sufficient conductivity can be secured. On the other hand, if the content of the sulfo group in the component (B) is 10 mole or less, the content of the component (A) also becomes appropriate, so that sufficient conductivity can be obtained.

Thus, the conductive material of the present invention as described above has excellent filterability and film-formability by spin coating, and can form a conductive film having high transparency and low surface roughness.

[Conductive Film]

The conductive material (solution) thus obtained can form a conductive film by applying it onto a body to be processed such as a substrate. Illustrative examples of the method of applying the conductive material (solution) include coating by a spin coater, a bar coater, soaking, comma coating, spray coating, roll coating, screen printing, flexographic printing, gravure printing, and ink jet printing. After applying, heat treatment by using a hot-air circulating furnace, a hot plate, or the like, or irradiation with IR light, UV light, or the like may be carried out, whereby the conductive film can be formed.

As explained above, the conductive material of the present invention can form a conductive film by applying it onto a substrate or the like. In addition, the conductive film thus formed can be used as a transparent electrode layer because it has excellent conductivity and transparency. Furthermore, the inventive conductive material functions as a hole injection layer. The inventive conductive material can be applied onto a transparent conductive layer of ITO, silver nanowire, silver wiring, etc. to form a hole injection layer, on which a hole transport layer, a light-emitting layer, an electron injection layer, and a cathode are formed. When this is applied as a hole injection layer, high conductivity is not necessarily required.

ITO prepared by sputtering and so on has been used as a transparent electrode, however, it is a crystalline film, thereby lowering the conductivity and being broken in bending thereof since the crystal collapses. Accordingly, it is difficult to apply ITO for a flexible device. On the other hand, the conductive film based on the inventive conductive material does not cause breaking or lowering of conductivity in bending, and can be used as a conductive film for a flexible device thereby.

[Substrate]

Also, the present invention provides a substrate having a conductive film formed thereon, wherein the conductive film is formed from the aforementioned conductive material of the present invention.

Illustrative examples of the substrate include a glass substrate, a quartz substrate, a photomask blank substrate, a resin substrate, a silicon wafer, compound semiconductor wafers such as a gallium arsenic wafer and an indium phosphorous wafer, and a flexible substrate. In addition, it may also be used as an anti-static top coat by applying it onto a photoresist film.

As mentioned above, the inventive conductive material, which contains a monovalent copper salt of the component (C) as well as the composite of the π-conjugated polymer of the component (A) and the dopant polymer of the component (B) having a superacidic sulfo group, realizes good filterability and superior film-formability by spin coating, and can form a conductive film having excellent transparency, flexibility, flatness, durability, and conductivity as well as low surface roughness in forming a film. Further, the above-mentioned conductive material has excellent film-formability onto both an organic substrate and an inorganic substrate.

In addition, the conductive film formed by the above-mentioned conductive material has excellent conductivity, transparency, and the like, so that this film may function as a transparent electrode layer.

EXAMPLES

Hereinafter, the present invention will be specifically described with reference to Synthesis Examples, Preparation Examples, Comparative Preparation Examples, Examples, and Comparative Examples, but the present invention is not restricted thereto.

Synthesis of Dopant Polymer

Synthesis Examples 1 to 9

Under nitrogen atmosphere, a solution in which each monomer and dimethyl 2,2'-azobis(isobutyrate) had been mixed into methanol stirred at 64° C. was stirred for 8 hours. After cooling to room temperature, the mixture was added dropwise to ethyl acetate under vigorous stirring. The resulting solid was collected by filtration, and dried under vacuum at 50° C. for 15 hours to obtain a white polymer. The obtained white polymer was dissolved in pure water, and a cation of the monomer was substituted to a hydrogen atom by ion-exchange resin, and thereby changed to a sulfo group.

In such a method, the following dopant polymers 1 to 9 were synthesized.

Dopant Polymer 1
 Weight-average molecular weight (Mw)=29,900
 Molecular weight distribution (Mw/Mn)=1.91

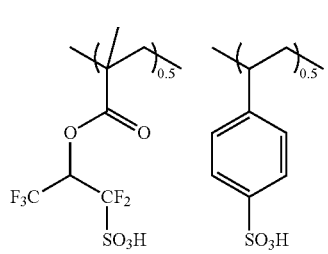

Dopant polymer 1

Dopant Polymer 2
 Weight-average molecular weight (Mw)=31,000
 Molecular weight distribution (Mw/Mn)=1.89

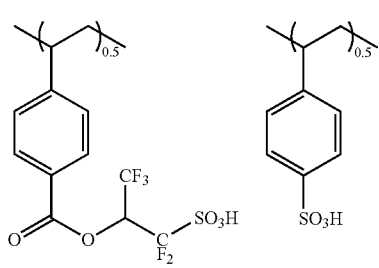

Dopant polymer 2

Dopant Polymer 3
 Weight-average molecular weight (Mw)=24,000
 Molecular weight distribution (Mw/Mn)=1.76

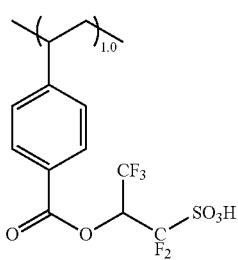

Dopant polymer 3

Dopant Polymer 4
 Weight-average molecular weight (Mw)=39,300
 Molecular weight distribution (Mw/Mn)=1.91

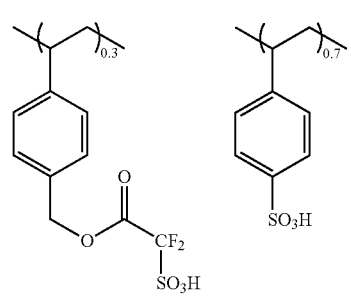

Dopant polymer 4

Dopant Polymer 5
 Weight-average molecular weight (Mw)=41,100
 Molecular weight distribution (Mw/Mn)=1.98

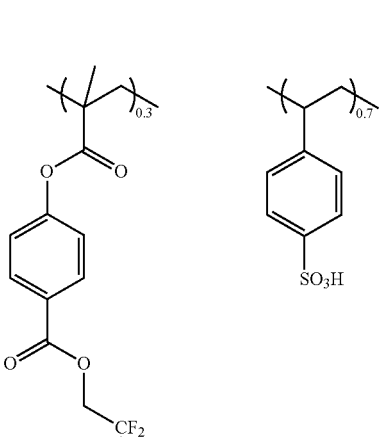

Dopant polymer 5

Dopant Polymer 6
 Weight-average molecular weight (Mw)=53,000
 Molecular weight distribution (Mw/Mn)=1.81

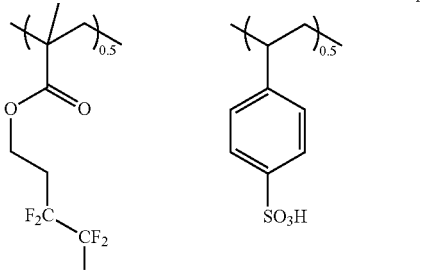

Dopant polymer 6

Dopant Polymer 7
 Weight-average molecular weight (Mw)=52,000
 Molecular weight distribution (Mw/Mn)=1.79

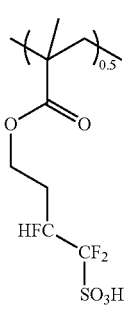

Dopant polymer 7

Dopant Polymer 8
  Weight-average molecular weight (Mw)=21,000
  Molecular weight distribution (Mw/Mn)=1.30

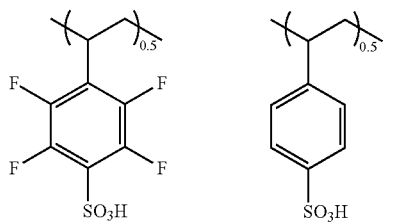

Dopant polymer 8

Dopant Polymer 9
  Weight-average molecular weight (Mw)=41,100
  Molecular weight distribution (Mw/Mn)=1.79

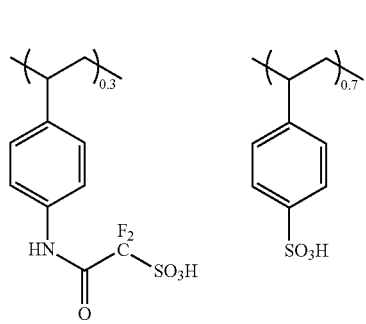

Dopant polymer 9

Preparation of Conductive Polymer Composite Dispersion

Preparation Example 1

A solution in which 12.5 g of Dopant polymer 1 had been dissolved in 1,000 mL of ultrapure water was mixed with 3.82 g of 3,4-ethylenedioxythiophene at 30° C.

Into the resulting mixed solution was slowly added an oxidation catalyst solution in which 8.40 g of sodium persulfate and 2.3 g of ferric sulfate had been dissolved in 100 mL of ultrapure water while stirring the mixed solution and keeping the temperature thereof at 30° C., and the reaction was carried out for 4 hours under stirring.

Into the reaction solution thus obtained was added 1,000 mL of ultrapure water, and about 1,000 mL of the solution was removed by ultrafiltration. This procedure was repeated 3 times.

Subsequently, 200 mL of sulfuric acid diluted to 10% by mass and 2,000 mL of ion-exchanged water were added to the solution treated with the ultrafiltration, and about 2,000 mL of the treated solution was removed by ultrafiltration; then, 2,000 mL of ion-exchanged water was added thereto, and about 2,000 mL of the solution was removed again by ultrafiltration. This procedure was repeated 3 times.

Further, 2,000 mL of ion-exchanged water was added to the treated solution thus obtained, and about 2,000 mL of the treated solution was removed by ultrafiltration. This procedure was repeated 5 times. Then, the resulting mixture was filtrated by using a regenerated cellulose filter having a pore diameter of 0.45 μm (manufactured by Advantec MFS, Inc.) to obtain Conductive polymer composite dispersion 1 having a blue color with a concentration of 1.3% by mass.

Conditions of the ultrafiltration were as follows. Cut-off molecular weight of the ultrafiltration
membrane: 30 K
Cross-flow method
Flow rate of the supply solution: 3,000 mL/min
Membrane partial pressure: 0.12 Pa Meanwhile, also in other Preparation Examples, the ultrafiltration was carried out with the same conditions.

Preparation Example 2

Procedure of Preparation Example 1 was repeated, except that 10.0 g of Dopant polymer 2 was used in place of 12.5 g of Dopant polymer 1, the blending amount of 3,4-ethylenedioxythiophene was changed to 2.41 g, the blending amount of sodium persulfate was changed to 5.31 g, and the blending amount of ferric sulfate was changed to 1.50 g, to obtain Conductive polymer composite dispersion 2.

Preparation Example 3

Procedure of Preparation Example 1 was repeated, except that 12.0 g of Dopant polymer 3 was used in place of 12.5 g of Dopant polymer 1, the blending amount of 3,4-ethylenedioxythiophene was changed to 2.72 g, the blending amount of sodium persulfate was changed to 6.00 g, and the blending amount of ferric sulfate was changed to 1.60 g, to obtain Conductive polymer composite dispersion 3.

Preparation Example 4

Procedure of Preparation Example 1 was repeated, except that 11.8 g of Dopant polymer 4 was used in place of 12.5 g of Dopant polymer 1, 4.50 g of ammonium persulfate was used in place of 8.40 g of sodium persulfate, the blending amount of 3,4-ethylenedioxy-thiophene was changed to 2.04 g, the blending amount of ferric sulfate was changed to 1.23 g, to obtain Conductive polymer composite dispersion 4.

Preparation Example 5

Procedure of Preparation Example 1 was repeated, except that 11.0 g of Dopant polymer 5 was used in place of 12.5 g of Dopant polymer 1, 5.31 g of ammonium persulfate was used in place of 8.40 g of sodium persulfate, the blending amount of 3,4-ethylenedioxythiophene was changed to 2.41 g, and the blending amount of ferric sulfate was changed to 1.50 g, to obtain Conductive polymer composite dispersion 5.

Preparation Example 6

Procedure of Preparation Example 1 was repeated, except that 13.0 g of Dopant polymer 6 was used in place of 12.5 g of Dopant polymer 1, 5.31 g of ammonium persulfate was used in place of 8.40 g of sodium persulfate, the blending amount of 3,4-ethylenedioxythiophene was changed to 2.41 g, and the blending amount of ferric sulfate was changed to 1.50 g, to obtain Conductive polymer composite dispersion 6.

Preparation Example 7

Procedure of Preparation Example 1 was repeated, except that 12.8 g of Dopant polymer 7 was used in place of 12.5 g of Dopant polymer 1, 5.31 g of ammonium persulfate was used in place of 8.40 g of sodium persulfate, the blending amount of 3,4-ethylenedioxythiophene was changed to 2.41 g, and the blending amount of ferric sulfate was changed to 1.50 g, to obtain Conductive polymer composite dispersion 7.

Preparation Example 8

Procedure of Preparation Example 1 was repeated, except that 11.0 g of Dopant polymer 8 was used in place of 12.5 g of Dopant polymer 1, 5.31 g of ammonium persulfate was used in place of 8.40 g of sodium persulfate, the blending amount of 3,4-ethylenedioxythiophene was changed to 2.41 g, and the blending amount of ferric sulfate was changed to 1.50 g, to obtain Conductive polymer composite dispersion 8.

Preparation Example 9

A solution in which 10.0 g of Dopant polymer 2 had been dissolved in 1,000 mL of ultrapure water was mixed with 3.87 g of 3,4-dimethoxythiophene at 30° C.

Into the resulting mixed solution was slowly added an oxidation catalyst solution in which 8.40 g of sodium persulfate and 2.3 g of ferric sulfate had been dissolved in 100 mL of ultrapure water while stirring the mixed solution and keeping the temperature thereof at 30° C., and the reaction was carried out for 4 hours under stirring.

Into the reaction solution thus obtained was added 1,000 mL of ultrapure water, and about 1,000 mL of the solution was removed by ultrafiltration. This procedure was repeated 3 times.

Subsequently, 200 mL of sulfuric acid diluted to 10% by mass and 2,000 mL of ion-exchanged water were added to the solution treated with the ultrafiltration, and about 2,000 mL of the treated solution was removed by ultrafiltration; then, 2,000 mL of ion-exchanged water was added thereto, and about 2,000 mL of the solution was removed again by ultrafiltration. This procedure was repeated 3 times.

Further, 2,000 mL of ion-exchanged water was added to the treated solution thus obtained, and about 2,000 mL of the treated solution was removed by ultrafiltration. This procedure was repeated 5 times. Then, the resulting mixture was filtrated by using a regenerated cellulose filter having a pore diameter of 0.45 μm (manufactured by Advantec MFS, Inc.) to obtain Conductive polymer composite dispersion 9 having a blue color with a concentration of 1.3% by mass.

Preparation Example 10

Procedure of Preparation Example 1 was repeated, except that 9.0 g of Dopant polymer 9 was used in place of 12.5 g of Dopant polymer 1, the blending amount of 3,4-ethylenedioxythiophene was changed to 2.41 g, the blending amount of sodium persulfate was changed to 5.31 g, and the blending amount of ferric sulfate was changed to 1.50 g, to obtain Conductive polymer composite dispersion 10.

Preparation Example 11

A solution in which 10.0 g of Dopant polymer 2 had been dissolved in 1,000 mL of ultrapure water was mixed with 4.62 g of (2,3-dihydrothieno[3,4-b][1,4]dioxin-2-yl)methanol at 30° C.

Into the resulting mixed solution was slowly added an oxidation catalyst solution in which 8.40 g of sodium persulfate and 2.3 g of ferric sulfate had been dissolved in 100 mL of ultrapure water while stirring the mixed solution and keeping the temperature thereof at 30° C., and the reaction was carried out for 4 hours under stirring.

Into the reaction solution thus obtained was added 1,000 mL of ultrapure water, and about 1,000 mL of the solution was removed by ultrafiltration. This procedure was repeated 3 times.

Subsequently, 200 mL of sulfuric acid diluted to 10% by mass and 2,000 mL of ion-exchanged water were added to the solution treated with the ultrafiltration, and about 2,000 mL of the treated solution was removed by ultrafiltration; then, 2,000 mL of ion-exchanged water was added thereto, and about 2,000 mL of the solution was removed again by ultrafiltration. This procedure was repeated 3 times.

Further, 2,000 mL of ion-exchanged water was added to the treated solution thus obtained, and about 2,000 mL of the treated solution was removed by ultrafiltration. This procedure was repeated 5 times. Then, the resulting mixture was filtrated by using a regenerated cellulose filter having a pore diameter of 0.45 μm (manufactured by Advantec MFS, Inc.) to obtain Conductive polymer composite dispersion 11 having a blue color with a concentration of 1.3% by mass.

Preparation Example 12

A solution in which 10.0 g of Dopant polymer 2 had been dissolved in 1,000 mL of ultrapure water was mixed with 4.16 g of 3,4-propylenedioxy thiophene at 30° C.

Into the resulting mixed solution was slowly added an oxidation catalyst solution in which 8.40 g of sodium persulfate and 2.3 g of ferric sulfate had been dissolved in 100 mL of ultrapure water while stirring the mixed solution and keeping the temperature thereof at 30° C., and the reaction was carried out for 4 hours under stirring.

Into the reaction solution thus obtained was added 1,000 mL of ultrapure water, and about 1,000 mL of the solution was removed by ultrafiltration. This procedure was repeated 3 times.

Subsequently, 200 mL of sulfuric acid diluted to 10% by mass and 2,000 mL of ion-exchanged water were added to the solution treated with the ultrafiltration, and about 2,000 mL of the treated solution was removed by ultrafiltration; then, 2,000 mL of ion-exchanged water was added thereto, and about 2,000 mL of the solution was removed again by ultrafiltration. This procedure was repeated 3 times.

Further, 2,000 mL of ion-exchanged water was added to the treated solution thus obtained, and about 2,000 mL of the treated solution was removed by ultrafiltration. This procedure was repeated 5 times. Then, the resulting mixture was filtrated by using a regenerated cellulose filter having a pore diameter of 0.45 μm (manufactured by Advantec MFS, Inc.) to obtain Conductive polymer composite dispersion 12 having a blue color with a concentration of 1.3% by mass.

Comparative Preparation Example 1

A solution in which 83.3 g of an aqueous solution of polystyrene sulfonic acid (concentration of 18.0% by mass, manufactured by Aldrich Co., Ltd.) had been diluted with 250 mL of ion-exchanged water was mixed with 5.0 g of 3,4-ethylenedioxythiophene at 30° C. Except for it, procedure of Preparation Example 1 was repeated to obtain Comparative conductive polymer composite dispersion 1 (PEDOT-PSS Dispersion) having a blue color with a concentration of 1.3% by mass. This Comparative conductive polymer composite dispersion 1 contains polystyrene sulfonic acid solely as a dopant polymer.

Examples and Comparative Examples

Examples 1 to 16

Each of the Conductive polymer composite dispersions 1 to 12 with a concentration of 1.3% by mass obtained in Preparation Examples 1 to 12, an organic solvent, FS-31, which is a surfactant manufactured by E. I. du Pont de Nemours and Company, and a copper salt were mixed as respective compositions described in Table 1 to prepare a conductive material, and the respective materials were designated as Examples 1 to 16. Incidentally, in Table 1, DMSO means dimethyl sulfoxide.

Comparative Example 1

Comparative conductive polymer composite dispersion 1 with a concentration of 1.3% by mass obtained in Comparative Preparation Example 1, water, an organic solvent, and FS-31, which is a surfactant manufactured by E. I. du Pont de Nemours and Company, were mixed as a composition described in Table 1 to prepare a conductive material, and the obtained material was designated as Comparative Example 1.

Comparative Example 2

Conductive polymer composite dispersion 1 with a concentration of 1.3% by mass obtained in Preparation Example 1, water, an organic solvent, and FS-31, which is a surfactant manufactured by E. I. du Pont de Nemours and Company, were mixed as a composition described in Table 1 without adding a copper salt to prepare a conductive material, and the obtained material was designated as Comparative Example 2.

Each of the conductive materials of Examples and Comparative Examples thus prepared was evaluated by the methods as shown below.

(Formation of a Conductive Film)

Firstly, 1.0 mL of the conductive material was dropped onto a $SiO_2$ wafer having a diameter of 4 inches (100 mm), and 10 seconds later, the whole wafer was spin-coated by using a spinner. The spin coating conditions in Examples 1 to 16 and Comparative Examples 1 to 2 were adjusted so as to give a film thickness of 100±5 nm. After it was applied, baking was performed for 5 minutes in an accuracy incubator at 120° C. to remove the solvent, thereby the conductive film was obtained. Then, the obtained conductive film was observed visually to check whether a flat film had been obtained or not. These results are shown in Table 1.

(Conductivity)

The conductivity (S/cm) of the obtained conductive film was calculated from the surface resistivity ($\Omega/\square$) measured by Hiresta-UP MCP-HT450 and Loresta-GP MCP-T610 (both are manufactured by Mitsubishi Chemical corp.) and film thickness. These results are shown in Table 1.

(Transmittance)

From the refractive index (k) measured by using the spectroscopic ellipsometer with the type of variable incident angle (VASE) on the conductive film obtained as described above, the transmittance of the light with a wavelength of 550 nm in a film thickness (FT) of 100 nm was calculated. These results are shown in Table 1.

(Flexibility)

Flexibility of the conductive film obtained by using each of the conductive materials of Examples and Comparative Examples was evaluated as follows.

Each of the conductive materials was spin-coated onto a flexible glass with a thickness of 50 μm and 5 cm square, and baked at 120° C. for 5 minutes to prepare a conductive film with a film thickness of 100 nm. The flexible glass substrate was subjected to bending with the curvature (R) of 120° for 10 times. The obtained conductive film was observed visually to check whether a crack was generated or not. These results are shown in Table 1.

[Evaluation of the Conductive Material]

TABLE 1

| | Conductive polymer composite dispersion (part by mass) | Copper salt (part by mass) | Water or organic solvent (part by mass) | Surfactant (part by mass) | Film state after coating | Conductivity (S/cm) | Transmittance (%) at wavelength of 550 nm in FT of 100 nm | Flexibility |
|---|---|---|---|---|---|---|---|---|
| Example 1 | Preparation Example 1 (20) | Copper (I) acetate (0.1) | DMSO (1.0) | FS-31 (0.06) | Flat and uniform film | 210 | 89 | Good |
| Example 2 | Preparation Example 2 (20) | Copper (I) acetate (0.1) | DMSO (1.0) | FS-31 (0.06) | Flat and uniform film | 260 | 90 | Good |
| Example 3 | Preparation Example 3 (20) | Copper (I) acetate (0.1) | DMSO (1.0) | FS-31 (0.06) | Flat and uniform film | 210 | 90 | Good |
| Example 4 | Preparation Example 4 (20) | Copper (I) acetate (0.1) | DMSO (1.0) | FS-31 (0.06) | Flat and uniform film | 220 | 92 | Good |
| Example 5 | Preparation Example 5 (20) | Copper (I) acetate monohydrate (0.1) | DMSO (1.0) | FS-31 (0.06) | Flat and uniform film | 230 | 90 | Good |
| Example 6 | Preparation Example 6 (20) | Copper (I) acetate (0.1) | DMSO (1.0) | FS-31 (0.06) | Flat and uniform film | 280 | 91 | Good |
| Example 7 | Preparation Example 7 (20) | Copper (I) acetate (0.1) | DMSO (1.0) | FS-31 (0.06) | Flat and uniform film | 290 | 92 | Good |
| Example 8 | Preparation Example 8 (20) | Copper (I) acetate (0.1) | DMSO (1.0) | FS-31 (0.06) | Flat and uniform film | 290 | 93 | Good |
| Example 9 | Preparation Example 9 (20) | Copper (I) acetate (0.1) | DMSO (1.0) | FS-31 (0.06) | Flat and uniform film | 270 | 92 | Good |
| Example 10 | Preparation Example 10 (20) | Copper (I) acetate (0.1) | DMSO (1.0) | FS-31 (0.06) | Flat and uniform film | 290 | 90 | Good |
| Example 11 | Preparation Example 11 (20) | Copper (I) acetate (0.1) | DMSO (1.0) | FS-31 (0.06) | Flat and uniform film | 250 | 90 | Good |

TABLE 1-continued

| | Conductive polymer composite dispersion (part by mass) | Copper salt (part by mass) | Water or organic solvent (part by mass) | Surfactant (part by mass) | Film state after coating | Conductivity (S/cm) | Transmittance (%) at wavelength of 550 nm in FT of 100 nm | Flexibility |
|---|---|---|---|---|---|---|---|---|
| Example 12 | Preparation Example 12 (20) | Copper (I) acetate (0.1) | DMSO (1.0) | FS-31 (0.06) | Flat and uniform film | 250 | 89 | Good |
| Example 13 | Preparation Example 2 (20) | Copper (I) trifluoro-acetate (0.12) | DMSO (1.0) | FS-31 (0.06) | Flat and uniform film | 270 | 90 | Good |
| Example 14 | Preparation Example 2 (20) | Copper (I) acetyl-acetonato (0.13) | DMSO (1.0) | FS-31 (0.06) | Flat and uniform film | 210 | 90 | Good |
| Example 15 | Preparation Example 2 (20) | Copper (I) citrate hydrate (0.15) | DMSO (1.0) | FS-31 (0.06) | Flat and uniform film | 220 | 90 | Good |
| Example 16 | Preparation Example 2 (20) | Copper (I) lactate (0.1) | DMSO (1.0) | FS-31 (0.06) | Flat and uniform film | 290 | 91 | Good |
| Comparative Example 1 | Comparative Preparation Example 1 (20) | — | Water (5.0) DMSO (1.0) | FS-31 (0.06) | Striation generated | 460 | 86 | Good |
| Comparative Example 2 | Preparation Example 1 (20) | — | Water (5.0) DMSO (1.0) | FS-31 (0.06) | Flat and uniform film | 108 | 92 | Good |

As shown in Table 1, a flat and uniform film could be obtained by spin coating of each conductive material of Examples 1 to 16, which contained polythiophene as the π-conjugated polymer, the dopant polymer having one or more repeating units selected from "a1" to "a4", and the monovalent copper salt of carboxylic acid or β-diketone. In addition, it has been confirmed that the conductivity is enhanced by adding the monovalent copper salt of carboxylic acid or β-diketone. It has been also revealed that the flexibility and the transmittance in the visible light of λ=550 nm are improved.

On the other hand, Comparative Example 1, which contained a dopant polymer having polystyrene sulfonic acid alone and did not contain a copper salt, showed high conductivity, but generated striation on the film. Comparative Example 2, which contained a dopant polymer having the repeating unit "a1" and did not contain a copper salt, gave flat and uniform film, but showed inferior conductivity.

As described above, it has been revealed that the conductive material of the present invention exhibits superior film-formability by spin coating, and also can form a conductive film having high transparency and conductivity, superior flexibility and flatness.

It should be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A conductive material comprising:
(A) a π-conjugated polymer,
(B) a dopant polymer which contains one or more repeating units shown by the following general formula (1) and has a weight-average molecular weight in the range of 1,000 to 500,000, and
(C) one or more salts selected from the group consisting of a monovalent copper salt of carboxylic acid, a monovalent copper salt of β-diketone, and a monovalent copper salt of β-ketoester,

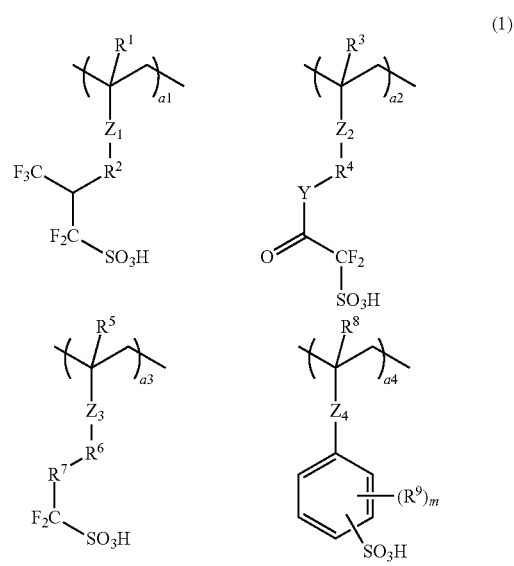

(1)

wherein $R^1$, $R^3$, $R^5$, and $R^8$ independently represent a hydrogen atom or a methyl group; $R^2$, $R^4$, and $R^6$ independently represent a single bond, an ester group, or a linear, branched, or cyclic hydrocarbon group having 1 to 12 carbon atoms and optionally containing either or both of an ether group and an ester group; $R^7$ represents a linear or branched alkylene group having 1 to 4 carbon atoms in which 1 or 2 hydrogen atoms in $R^7$ are optionally substituted with a fluorine atom; $R^9$ represents a fluorine atom or a trifluoromethyl group; $Z_1$, $Z_2$, and $Z_3$ independently represent a single bond, a phenylene group, a naphthylene group, an ether group, or an ester group; $Z_4$ represents a single bond, an ether group, or an ester group; "Y" represents an oxygen atom or an NH group; "m" is an integer of 1 to 4; and "a1", "a2", "a3", and "a4" are each a number satisfying 0≤a1≤1.0, 0 ≤a2≤1.0, 0≤a3≤1.0, 0≤a4≤1.0, and 0<a1+a2+a3+a4≤1.0.

2. The conductive material according to claim 1, wherein the component (B) further contains a repeating unit shown by the following general formula (2),

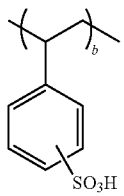
(2)

wherein "b" is a number satisfying 0<b<1.0.

3. The conductive material according to claim 2, wherein the component (B) is a block copolymer.

4. The conductive material according to claim 3, wherein the component (A) is a polymer formed by polymerization of one or more precursor monomers selected from the group consisting of pyrrole, thiophene, selenophene, tellurophene, aniline, a polycyclic aromatic compound, and a derivative thereof.

5. The conductive material according to claim 4, wherein the component (C) is one or more salts selected from those shown by the following general formulae (3-1) to (3-3),

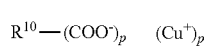
(3-1)

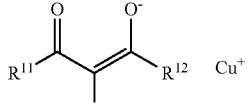
(3-2)

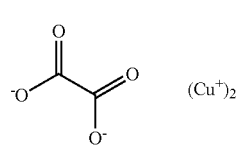
(3-3)

wherein "p" is an integer of 1 to 6; $R^{10}$ represents a hydrogen atom or a linear, branched, or cyclic hydrocarbon group having 1 to 30 carbon atoms with a valence of "p", and when $R^{10}$ is a hydrocarbon group, $R^{10}$ optionally contains a halogen atom, a nitrogen atom, a hydroxy group, an ether group, an ester group, an amino group, an amide group, a carbamate group, a carbonate group, a sulfonate ester group, a thiol group, a sulfide group, a carbonyl group, a sulfonyl group, a lactone group, a lactam group, a sultone group, or a nitro group; $R^{11}$ and $R^{12}$ independently represent a linear, branched, or cyclic alkyl group having 1 to 20 carbon atoms, an alkenyl group having 2 to 20 carbon atoms, an alkynyl group having 2 to 20 carbon atoms, or an aryl group having 6 to 20 carbon atoms, and $R^{11}$ and $R^{12}$ optionally contain a hydroxy group, an alkoxy group, an ether group, an ester group, an amino group, an amide group, a sulfonate ester group, a halogen atom, a cyano group, a nitro group, a carbonate group, a carbamate group, a thiol group, a sulfide group, a thioketone group, or a heteroaromatic ring; and $R^{13}$ represents a hydrogen atom, a linear, branched, or cyclic alkyl group having 1 to 8 carbon atoms, or a phenyl group.

6. The conductive material according to claim 3, wherein the component (C) is one or more salts selected from those shown by the following general formulae (3-1) to (3-3),

(3-1)

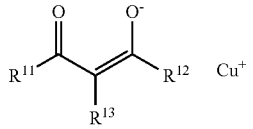
(3-2)

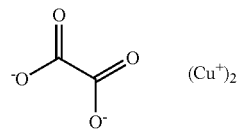
(3-3)

wherein "p" is an integer of 1 to 6; $R^{10}$ represents a hydrogen atom or a linear, branched, or cyclic hydrocarbon group having 1 to 30 carbon atoms with a valence of "p", and when $R^{10}$ is a hydrocarbon group, $R^{10}$ optionally contains a halogen atom, a nitrogen atom, a hydroxy group, an ether group, an ester group, an amino group, an amide group, a carbamate group, a carbonate group, a sulfonate ester group, a thiol group, a sulfide group, a carbonyl group, a sulfonyl group, a lactone group, a lactam group, a sultone group, or a nitro group; $R^{11}$ and $R^{12}$ independently represent a linear, branched, or cyclic alkyl group having 1 to 20 carbon atoms, an alkenyl group having 2 to 20 carbon atoms, an alkynyl group having 2 to 20 carbon atoms, or an aryl group having 6 to 20 carbon atoms, and $R^{11}$ and $R^{12}$ optionally contain a hydroxy group, an alkoxy group, an ether group, an ester group, an amino group, an amide group, a sulfonate ester group, a halogen atom, a cyano group, a nitro group, a carbonate group, a carbamate group, a thiol group, a sulfide group, a thioketone group, or a heteroaromatic ring; and $R^{13}$ represents a hydrogen atom, a linear, branched, or cyclic alkyl group having 1 to 8 carbon atoms, or a phenyl group.

7. The conductive material according to claim 2, wherein the component (A) is a polymer formed by polymerization of one or more precursor monomers selected from the group consisting of pyrrole, thiophene, selenophene, tellurophene, aniline, a polycyclic aromatic compound, and a derivative thereof.

8. The conductive material according to claim 7, wherein the component (C) is one or more salts selected from those shown by the following general formulae (3-1) to (3-3),

(3-1)

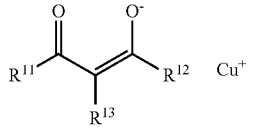
(3-2)

-continued

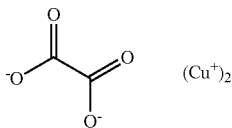
(3-3)

wherein "p" is an integer of 1 to 6; $R^{10}$ represents a hydrogen atom or a linear, branched, or cyclic hydrocarbon group having 1 to 30 carbon atoms with a valence of "p", and when $R^{10}$ is a hydrocarbon group, $R^{10}$ optionally contains a halogen atom, a nitrogen atom, a hydroxy group, an ether group, an ester group, an amino group, an amide group, a carbamate group, a carbonate group, a sulfonate ester group, a thiol group, a sulfide group, a carbonyl group, a sulfonyl group, a lactone group, a lactam group, a sultone group, or a nitro group; $R^{11}$ and $R^{12}$ independently represent a linear, branched, or cyclic alkyl group having 1 to 20 carbon atoms, an alkenyl group having 2 to 20 carbon atoms, an alkynyl group having 2 to 20 carbon atoms, or an aryl group having 6 to 20 carbon atoms, and $R^{11}$ and $R^{12}$ optionally contain a hydroxy group, an alkoxy group, an ether group, an ester group, an amino group, an amide group, a sulfonate ester group, a halogen atom, a cyano group, a nitro group, a carbonate group, a carbamate group, a thiol group, a sulfide group, a thioketone group, or a heteroaromatic ring; and $R^{13}$ represents a hydrogen atom, a linear, branched, or cyclic alkyl group having 1 to 8 carbon atoms, or a phenyl group.

9. The conductive material according to claim 2, wherein the component (C) is one or more salts selected from those shown by the following general formulae (3-1) to (3-3),

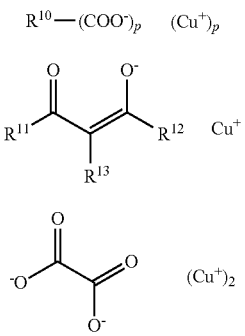

wherein "p" is an integer of 1 to 6; $R^{10}$ represents a hydrogen atom or a linear, branched, or cyclic hydrocarbon group having 1 to 30 carbon atoms with a valence of "p", and when $R^{10}$ is a hydrocarbon group, $R^{10}$ optionally contains a halogen atom, a nitrogen atom, a hydroxy group, an ether group, an ester group, an amino group, an amide group, a carbamate group, a carbonate group, a sulfonate ester group, a thiol group, a sulfide group, a carbonyl group, a sulfonyl group, a lactone group, a lactam group, a sultone group, or a nitro group; $R^{11}$ and $R^{12}$ independently represent a linear, branched, or cyclic alkyl group having 1 to 20 carbon atoms, an alkenyl group having 2 to 20 carbon atoms, an alkynyl group having 2 to 20 carbon atoms, or an aryl group having 6 to 20 carbon atoms, and $R^{11}$ and $R^{12}$ optionally contain a hydroxy group, an alkoxy group, an ether group, an ester group, an amino group, an amide group, a sulfonate ester group, a halogen atom, a cyano group, a nitro group, a carbonate group, a carbamate group, a thiol group, a sulfide group, a thioketone group, or a heteroaromatic ring; and $R^{13}$ represents a hydrogen atom, a linear, branched, or cyclic alkyl group having 1 to 8 carbon atoms, or a phenyl group.

10. The conductive material according to claim 2, wherein the conductive material has dispersibility in water or in an organic solvent.

11. The conductive material according to claim 1, wherein the component (B) is a block copolymer.

12. The conductive material according to claim 11, wherein the component (A) is a polymer formed by polymerization of one or more precursor monomers selected from the group consisting of pyrrole, thiophene, selenophene, tellurophene, aniline, a polycyclic aromatic compound, and a derivative thereof.

13. The conductive material according to claim 12, wherein the component (C) is one or more salts selected from those shown by the following general formulae (3-1) to (3-3),

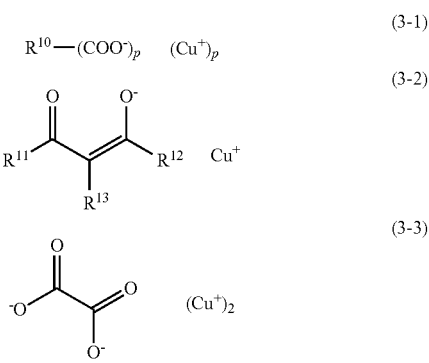

wherein "p" is an integer of 1 to 6; $R^{10}$ represents a hydrogen atom or a linear, branched, or cyclic hydrocarbon group having 1 to 30 carbon atoms with a valence of "p", and when $R^{10}$ is a hydrocarbon group, $R^{10}$ optionally contains a halogen atom, a nitrogen atom, a hydroxy group, an ether group, an ester group, an amino group, an amide group, a carbamate group, a carbonate group, a sulfonate ester group, a thiol group, a sulfide group, a carbonyl group, a sulfonyl group, a lactone group, a lactam group, a sultone group, or a nitro group; $R^{11}$ and $R^{12}$ independently represent a linear, branched, or cyclic alkyl group having 1 to 20 carbon atoms, an alkenyl group having 2 to 20 carbon atoms, an alkynyl group having 2 to 20 carbon atoms, or an aryl group having 6 to 20 carbon atoms, and $R^{11}$ and $R^{12}$ optionally contain a hydroxy group, an alkoxy group, an ether group, an ester group, an amino group, an amide group, a sulfonate ester group, a halogen atom, a cyano group, a nitro group, a carbonate group, a carbamate group, a thiol group, a sulfide group, a thioketone group, or a heteroaromatic ring; and $R^{13}$ represents a hydrogen atom, a linear, branched, or cyclic alkyl group having 1 to 8 carbon atoms, or a phenyl group.

14. The conductive material according to claim 11, wherein the component (C) is one or more salts selected from those shown by the following general formulae (3-1) to (3-3),

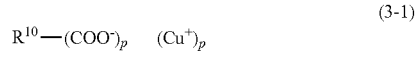

-continued

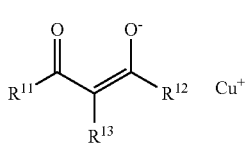

(3-2)

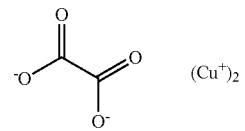

(3-3)

wherein "p" is an integer of 1 to 6; $R^{10}$ represents a hydrogen atom or a linear, branched, or cyclic hydrocarbon group having 1 to 30 carbon atoms with a valence of "p", and when $R^{10}$ is a hydrocarbon group, $R^{10}$ optionally contains a halogen atom, a nitrogen atom, a hydroxy group, an ether group, an ester group, an amino group, an amide group, a carbamate group, a carbonate group, a sulfonate ester group, a thiol group, a sulfide group, a carbonyl group, a sulfonyl group, a lactone group, a lactam group, a sultone group, or a nitro group; $R^{11}$ and $R^{12}$ independently represent a linear, branched, or cyclic alkyl group having 1 to 20 carbon atoms, an alkenyl group having 2 to 20 carbon atoms, an alkynyl group having 2 to 20 carbon atoms, or an aryl group having 6 to 20 carbon atoms, and $R^{11}$ and $R^{12}$ optionally contain a hydroxy group, an alkoxy group, an ether group, an ester group, an amino group, an amide group, a sulfonate ester group, a halogen atom, a cyano group, a nitro group, a carbonate group, a carbamate group, a thiol group, a sulfide group, a thioketone group, or a heteroaromatic ring; and $R^{13}$ represents a hydrogen atom, a linear, branched, or cyclic alkyl group having 1 to 8 carbon atoms, or a phenyl group.

15. The conductive material according to claim 1, wherein the component (A) is a polymer formed by polymerization of one or more precursor monomers selected from the group consisting of pyrrole, thiophene, selenophene, tellurophene, aniline, a polycyclic aromatic compound, and a derivative thereof.

16. The conductive material according to claim 15, wherein the component (C) is one or more salts selected from those shown by the following general formulae (3-1) to (3-3),

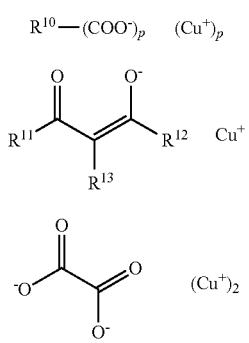

(3-1)

(3-2)

(3-3)

wherein "p" is an integer of 1 to 6; $R^{10}$ represents a hydrogen atom or a linear, branched, or cyclic hydrocarbon group having 1 to 30 carbon atoms with a valence of "p", and when $R^{10}$ is a hydrocarbon group, $R^{10}$ optionally contains a halogen atom, a nitrogen atom, a hydroxy group, an ether group, an ester group, an amino group, an amide group, a carbamate group, a carbonate group, a sulfonate ester group, a thiol group, a sulfide group, a carbonyl group, a sulfonyl group, a lactone group, a lactam group, a sultone group, or a nitro group; $R^{11}$ and $R^{12}$ independently represent a linear, branched, or cyclic alkyl group having 1 to 20 carbon atoms, an alkenyl group having 2 to 20 carbon atoms, an alkynyl group having 2 to 20 carbon atoms, or an aryl group having 6 to 20 carbon atoms, and $R^{11}$ and $R^{12}$ optionally contain a hydroxy group, an alkoxy group, an ether group, an ester group, an amino group, an amide group, a sulfonate ester group, a halogen atom, a cyano group, a nitro group, a carbonate group, a carbamate group, a thiol group, a sulfide group, a thioketone group, or a heteroaromatic ring; and $R^{13}$ represents a hydrogen atom, a linear, branched, or cyclic alkyl group having 1 to 8 carbon atoms, or a phenyl group.

17. The conductive material according to claim 1, wherein the component (C) is one or more salts selected from those shown by the following general formulae (3-1) to (3-3),

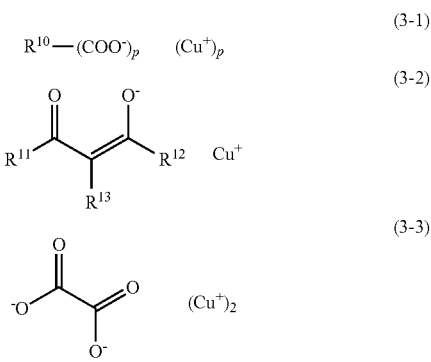

(3-1)

(3-2)

(3-3)

wherein "p" is an integer of 1 to 6; $R^{10}$ represents a hydrogen atom or a linear, branched, or cyclic hydrocarbon group having 1 to 30 carbon atoms with a valence of "p", and when $R^{10}$ is a hydrocarbon group, $R^{10}$ optionally contains a halogen atom, a nitrogen atom, a hydroxy group, an ether group, an ester group, an amino group, an amide group, a carbamate group, a carbonate group, a sulfonate ester group, a thiol group, a sulfide group, a carbonyl group, a sulfonyl group, a lactone group, a lactam group, a sultone group, or a nitro group; $R^{11}$ and $R^{12}$ independently represent a linear, branched, or cyclic alkyl group having 1 to 20 carbon atoms, an alkenyl group having 2 to 20 carbon atoms, an alkynyl group having 2 to 20 carbon atoms, or an aryl group having 6 to 20 carbon atoms, and $R^{11}$ and $R^{12}$ optionally contain a hydroxy group, an alkoxy group, an ether group, an ester group, an amino group, an amide group, a sulfonate ester group, a halogen atom, a cyano group, a nitro group, a carbonate group, a carbamate group, a thiol group, a sulfide group, a thioketone group, or a heteroaromatic ring; and $R^{13}$ represents a hydrogen atom, a linear, branched, or cyclic alkyl group having 1 to 8 carbon atoms, or a phenyl group.

18. The conductive material according to claim 1, wherein the conductive material has dispersibility in water or in an organic solvent.

19. A substrate having a conductive film formed thereon, wherein the conductive film is formed from the conductive material according to claim 1.

20. The substrate according to claim 19, wherein the conductive film functions as a transparent electrode layer.

* * * * *